United States Patent
Hosokawa et al.

(10) Patent No.: US 6,651,206 B2
(45) Date of Patent: Nov. 18, 2003

(54) METHOD OF DESIGN FOR TESTABILITY, TEST SEQUENCE GENERATION METHOD AND SEMICONDUCTOR INTEGRATED CIRCUIT

(75) Inventors: Toshinori Hosokawa, Osaka (JP); Mitsuyasu Ohta, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/817,057

(22) Filed: Mar. 27, 2001

(65) Prior Publication Data

US 2002/0026611 A1 Feb. 28, 2002

Related U.S. Application Data

(63) Continuation of application No. 09/065,586, filed on Apr. 24, 1998, now Pat. No. 6,253,343.

(30) Foreign Application Priority Data

Apr. 25, 1997 (JP) .............................. 9-108813

(51) Int. Cl.[7] .......................... G01R 31/28; G06F 11/00
(52) U.S. Cl. ...................................... 714/738; 714/741
(58) Field of Search ................ 714/724–741; 326/40, 41, 47

(56) References Cited

U.S. PATENT DOCUMENTS

| 4,779,273 | A | * | 10/1988 | Beucler et al. ............. 714/732 |
| 4,817,093 | A | * | 3/1989 | Jacobs et al. ................ 714/728 |
| 5,043,986 | A | | 8/1991 | Agrawal et al. |
| 5,319,647 | A | | 6/1994 | Hosokawa et al. |
| 5,377,194 | A | | 12/1994 | Calderbank |
| 5,377,197 | A | | 12/1994 | Patel et al. |
| 5,430,736 | A | | 7/1995 | Takeoka et al. |
| 5,502,647 | A | | 3/1996 | Chakradhar et al. |
| 5,581,739 | A | | 12/1996 | FitzPatrick |
| 5,590,275 | A | | 12/1996 | Berkel et al. |
| 5,623,502 | A | | 4/1997 | Wang |
| 5,668,481 | A | | 9/1997 | Sheu et al. |
| 5,675,729 | A | | 10/1997 | Mehring |
| 5,726,996 | A | | 3/1998 | Chakradhar et al. |

FOREIGN PATENT DOCUMENTS

| JP | 61-122582 | 6/1986 | ........... G01R/31/28 |
| JP | 07072223 | 3/1995 | |
| JP | 7-191102 | 7/1995 | ....... G01R/31/3183 |
| JP | 07244120 | 9/1995 | |
| JP | 7-325131 | 12/1995 | ....... G01R/31/3183 |
| JP | 8-15388 | * 1/1996 | ....... G01R/31/3183 |

OTHER PUBLICATIONS

NN9111377 (Reconfigurable Signature Generator. IBM Tech. Disclosure Bulletin, vol. #34 Issue #6, pp. 377–380, Nov. 1, 1991).*

(List continued on next page.)

*Primary Examiner*—Albert Decady
*Assistant Examiner*—Guy Lamarre
(74) *Attorney, Agent, or Firm*—McDermott, Will & Emery

(57) ABSTRACT

Flip-flops (FFs) to replace with scan FFs are selected for an integrated circuit designed at the gate level in order that the integrated circuit has an n-fold line-up structure. All FFs in an integrated circuit are temporarily selected as FFs to replace with scan FFs Each FF to replace with a scan FF is temporarily selected as a FF to replace with a non-scan flip-flop, and the structure of the integrated circuit is checked if it has an n-folded line-up structure and if so, then the FF is selected as a FF to replace with a non-scan flip-flop. For an integrated circuit designed at the gate level, flip-flops to replace with scan flip-flops are selected in order that the integrated circuit has an n-fold line-up structure, without recognizing load/hold FFs as self-loop structure FF. Thereafter, FFs to replace with scan FFs are selected in such a way as to facilitate testing on load/hold FFs. The present invention guarantees high fault efficiency in identifying FFs to replace with scan FFs and achieves a higher compaction rate than conventional technology.

5 Claims, 59 Drawing Sheets

OTHER PUBLICATIONS

NN85123128 (Index Method for Test Pattern Reduction; IBM Tech. Disclosure Bulletin, vol. #28 Issue #7, pp. #3128–3129, Dec. 1, 1985).*

NN86102004 (Self–Test N–Stream Online Isolation; IBM Tech. Disclosure Bulletin, vol. #: 29 Issue #5 pp. #:2004–2008; Oct. 1, 1986).*

NN8912479 (Low–Cost Signature Analyzer and an Application; IBM Tech. Disclosure Bulletin; vol. #32 Issue #7 pp. #479–488; Dec. 1, 1989).*

NB900818 (Pseudo–Random Pattern Self–Test of Arrays; IBM Tech. Disclosure Bulletin; vol. #33 Issue #3B pp. #18–19; Aug. 1, 1990).*

NN931119 (Boundary Walking Sequences for Circuit Board Interconnect Test; IBM Technical Disclosure Bulletin; vol. #36, pp:19–22; Nov. 1, 1993 ).*

NN83102637 (DIAGNOSIS Based on Signature Testing; IBM Technical Disclosure Bulletin; vol. #26, pp.:2637–2643; Octob 1983).*

Transactions of Institute of Electronics D–1 vol. J80–D–1 No. 2, Feb. 1997.

"An Analytical Approach to the Partial Scan Problem", by Kunzmann et al., Journal of Electronic Testing (May 1990).

"Pascant: A Partial Scan and Test Generation System", by Bhawmik et al., IEEE (1991).

"Partial Scan Designs Without using a Separate Scan Clock", by Cheng, IEEE (1995).

"Scan Design Oriented Test Technique for VLSI's, Using ATE", by Oyama et al., IEEE (1996).

"A Methodology for Programmable Logic Migration to ASIC's Including Automatic Scan Chain Insertion and ATPG", by O'Connor, IEEE (1991).

"An Analytical Approach to the Partial Scan Problem", by Kunzmann et al., Journal of Electronic Testing, vol. 1, No. 2 (May 1990), pp. 163–174.

"Test Compaction for Sequential Circuits", by Niermann et al., IEEE Transactions on Computer Aided Design of Integrated Circuits and Systems, vol. 11, No. 2 (Feb. 1992), pp. 260–267.

"A Partial Scan Design Method Based on n–Fold Line–up Structures", by Hosokawa et al., Proceedings Sixth Asian Test Symposium (ATS '97), Nov. 1997, p. 306–311.

"An Exact Algorithm for Selecting Partial Scan Flip–Flops", by Chakradhar et al., Proceedings of 31st ACM/IEEE Design Automation Conference (1994), pp. 81–86.

"Dynamic Test Compaction for Synchronous Sequential Circuits using Static Compaction Techniques", by Pomeranz et al., Proceedings of FTCS–26 (1996), pp. 53–61.

"Compaction of ATPG–Generated Test Sequences for Sequential Circuits", by Roy et al., Proceedings of 1988 IEEE (1988), pp. 382–385.

"Design for Testability", Publication by Computer Science Press (1990), Chapter 9, pp. 343–395.

* cited by examiner r1 IS NON-SCANNIZED r2 IS NON-SCANNIZED r4 IS NON-SCANNIZED

Fig. 7(a)
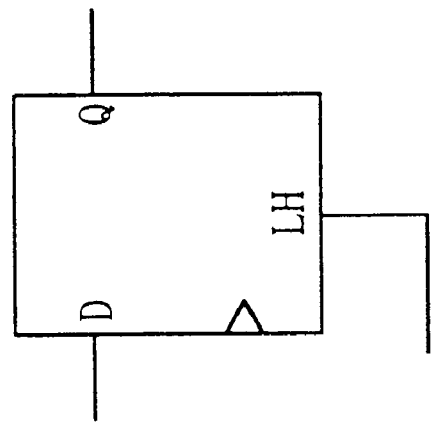
Fig. 7(b)
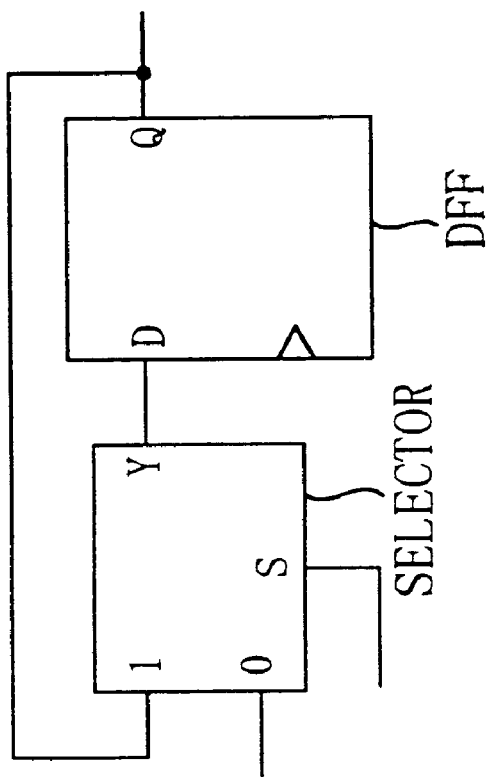

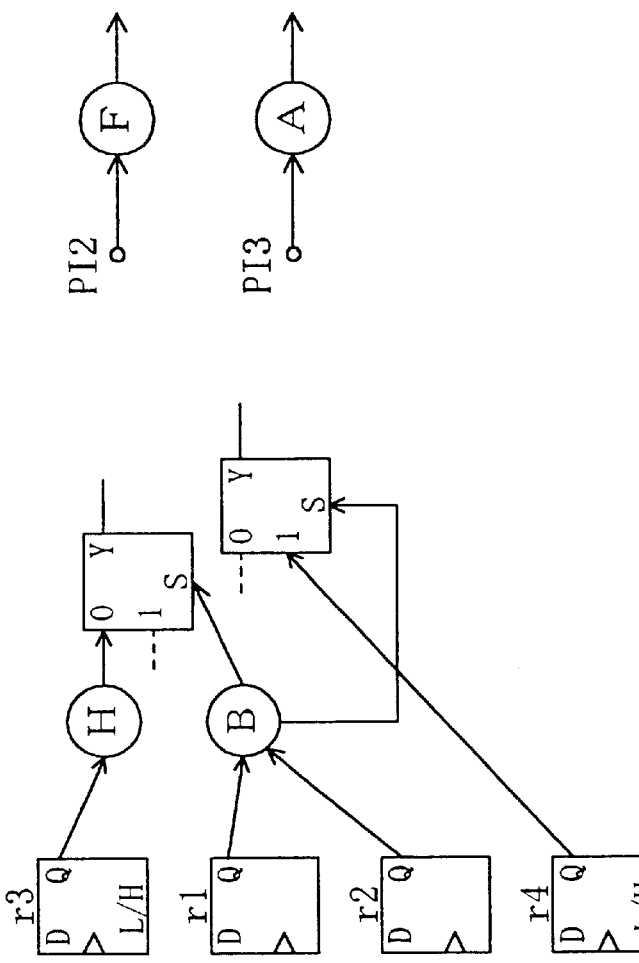
Fig. 12(a) TIME FRAME 1
Fig. 12(b) TIME FRAME 2
Fig. 12(c) TIME FRAME 3
SUCCESSFUL JUSTIFICATION
r4:HOLD MODE
r6:LOAD MODE
THE NUMBER OF FFs:2
UNSUCCESSFUL JUSTIFICATION
SCANNIZE r3 AND r4
THE NUMBER OF FFs:4→2

TIME FRAME 3

THE NUMBER OF FFs:1

TIME FRAME 2

SUCCESSFUL JUSTIFICATION
r6:LOAD MODE
THE NUMBER OF FFs:1

TIME FRAME 1

SUCCESSFUL JUSTIFICATION
r7:LOAD MODE
THE NUMBER OF FFs:1

Fig. 14(b) TIME FRAME 2
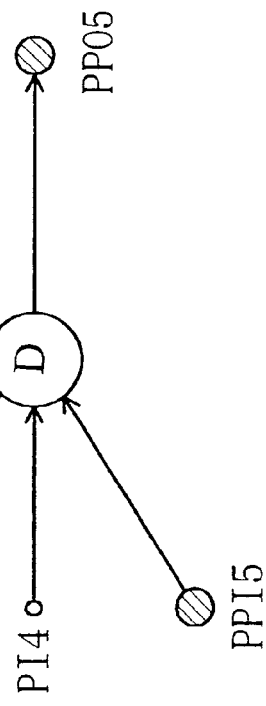
THE NUMBER OF FFs:0
Fig. 14(a) TIME FRAME 1
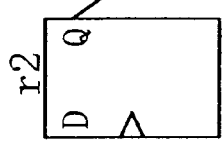
THE NUMBER OF FFs:1

Fig. 15(b) TIME FRAME 2
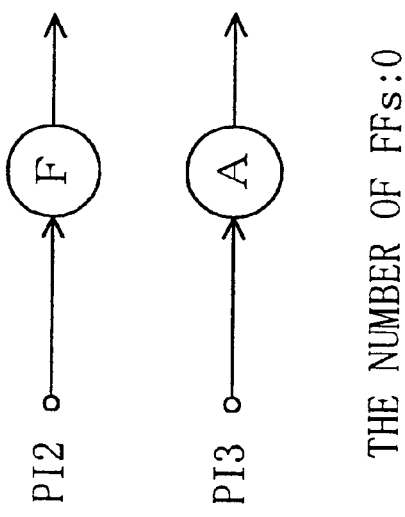
THE NUMBER OF FFs: 0
Fig. 15(a) TIME FRAME 1
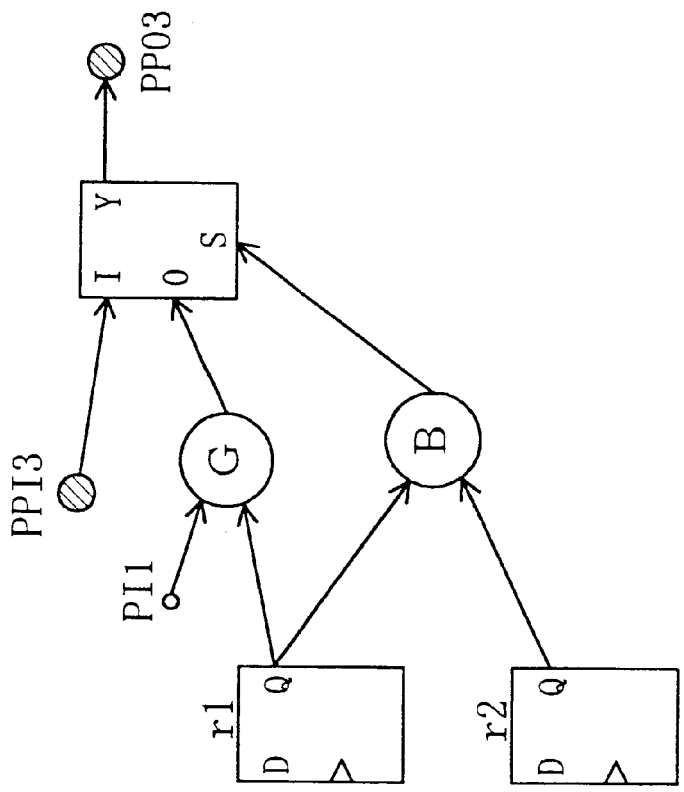
THE NUMBER OF FFs: 2

TIME FRAME 2

THE NUMBER OF FFs:0

TIME FRAME 1

THE NUMBER OF FFs:2

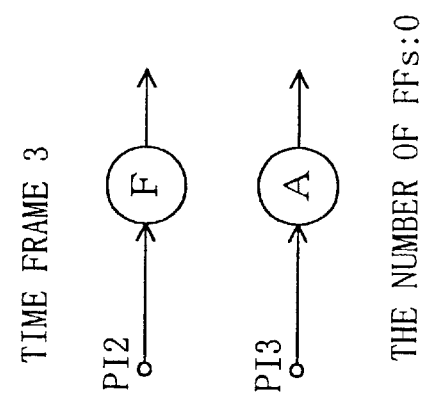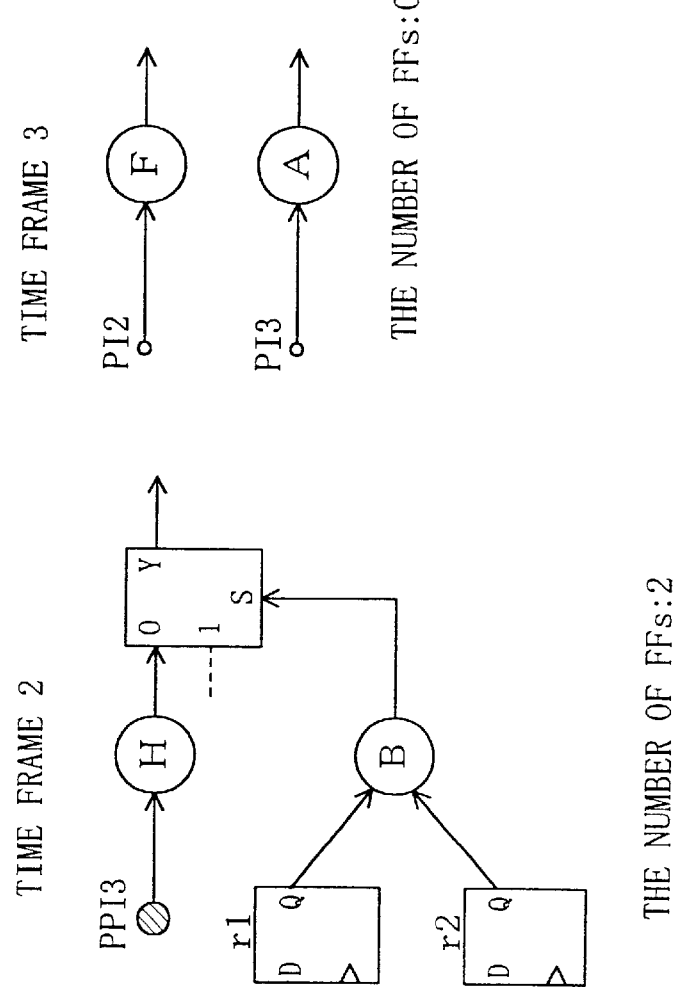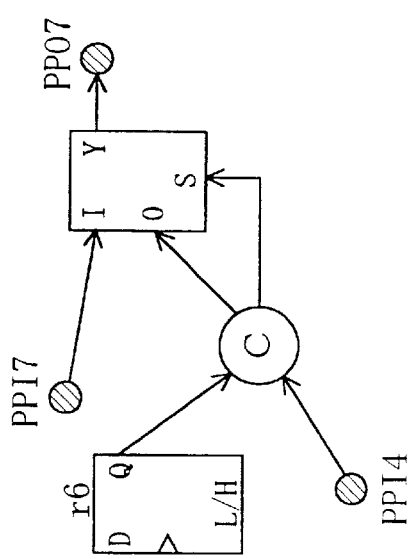
Fig. 17(a) TIME FRAME 1
Fig. 17(b) TIME FRAME 2
Fig. 17(c) TIME FRAME 3
THE NUMBER OF FFs:0
THE NUMBER OF FFs:2
SUCCESSFUL JUSTIFICATION
r6:LOAD MODE
THE NUMBER OF FFs:1

JUSTIFICATION OF "0"

JUSTIFICATION OF "1"

JUSTIFICATION OF "0"

JUSTIFICATION OF "1"

TIME T-1

THE NUMBER OF FFs:6

Fig. 33

| $r_1$ | $r_2$, $r_4$, PO1, PPO3 |
|---|---|
| $r_2$ | $r_2$ , PO1 |
| $r_4$ | PO1 |

|   | X1 | X2 | X3 |
|---|----|----|----|
| 0 | X  | X  | X  |
| 1 | X  | X  | X  |
| 2 | X  | X  | X  |

OK

TEST PATTERN FOR FAULT a

|   | X1 | X2 | X3 |
|---|----|----|----|
| 0 | 1  | 0  | X  |
| 1 | X  | 0  | X  |
| 2 | 1  | X  | 1  |

|   | X1 | X2 | X3 |
|---|----|----|----|
| 0 | 1  | 0  | X  |
| 1 | X  | 0  | X  |
| 2 | 1  | X  | 1  |

Fig. 51(a)

Ⓐ  TEST PATTERN FOR FAULT b

|   | X1 | X2 | X3 |     |   | X1 | X2 | X3 |
|---|----|----|----|-----|---|----|----|----|
| 0 | 1  | 0  | X  | NG  |   | X  | X  | 0  |
| 1 | X  | 0  | X  |     |   | X  | X  | 1  |
| 2 | 1  | X  | 1  |     |   | 0  | X  | 0  |

|   | X1 | X2 | X3 |
|---|----|----|----|
| 0 | X  | X  | 0  |
| 1 | X  | X  | 1  |
| 2 | 0  | X  | 0  |

Ⓐ

|   | X1 | X2 | X3 |
|---|----|----|----|
| 0 | 1  | 0  | X  |
| 1 | X  | 0  | X  |
| 2 | 1  | X  | 1  |

Fig. 56(a)

BUFFER×2            TEST PATTERN FOR FAULT a

|   | X1 | X2 | X3 | OK | X1 | X2 | X3 |
|---|----|----|----|----|----|----|----|
| 0 | X  | X  | X  |    | 1  | 0  | X  |
| 1 | X  | X  | X  |    | X  | 0  | X  |
| 2 | X  | X  | X  |    | 1  | X  | 1  |
| 3 | X  | X  | X  |    |    |    |    |
| 4 | X  | X  | X  |    |    |    |    |
| 5 | X  | X  | X  |    |    |    |    |

Fig. 56(b)

|   | X1 | X2 | X3 |
|---|----|----|----|
| 0 | 1  | 0  | X  |
| 1 | X  | 0  | X  |
| 2 | 1  | X  | 1  |
| 3 | X  | X  | X  |
| 4 | X  | X  | X  |
| 5 | X  | X  | X  |

DON'T CARE RATE = 5/18 < 60%

Fig. 57(a)

BUFFER×2

|   | X1 | X2 | X3 |
|---|----|----|----|
| 0 | 1  | 0  | X  |
| 1 | X  | 0  | X  |
| 2 | 1  | X  | 1  |
| 3 | X  | X  | X  |
| 4 | X  | X  | X  |
| 5 | X  | X  | X  |

NG / OK

TEST PATTERN FOR FAULT b

|   | X1 | X2 | X3 |
|---|----|----|----|
|   | X  | X  | 0  |
|   | X  | X  | 1  |
|   | 0  | X  | 0  |

Fig. 57(b)

|   | X1 | X2 | X3 |
|---|----|----|----|
| 0 | 1  | 0  | X  |
| 1 | X  | 0  | 0  |
| 2 | 1  | X  | 1  |
| 3 | 0  | X  | 0  |
| 4 | X  | X  | X  |
| 5 | X  | X  | X  |

DON'T CARE RATE = 8/18 < 60%

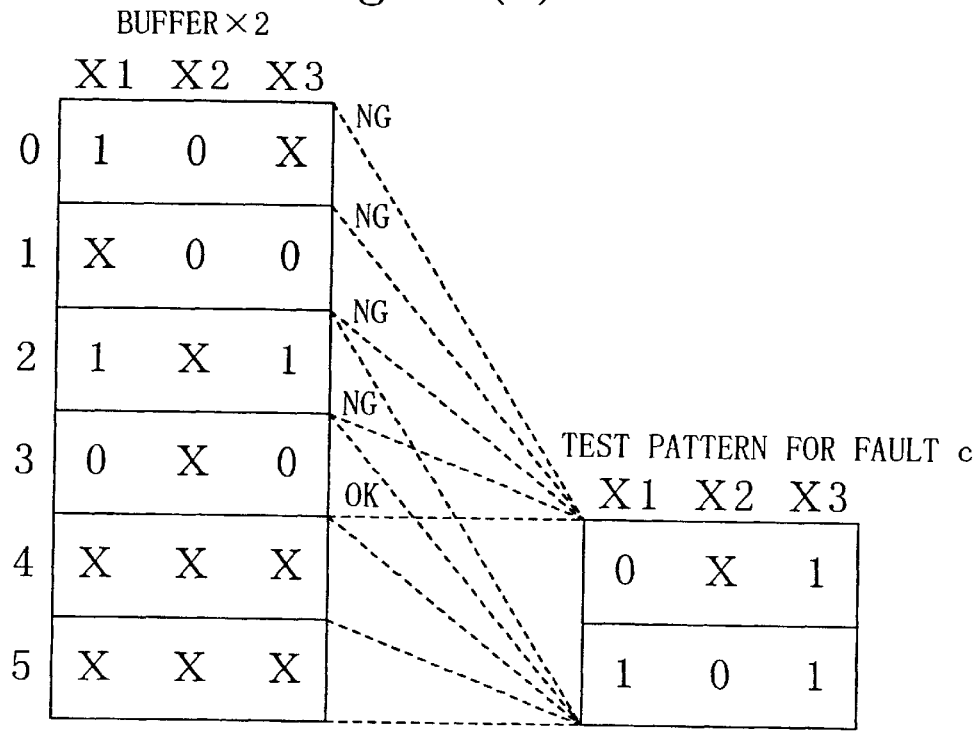

Fig. 59(a)

BUFFER×2

|   | X1 | X2 | X3 |
|---|----|----|----|
| 0 | X  | X  | X  |
| 1 | X  | X  | X  |
| 2 | X  | X  | X  |
| 3 | X  | X  | X  |
| 4 | X  | X  | X  |
| 5 | X  | X  | X  |

OK

TEST PATTERN FOR FAULT d

|   | X1 | X2 | X3 |
|---|----|----|----|
| 0 | 1  | 1  | 1  |
| 1 | 1  | X  | X  |
| 2 | X  | 1  | 0  |

Fig. 59(b)

|   | X1 | X2 | X3 |
|---|----|----|----|
| 0 | 1  | 1  | 1  |
| 1 | 1  | X  | X  |
| 2 | X  | 1  | 0  |
| 3 | X  | X  | X  |
| 4 | X  | X  | X  |
| 5 | X  | X  | X  |

DON'T CARE RATE = 6/18 < 60%

METHOD OF DESIGN FOR TESTABILITY, TEST SEQUENCE GENERATION METHOD AND SEMICONDUCTOR INTEGRATED CIRCUIT

This application is a Continuation of application Ser. No. 09/065,586 filed Apr. 24, 1998 now U.S. Pat. No. 6,253,393.

BACKGROUND OF THE INVENTION

The present invention relates to design for testability and test sequence generation for integrated circuits (LSIs).

Scan design is a conventionally used design as a typical design for testability technology. In a scan design method, flip-flops (FFs) in a logic-designed integrated circuit are replaced by scan FFs and hence can be controlled (scan-in) and observed (scan-out) directly from outside and the problem of sequential circuits is simplified into that of combinational circuits, for test sequence generation facilitation. One such technology is described in Digital Systems Testing and Testable Design, Chapter 9, Design For Testability, published in 1990 by Computer Science Press.

Scan design may be classified into two types, namely a full scan design method and a partial scan design method. In the former design method, all FFs in a circuit are replaced by scan FFs. On the other hand, in the latter design method, only some FFs in a circuit are replaced by scan FFs. A method of identifying (selecting) scan FFs in the partial scan design is fully discussed in a paper, entitled An Exact Algorithm for Selecting Partial Scan Flip-Flops, DAC (Design Automation Conference), pp.81–86, 1994 as well as in its references.

Additionally, as to test sequence generation for sequential circuits, test sequence compaction is fully described in a paper entitled Dynamic Test Compaction for Synchronous Sequential Circuits using Static Compaction Technique, FTCS (Fault Tolerant Computing Symposium), pp. 53–61, 1996 as well as in its references.

The above-noted prior art techniques however have their respective problems. A conventional partial scan design method produces the problem that in identification of FFs to replace with scan FFs it is not always possible to guarantee sufficiently high fault efficiency, i.e., 95% or more. Additionally a conventional test sequence compaction method for sequential circuits also produces the problem that it is poor in compaction rate.

SUMMARY OF THE INVENTION

An object of the invention is to provide an improved method of design for testability to guarantee a high fault efficiency in identifying FFs to replace with scan FFs. Another object of the invention is to provide an improved method of test sequence generation able to achieve a higher compaction rate in comparison with the prior art techniques.

This invention provides a method of design for testability for modifying design of an integrated circuit designed at gate level, in order to attain testability after manufacture, comprising the step of selecting flip-flops to replace with scan flip-flops among flip-flops in said integrated circuit in order that said integrated circuit has an n-fold line-up structure.

It is preferred that the method of design for testability comprises:

a full scan step of temporarily selecting about all flip-flops in said integrated circuit as flip-flops to replace with scan flip-flops; and a non-scan flip-flop selection step of examining, for each of the flip-flops temporarily selected as flip-flops to replace with scan flip-flops by said full scan step, that is, temporary scan flip-flop, whether said integrated circuit has an n-fold line-up structure or not in assuming each said temporary scan flip-flop as flip-flops to replace with non-scan flip-flops, and temporarily selecting, when said integrated circuit has an n-fold line-up structure by said assumption, each said temporary scan flip-flop as a flip-flop to replace with a non-scan flip-flop, wherein the flip-flops temporarily selected as flip-flops to replace with scan flip-flops by said full scan step and said non-scan flip-flop selection step are finally selected as flip-flops to replace with scan flip-flops.

This invention provides another method of design for testability for modifying design of an integrated circuit designed at gate level in order to attain testability after manufacture, comprising:

a first step of selecting, with recognizing load/hold flip-flop as not having a self-loop structure, flip-flops to replace with scan flip-flops among flip-flops in said integrated circuit in order that said integrated circuit has an n-fold line-up structure; and a second step of selecting flip-flops to replace with scan flip-flops so as to attain testability on load/hold flip-flops, in said integrated circuit with the flip-flops to replace with scan flip-flops selected at said first step.

It is preferred that in the method of design for testability said second step includes:

performing timeframe expansion, based on the state justification of load/hold flip-flops, about said integrated circuit with the flip-flops to replace with scan flip-flops selected at said first step, and selecting flip-flops to replace with scan flip-flops from said timeframe expansion.

This invention provides a method of test sequence generation for an integrated circuit, comprising:

a buffer length set step of setting a buffer length for a buffer for storing a test sequence; and a test sequence compaction step of generating a test sequence for said integrated circuit, in performing sequentially compaction storage of test sequences for respective faults in buffers having said buffer length set in said buffer length set step.

BRIEF DESCRIPTION OF THE DRAWINGS

FIGS. 7(a) and 7(b) show respectively L/H FFs.

FIGS. 12(a)–(c) illustrate step SB4 on a primary output PO1, with respect to the circuit of FIG. 11.

FIGS. 14(a) and (b) illustrate step SB4 on a pseudo-primary output PPO5, with respect to the circuit of FIG. 11.

FIGS. 15(a) and (b) illustrate step SB4 on a pseudo-primary output PPO3, with respect to the circuit of FIG. 11.

FIGS. 17(a)–(c) illustrate step SB4 on a pseudo-primary output PPO7, with respect to the circuit of FIG. 11.

FIG. 25, comprised of FIGS. 25(a) and (b), shows timeframe expansions of the circuit of FIG. 23, wherein FIG. 25(a) is an illustration of a normal timeframe expansion while

FIG. 33 shows reachable data prepared based on the FF of FIG. 32(b).

FIGS. 50(a) and (b) are diagrams useful in understanding the method of test sequence generation of the tenth embodiment.

FIGS. 51(a) and (b) are diagrams useful in understanding the method of test sequence generation of the tenth embodiment.

FIGS. 56(*a*) and (*b*) are diagrams useful in understanding the method of test sequence generation of the eleventh embodiment.

FIGS. 57(*a*) and (*b*) are diagrams useful in understanding the method of test sequence generation of the eleventh embodiment.

FIGS. 58(*a*) and (*b*) are diagrams useful in understanding the method of test sequence generation of the eleventh embodiment.

FIGS. 59(*a*) and (*b*) are diagrams useful in understanding the method of test sequence generation of the eleventh embodiment.

DETAILED DESCRIPTION OF THE INVENTION

Embodiment 1

Figure 1:
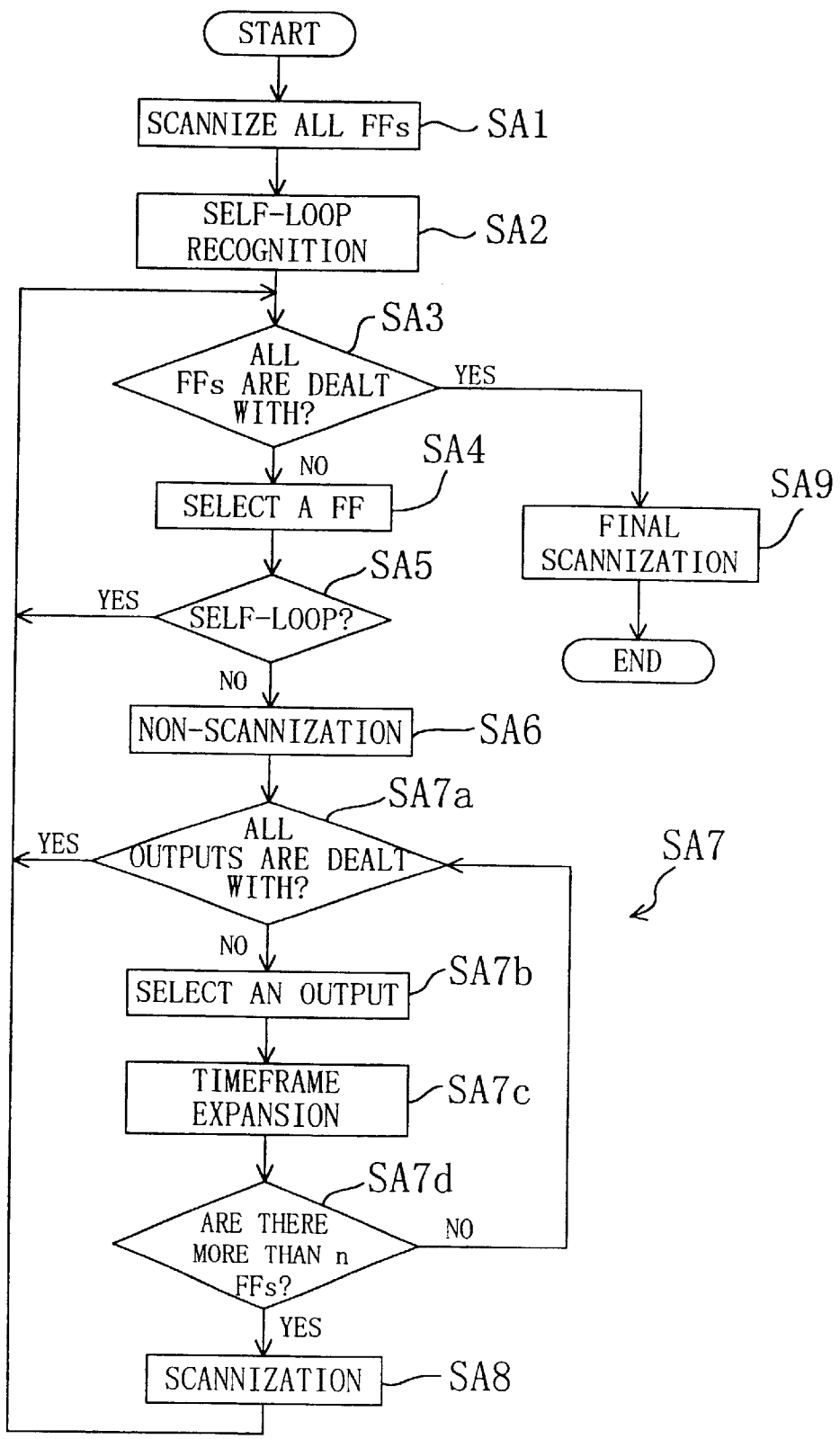
FIG. 1 is a flowchart showing procedures in a method of design for testability according to a first embodiment of the present invention.

FIG. 1 is a flowchart showing procedures in a method of design for testability according to a first embodiment of the present invention. In FIG. 1, in step SA1 as a full scan step, all the flip-flops (FFs) in a target integrated circuit are temporarily selected as FFs to replace with scan FFs. Note that such a FF temporarily selected as FF to replace with scan FF is hereinafter called temporary scan FF. At steps SA2 to SA8, for each temporary scan FF, it is examined whether the target integrated circuit has an n-fold line-up structure or not in assuming each the temporary scan FFs is selected as a FF to replace with a non-scan FF (step SA7), and if such examination shows that the target integrated circuit has an n-fold line-up structure, the temporary scan FF in question is temporarily selected as a FF to replace with a non-scan FF. At step SA9, temporary scan FFs, i.e., FFs temporarily selected as FFs to replace with scan FFs by steps SA1 to SA8 are finally selected as flip-flops to replace with scan FF.

An n-fold line-up structure means a circuit structure in which all paths between a flip-flop and an output have n or less sequential depths. A circuit having the n-fold line-up structure circuit has a characteristic that at most n identical FFs exist in timeframe expansion with respect to a primary output. For instance, a 1-fold line-up structure (when n is equal to 1) has a characteristic that the number of identical FFs is one in timeframe expansion with respect to a primary output. In accordance with the present embodiment, the selecting of FFs to replace with scan FFs is made in order that a target integrated circuit has an n-fold line-up structure, wherein an input and an output of a FF to replace with a scan FF are assumed as a pseudo-primary output and as a pseudo-primary input, respectively.

SA2 is the step of recognizing a flip-flop having a self-loop structure. When a flip-flop selected at step SA4 is recognized as a FF having a self-loop structure at step SA2, the procedure returns to step SA3 (step SA5). In other words, step SA7 is omitted for the FF having a self-loop structure, leaving the FF remained as temporary scan FF.

The method of design for testability of this embodiment will be described with reference to FIGS. 2–6. Here, n is 1 in the n-fold line-up structure, and in step SA7 it is examined whether a target integrated circuit has a 1-fold line-up structure.

Figure 2:
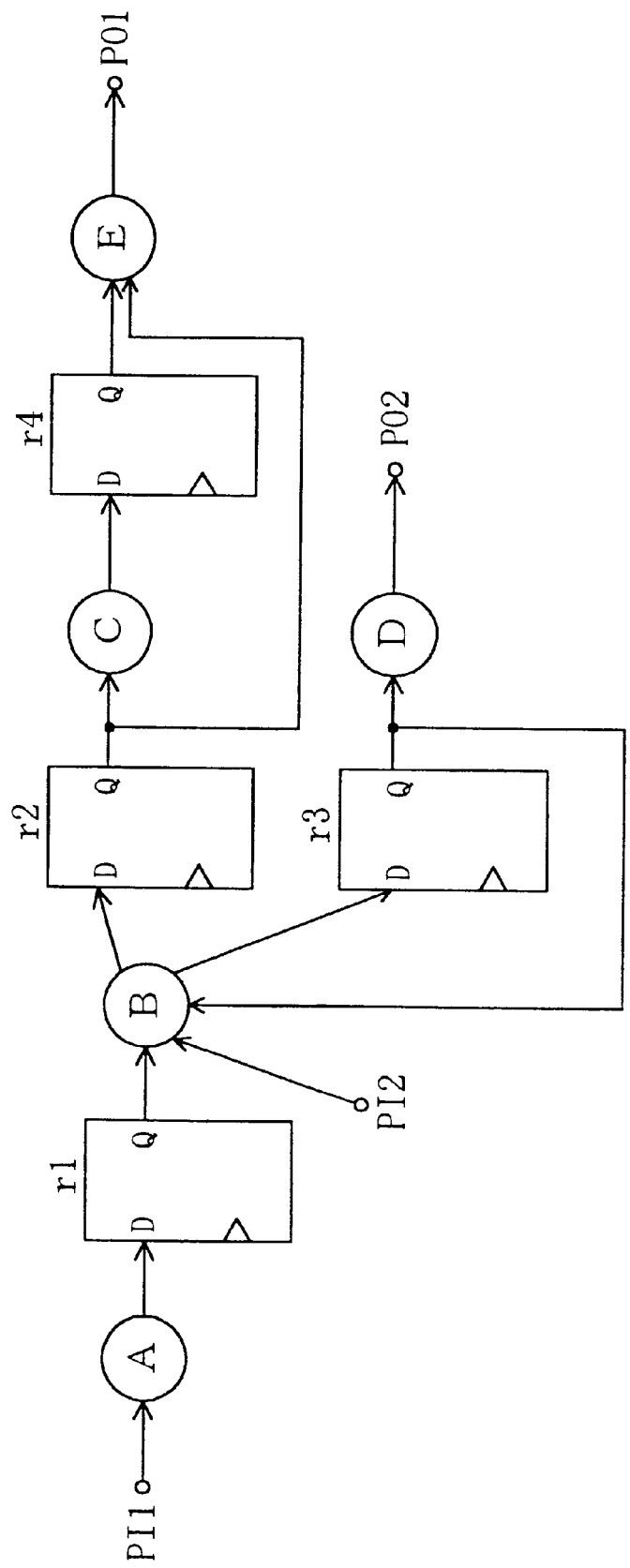
FIG. 2 is an illustration of an integrated circuit (LSI) which becomes an object of the method of design for testability of the first embodiment.
Figure 3A:
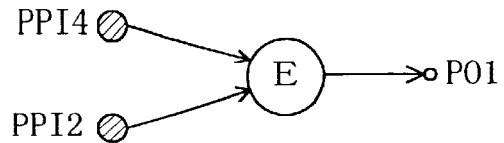
FIGS. 3(a)–(e) show timeframe expansions when FF r1 of the integrated circuit of FIG. 2 is selected as a FF to replace with a non-scan FF.
Figure 3B:
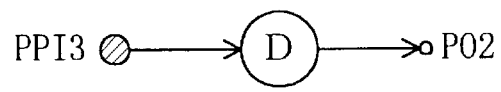
Figure 3C:
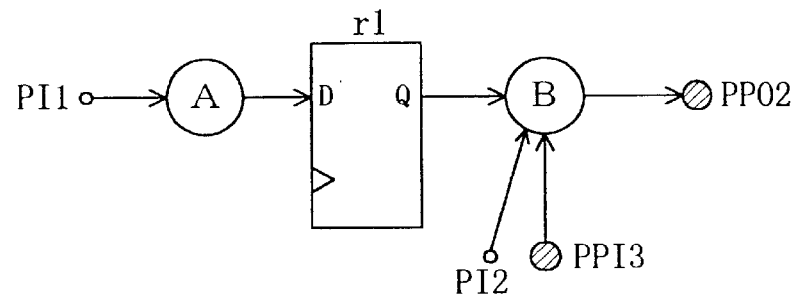
Figure 3D:
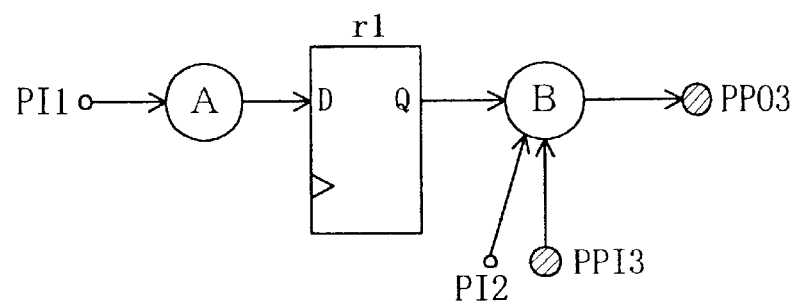
Figure 3E:
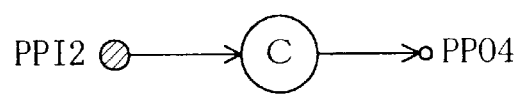
Figure 4A:
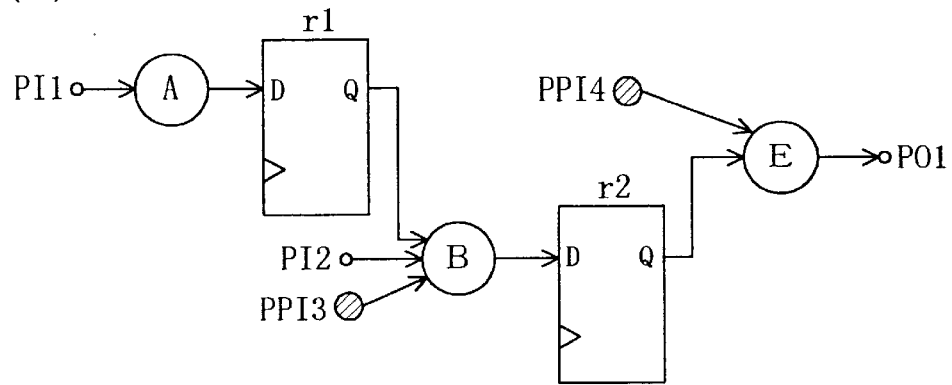
FIGS. 4(a)–(d) show timeframe expansions when FF r2 of the integrated circuit of FIG. 2 is selected as a FF to replace with a non-scan FF.
Figure 4B:
Figure 4C:
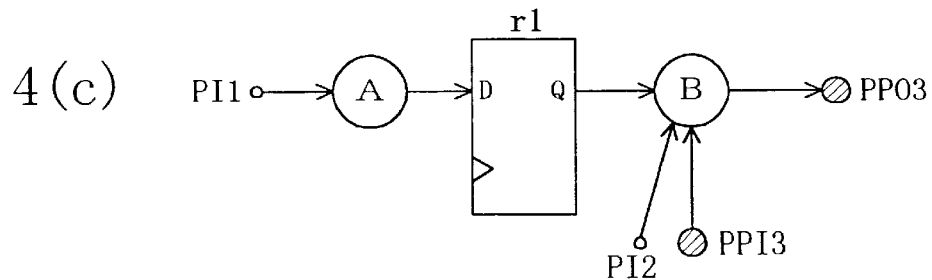
Figure 4D:
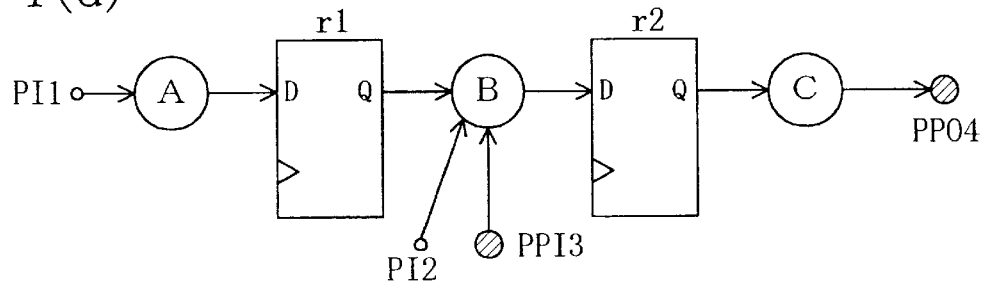

FIG. 2 represents a target integrated circuit (a sequential circuit) for the method of design for testability of this embodiment. A–E are combinational circuits. r1–r4 are flip-flops (FFs). PI1 and PI2 are primary inputs. PO1 and PO2 are primary outputs. Interconnections among elements are represented by arrows. All of the clocks of FF r1–FF r4 are coupled to the same clock input, the description of which is omitted in FIG. 2.

With respect to a temporary scan FF, its data input and output are assumed as a pseudo-primary output and as a pseudo-primary input, respectively. PPOi and PPIi represent, respectively, a pseudo-primary output and a pseudo-primary input, the character i being indicative of a corresponding FF. For example, when FF r1 is a temporary scan FF, its data input and output are assumed as a pseudo-primary output PPO1 and as a pseudo-primary input PPI1, respectively.

At step SA1, all flip-flops in FIG. 2, i.e., FF r1–r4, are selected as temporary scan FFs. At step SA2, the circuit structure of FIG. 2 is analyzed and the result shows that FF r3 is the only FF that has a self-loop structure.

Hereinafter, steps SA4–SA8 are performed on each of FF r1–r4.

At step SA4, FF r1 is selected. Since FF r1 does not have a self-loop structure, at step SA6 FF r1 is temporarily selected as a FF to replace with a non-scan FF, and at step SA7 the circuit is examined whether to have a 1-fold line-up structure.

FIG. 3 shows a timeframe expansion when FF r1 is temporarily selected as a FF to replace with a non-scan FF. At step SA7*c*, timeframe expansion is performed with respect to the primary output PO1 selected at step SA7*b* (FIG. 3(*a*)). Since there exists no FF in the expanded timeframe, the procedure returns to step SA7*a* from step SA7*d*. Then the primary output PO2 is selected and timeframe expansion is performed (FIG. 3(*b*)). Since there exists no FF in the expanded timeframe, the procedure again returns to step SA7*a*. Then the pseudo-primary output PPO2 (i.e., the data input of FF r2 as a temporary scan FF) is selected, and timeframe expansion is performed (FIG. 3(*c*)). Since there exists only one FF r1 in the expanded timeframe, the procedure again returns to step SA7*a*. Then the primary output PPO3 (i.e., the data input of FF r3 as a temporary scan FF) is selected and timeframe expansion is performed (FIG. 3(*d*)). Since there exists only one FF r1 in the expanded timeframe, the procedure again returns to step SA7*a*. Then the pseudo-primary output PPO4 (i.e., the data input of FF r4 as a temporary scan FF) is selected, and timeframe expansion is performed (FIG. 3(*e*)). Since there exists no FF in the expanded timeframe, the procedure again returns to step SA7*a*. Timeframe expansion processing is now completed with respect to all the primary outputs and all the pseudo-primary outputs. The procedure therefore returns to step SA3. At step SA4, a next FF is selected.

At step SA4, FF r2 is selected. Since FF r2 does not have a self-loop structure, at step SA6 FF r2 is temporarily selected as a FF to replace with a non-scan FF. Step SA7 examines whether the circuit has a 1-fold line-up structure.

FIG. 4 shows a timeframe expansion when FF r2 is temporarily selected as a FF to replace with a non-scan FF. At step SA7*c*, timeframe expansion is performed with respect to the primary output PO1 selected at step SA7*b* (FIG. 4(*a*)). Since there exists only one FF r1 and one FF r2 in the expanded timeframe, the procedure returns to step SA7a from step SA7d. Then, the primary output PO2 is selected, and timeframe expansion is performed (FIG. 4(b)). Since there exists no FF in the expanded timeframe, the procedure again returns to step SA7a. Then, the pseudo-primary output PPO3 is selected, and timeframe expansion is performed (FIG. 4(c)). Since there exists only one FF r1 in the expanded timeframe, the procedure again returns to step SA7a. Then, the pseudo-primary output PPO4 is selected, and timeframe expansion is performed (FIG. 4(d)). Since there exist only one FF r1 and only one FF r2 in the expanded timeframe, the procedure again returns to step SA7a. Timeframe expansion processing is now completed with respect to all the primary outputs and all the pseudo-primary outputs. The procedure therefore returns to step SA3. At step SA4, a next FF is selected.

At step SA4, FF r3 is selected. However, since FF r3 was already recognized as a FF having a self-loop structure, the procedure returns to step SA3 from step SA5. At step SA4, a next FF is selected.

At step SA4, FF r4 is selected. FF r4 does not have a self-loop structure. Accordingly, at step SA6 FF r4 is temporarily selected as a FF to replace with a non-scan FF. Step SA7 examines whether the circuit has a 1-fold line-up structure.

Figure 5:
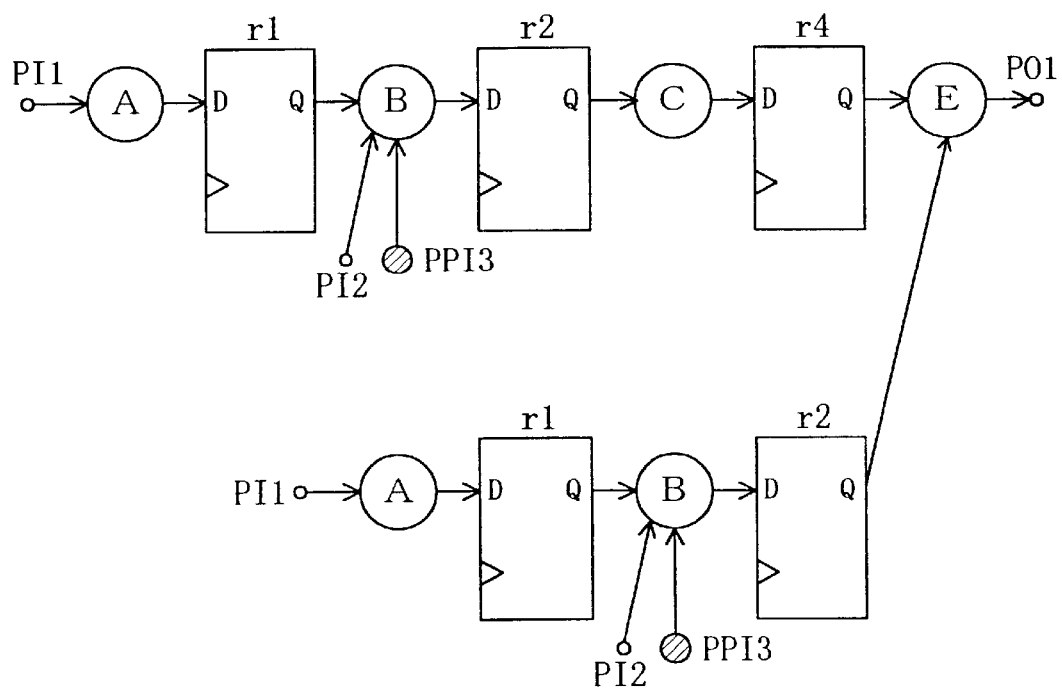
FIG. 5 shows a timeframe expansion when FF r4 of the integrated circuit of FIG. 2 is selected as a FF to replace with a non-scan FF.

FIG. 5 shows a timeframe expansion when FF r4 is temporarily selected as a FF to replace with a non-scan FF. At step SA7c, timeframe expansion is performed with respect to the output terminal PO selected at step SA7b. There exist two FFs r1 and two FFs r2 in the expanded timeframe, which means that the circuit does not have a 1-fold line-up structure. The procedure moves to step SA8 from step SA7d, and FF r4 is selected as a temporary scan FF.

Steps SA4–SA8 has been performed for all the FF r1–r4. The temporary scan FFs, i.e., FF r3 and FF r4, are finally selected as flip-flops to replace with FFs at step SA9, and the procedure is finished.

Figure 6:
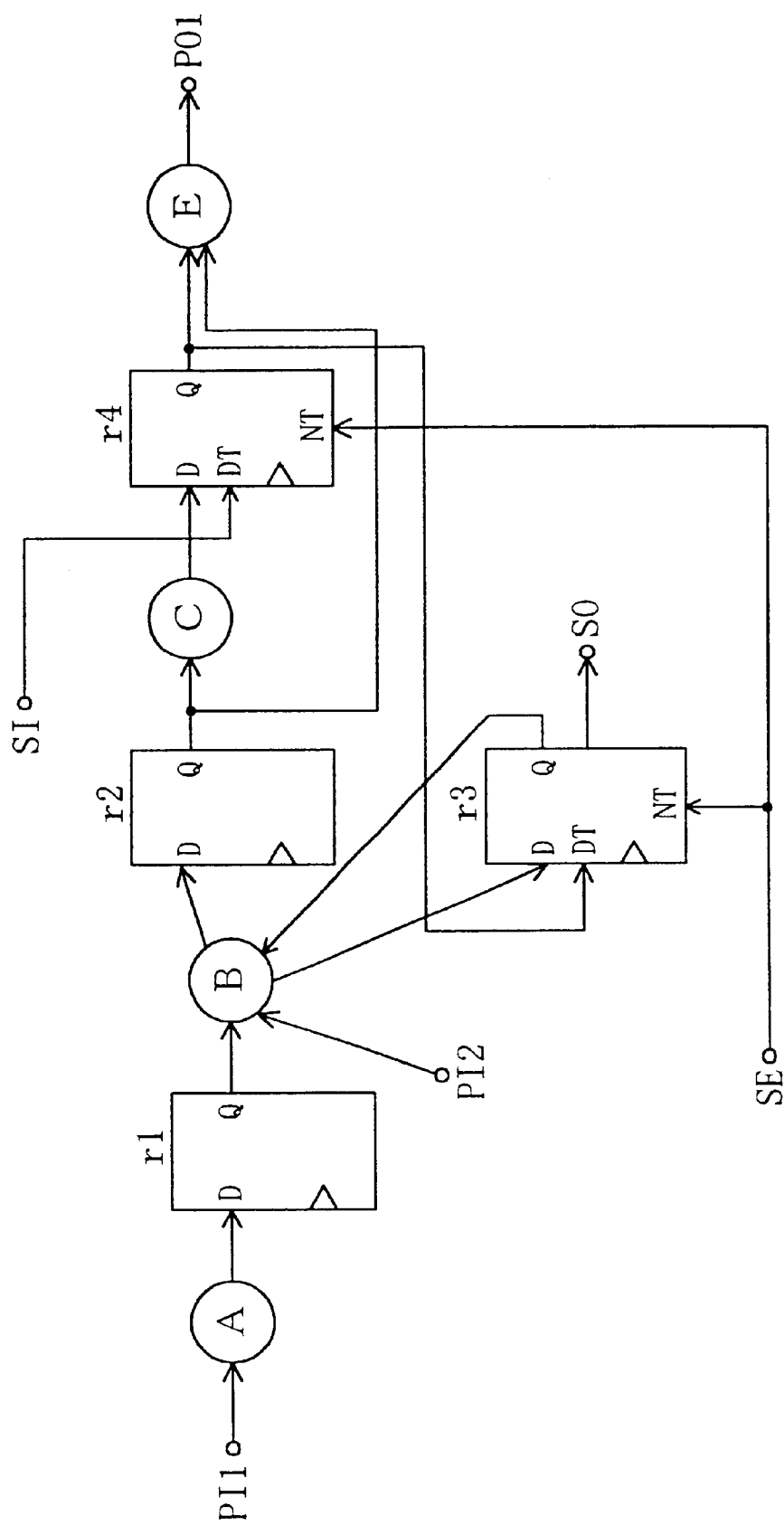
FIG. 6 is an illustration of a method of design for testability of the first embodiment applied to the integrated circuit of FIG. 2.

FIG. 6 shows a result of the method of design for testability of the present embodiment for the integrated circuit of FIG. 2. In FIG. 6, FF r3 and r4 which are finally selected as flip-flops to replace with, are really replaced with scan FFs. SI represents a scan-in primary input. SO represents a scan-out primary output. SE represents a scan enable primary input. A scan path is constructed such that it extends from the scan-in primary input SI to the scan-out primary output SO by way of a scan input DT and a scan output Q of the scan FF r4 and a scan input DT and a scan output Q of the scan FF r3.

In accordance with the present method of design for testability, FFs to replace with scan FFs are determined in order that a sequential circuit has an n-fold line-up structure, hence, high fault efficiency can be guaranteed at scan FF identification.

The algorithm of the present embodiment can be applied easily to methods of design for testability for an integrated circuit designed at register transfer level (RTL). At first, full scan step is performed in which all registers in an RTL-designed integrated circuit are temporarily selected as registers to replace with scan registers. Then, non-scan register selection step is performed in which, for each temporary scan register selected by the full scan step, it is examined whether the RTL-designed integrated circuit has an n-fold line-up structure or not in assuming each the temporary scan register is selected as a register to replace with a non-scan register, and if such examination shows that the RTL-designed integrated circuits has an n-fold line-up structure, each the temporary scan registers in question is temporarily selected as a register to replace with a non-scan register. And, the registers temporarily selected as registers to replace with scan registers by the full scan step and the non-scan register selecting step are finally selected as registers to replace with scan registers.

Embodiment 2

FIG. 7 shows a load/hold FF (L/H FF). As shown in FIG. 7(a), the L/H FF switches between load mode and hold mode by a load/hold signal applied at its load/hold selection input LH. In the load mode, data is loaded at the D input, while in the hold mode the currently-held data continues to be held. Use of L/H FFs reduces clock signal lines and power consumption. As shown in FIG. 7(b), the L/H FF may be described by a combination of a selector and a DFF. The selector selects, using the load/hold signal as a selection signal, a primary input or an output of the DFF and provides whichever is selected. The output of the selector serves as an input of the DFF. In other words, the L/H FF has a self-loop structure.

In accordance with a method of design for testability of the present embodiment, on condition that an L/H FF having a self-loop structure shown in FIG. 7 is recognized as a FF not having a self-loop structure, partial scan design is performed based on the state justification of load/hold flip-flops.

Figure 8:
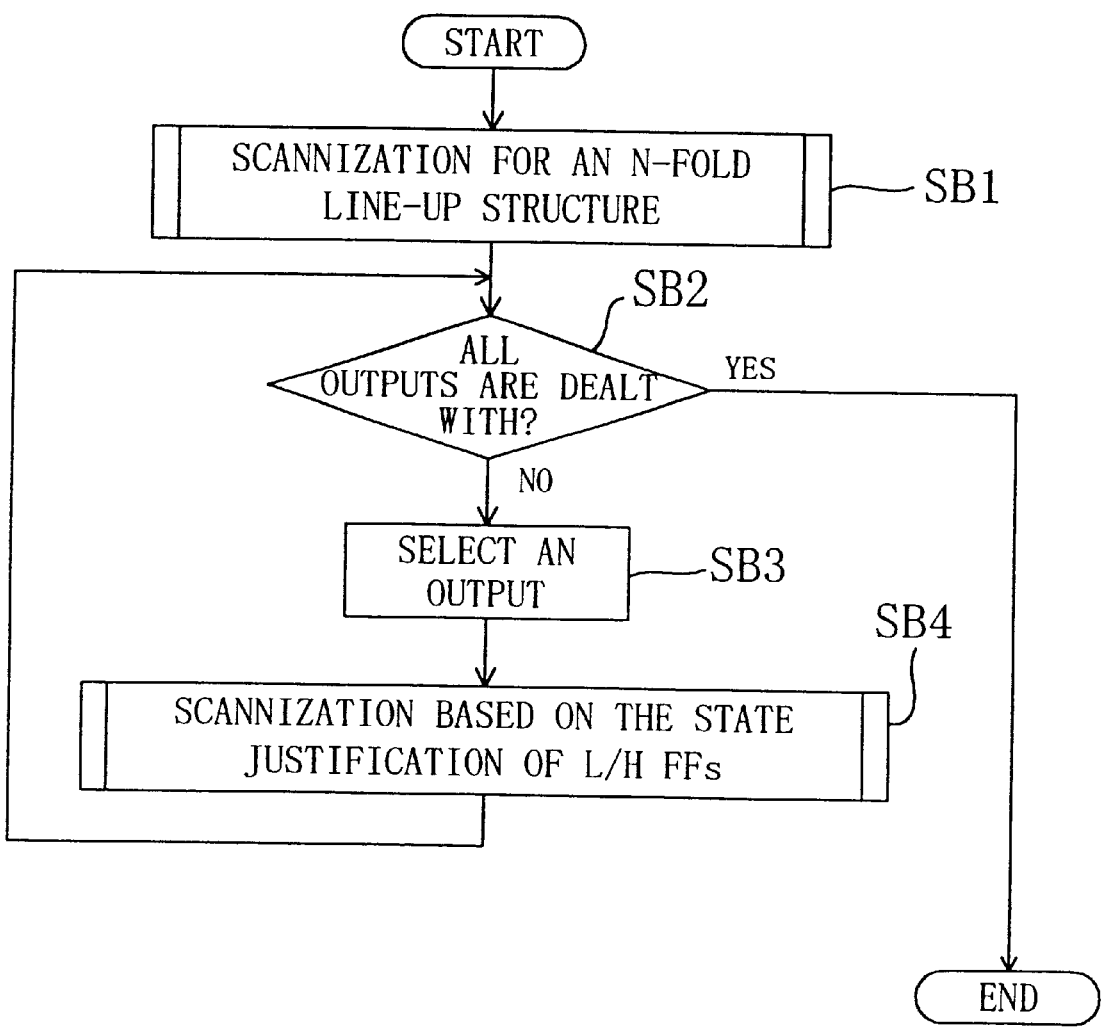
FIG. 8 is a flowchart showing procedures in a method of design for testability according to a second embodiment of the present invention.

FIG. 8 is a flowchart showing procedures in the method of design for testability according to the present embodiment. In FIG. 8, SB1 is the step of selecting FFs to replace with scan FFs in order that a target integrated circuit has an n-fold line-up structure. This step SB1 is similar to the method of design for testability of the first embodiment, but it differs from the first embodiment method as follows. That is, in step SB1, selection of FFs to replace with scan FFs is made, with recognizing L/H FF as flip-flop not having a self-loop structure.

At steps SB2 to SB4, partial scan design is performed based on the L/H FF state justification. At step SB3, an output is selected among untreated primary outputs and pseudo-primary outputs. At step SB4, timeframe expansion, based on the L/H FF state justification, is performed with respect to the output selected at step SB3, to select FFs to replace with scan FFs. When steps SB3 and SB4 are performed on all of the primary outputs and the pseudo-primary outputs, the present design for testability is completed (step SB2).

Figure 9:
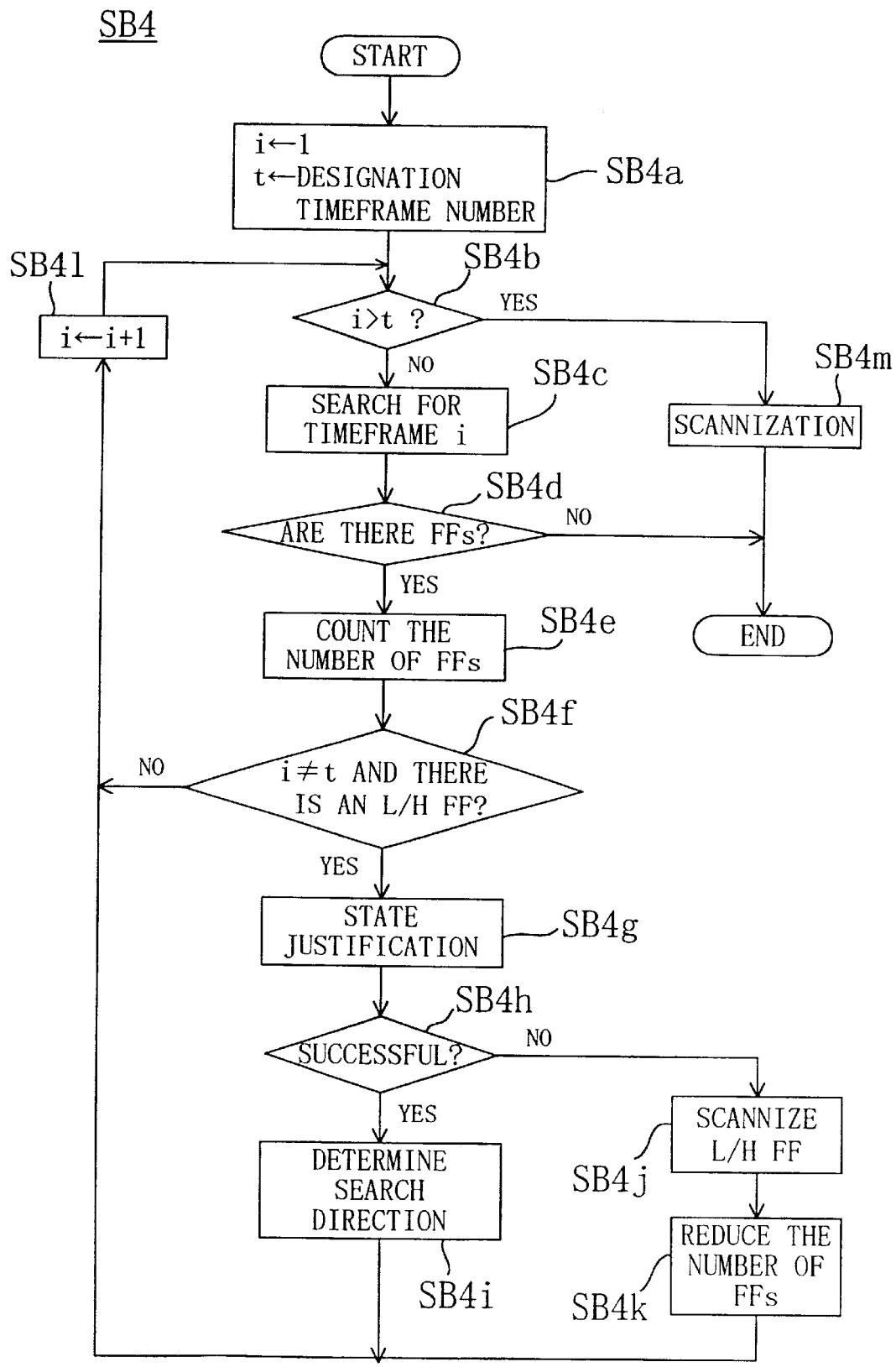
FIG. 9 is a flowchart showing the details of step SB4 of FIG. 8.

FIG. 9 is a flowchart showing the details of step SB4 in the present method of design for testability shown in FIG. 8. At this step SB4, the determining of FFs to replace with scan FFs is made in order that test sequences may become generative in a predetermined number of timeframes. In FIG. 9, SB4a is the step of setting 1 as an initial value for a timeframe number i and setting the upper limit of the timeframe number i as a designation timeframe number t. SB4b is the step of determining whether processing is finished for timeframes equal in number to the designation timeframe number t. If finished, then the procedure moves to step SB4m, while if not, the procedure moves to SB4c. SB4c is the step of searching for the current timeframe i either from the primary output or pseudo-primary output or from the data input of a FF existing in the previous timeframe. SB4d is the step of examining whether there exists a FF in the timeframe i searched at step SB4c. If a FF exists in the timeframe i, the procedure advances to step SB4e, while if not, the procedure is finished. SB4e is the step of counting the number of FFs in the current timeframe i. SB4f is the step of examining whether the timeframe number i is different from the designation timeframe number t and there exists an L/H FF in the current timeframe i. If the numbers i and t disagree with each other and there exists an L/H FF in the current timeframe i, the procedure moves to step SB4g. If not, the procedure returns to step SB4b by step SB4l. SB4g is the step of performing state justification on L/H FFs found to exist in the current timeframe i. SB4h is the step of examining whether L/H FF state justification at step SB4g succeeds. If every L/H FF state justification is successful, the procedure moves to step SB4i, while if not, the procedure moves to step SB4j. SB4i is the step of determining a search direction in a subsequent timeframe for a successfully state justified L/H FF. SB4j is the step of determining all the L/H FFs in the current timeframe i as FFs to replace with scan L/H. SB4k is the step of subtracting the number of L/H FFs determined as FFs to replace with scan L/H FFs at step SB4j from the number of FFs included in the current timeframe i. SB4m is the step of making a decision that all FFs, which exist in a timeframe with the minimum number of FFs counted at steps SB4d and SB4k, are selected as FFs to replace with scan FFs.

Now, a method of design for testability of the present embodiment shown in FIGS. 8 and 9 will be described, referring to FIGS. 10–17.

Figure 10:
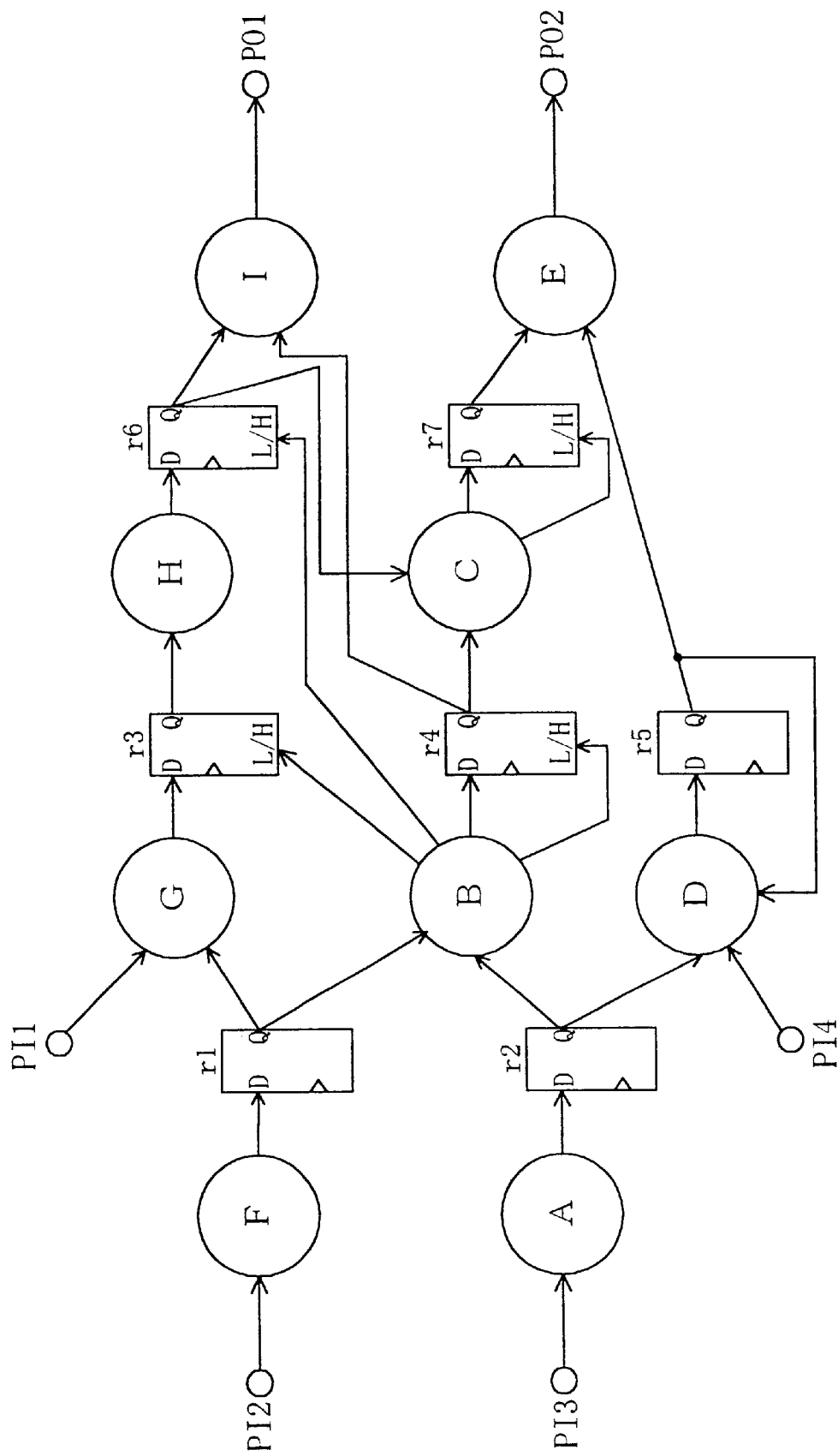
FIG. 10 is an illustration of a sequential circuit which becomes an object of the method of design for testability of the second embodiment.

FIG. 10 shows a sequential circuit as an object of the present method of design for testability. A–I are combinational circuits. r1–r7 are FFs. PI1–PI4 are primary inputs. PO1–PO2 are primary outputs. r3, r4, r6, and r7 are L/H FFs. Each arrow represents interconnection among these elements. Clocks of FF r1–FF r7 are all coupled to the same clock input, the description of which is omitted in FIG. 10.

Figure 11:
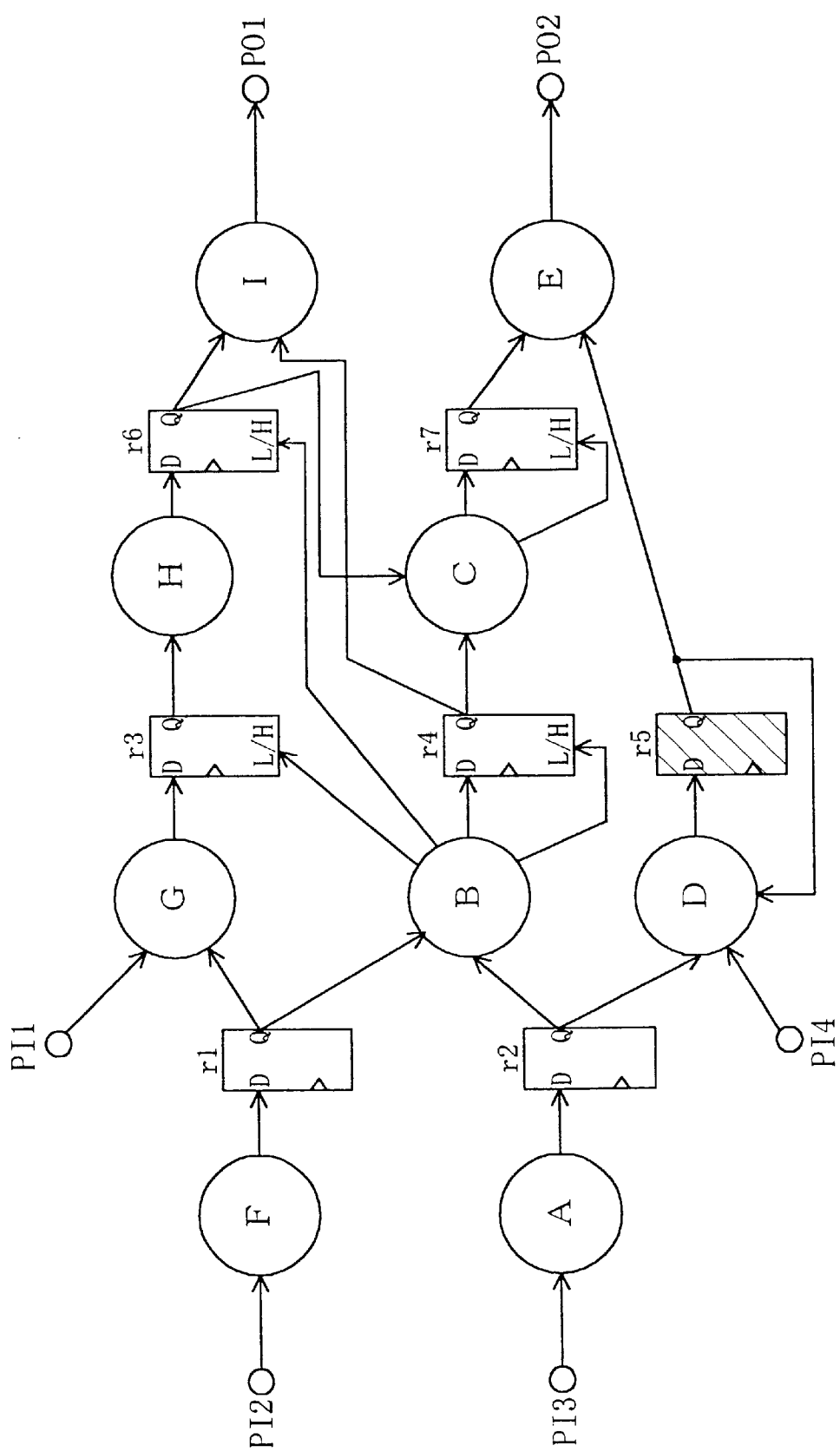
FIG. 11 is a diagram obtained by determining FFs to replace with scan FFs in order that the sequential circuit of FIG. 10 has a 2-fold line-up structure.

For the circuit of FIG. 10, step SB1 determines FFs to replace with scan FFs in order that the circuit has an n-fold line-up structure. FIG. 11 shows a result obtained by determining FFs to replace with scan FFs in order that the circuit of FIG. 10 has a 2-fold line-up structure. FIG. 11 shows that only FF r5 is selected as a FF to replace with a scan FF. Note that at step SB1, L/H FFs r3, r4, r6, and r7 are not selected as FFs to replace with scan FFS, since they are recognized as not having a self-loop structure.

At steps SB2–SB4, based on the state justification of L/H FFs, partial scan design is performed for a circuit shown in FIG. 11. At step SB4, according to the FIG. 9 flowchart, scannization based on the L/H FF state justification is performed, with respect to primary outputs or pseudo-primary outputs selected at step SB3. At step SB4, an L/H FF is regarded as a circuit composed of a selector and a DFF shown in FIG. 7(b). In this case, load mode is a situation that the S input of the selector is "0", while hold mode is a situation that the selector S input is "1". Here, at step SB4a, the designation timeframe number t is set at 3.

At step SB3, the primary output PO1 is selected, and step SB4 is executed.

FIG. 12 shows the processing at step SB4 for the primary output PO1. As shown in FIG. 12(a), the search from the primary output PO1 is performed, which results in getting to L/H FFS r4, r6 (step SB4c). The number of FFs in this timeframe 1 is two (step SB4e). Since the timeframe number i is 1 and therefore is different from the designation timeframe number t (=3) and there exist L/H FF r4 and L/H FF r6 in the current timeframe (step SB4f), L/H FFs r4, r6 are state justified (step SB4g). Suppose here that "0" state justification at D inputs of FF r4, r6 is carried out with success and L/H FF r4 and L/H FF r6 are determined to be in hold mode and in load mode, respectively. As search directions in the next timeframe, the input side of hold mode is set for L/H FF r4 and the input side of load mode is set for L/H FF r6 (step SB4i).

As shown in FIG. 12(b), the hold mode input side of L/H FF r4 and the load mode input side of L/H FF r6 are searched, which results in getting to FF r1–FF r4 (step SB4c). The number of FFs in this timeframe 2 is four (step SB4e). Since the timeframe number i is 2 and therefore is different from the designation timeframe number t (=3) and there exist L/H FF r3 and L/H FF r4 in the current timeframe (step SB4f), L/H FF r3 and L/H FF r4 are state justified (step SB4g). Suppose here that "0" state justification at D inputs of FF r3, r4 is unsuccessful. In such a case, these L/H FF r3 and L/H FF r4 are selected as FFs to replace with scan FFs (step SB4j), and the number of FFs present in the current timeframe 2 is reduced from 4 down to 2.

Next, as shown in FIG. 12(c), the input side of each FF r1 and FF r2 is searched, which results in getting to no FFs but to the primary inputs PI2 and PI3. The processing at step SB4 for the primary output PO1 is therefore finished (step SB4d). As a result, it is determined that L/H FF r3 and L/H FF r4 are FFs to replace with scan FFs.

Next, the primary output PO2 is selected at step SB3, and the processing at step SB4 is carried out.

Figure 13C:
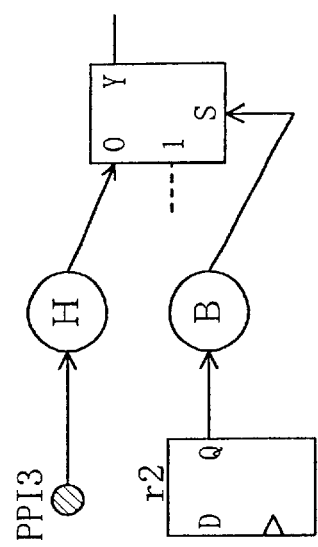
FIGS. 13(a)–(c) illustrate step SB4 on a primary output PO2, with respect to the circuit of FIG. 11.
Figure 13B:
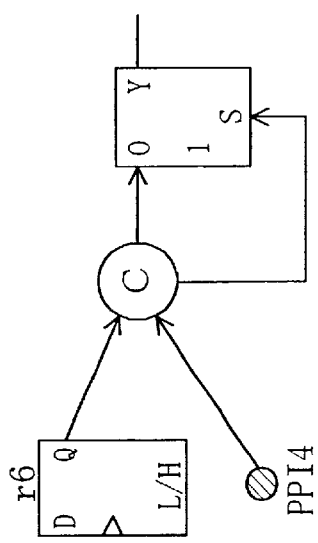
Figure 13A:
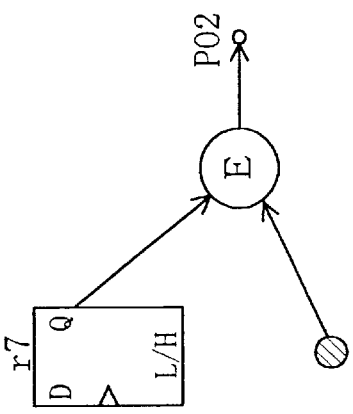

FIG. 13 shows the processing at step SB4 for the primary output PO2. As shown in FIG. 13(a), the search from the primary output PO2 is performed, which results in getting to L/H FF r7 (step SB4c). The number of FFs in this timeframe 1 is one (step SB4e). Since the timeframe number i is 1 and therefore is different from the designation timeframe number t (=3) and there exists L/H FF r7 in the current timeframe (step SB4f), L/H FF r7 is state justified (step SB4g). Suppose here that logical "0" state justification is carried out with success and L/H FF r7 is determined to be in load mode. As a search direction in the next timeframe, the input side of load mode is set for L/H FF r7 (step SB4i).

As shown in FIG. 13(b), the load mode input side of L/H FF r7 is searched, which results in getting to FF r6 (step SB4c). The number of FFs in this timeframe 2 is one (step SB4e). Since the timeframe number i is 2 and therefore is different from the designation timeframe number t and there exists L/H FF r6 in the current timeframe (step SB4f), L/H FF r6 is state justified (step SB4g). Suppose here that logical "0" state justification is carried out with success and L/H FF r6 is determined to be in load mode. As a search direction in the next timeframe, the input side of load mode is set for L/H FF r6 (step SB4i).

Next, as shown in FIG. 13(c), the input side of L/H FF r6 in load mode is searched, which results in getting to FF r2 (step SB4c). The number of FFs in this timeframe 3 is one (step SB4e). Since the timeframe number i is 3 and therefore agrees with the designation timeframe number t (step SB4f), timeframe expansion is here finished (step SB4b), and FFs which exist in a timeframe with the minimum number of FFs are determined as FFs to replace with scan FFs (step SB4m). FIG. 13 shows that each timeframe has one FF, in other words each timeframe has the same number of FFs. Accordingly, FF r7 in the timeframe 1 is determined as a FF to replace with a scan FF.

Next, at step SB3, the pseudo-primary output PPO5 (i.e., the data input of FF r5 selected as a FF to replace with a scan FF at step SB1) is selected, and the step SB4 is executed.

FIG. 14 shows the processing at step SB4 for the pseudo-primary output PPO5. As shown in FIG. 14(a), search from the pseudo-primary output PPO5 is performed, which results in getting to FF r2 (step SB4c). The number of FFs in this timeframe 1 is one (step SB4e). Since this timeframe has no L/H FFs (step SB4f), the next timeframe is expanded. As shown in FIG. 14(b), since search from the input side of FF r2 got to no FFs but to the primary input PI3, the processing at step SB4 for the pseudo-primary output PPO5 is finished (step SB4d).

Next, at step SB3, the pseudo-primary output PPO3 (i.e., the data input of a DFF forming L/H FF r3 selected as a FF to replace with a scan FF at step SB4 for the primary output PO1) is selected, and the processing at step SB4 is executed.

FIG. 15 shows the processing at step SB4 for the pseudo-primary output PPO3. As shown in FIG. 15(a), search from the pseudo-primary output PPO3, which results in getting to FF r1 and FF r2 (step SB4c). The number of FFs in this timeframe 1 is two (step SB4e). There exist no L/H FFs in the timeframe 1 (step SB4f) and the next timeframe is therefore searched. As shown in FIG. 15(b), since search from the input side of each FF r1, r2 got to no FFs but to the primary inputs PI2 and PI3, the processing at step SB4 for the pseudo-primary output PPO3 is finished (step SB4d).

Next, at step SB3, the pseudo-primary output PPO4 (i.e., the data input of a DFF forming L/H FF r4 selected as a FF to replace with a scan FF at step SB4 for the primary output PO1) is selected, and the processing at step SB4 is executed.

Figure 16B:
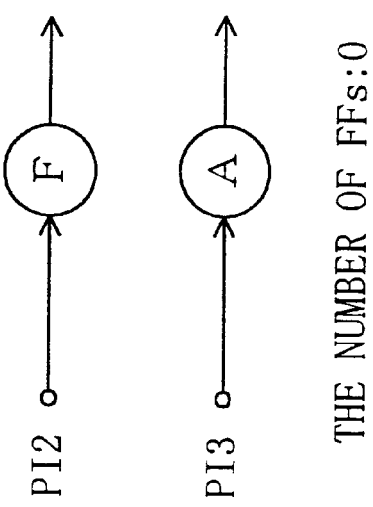
FIGS. 16(a) and (b) illustrate step SB4 on a pseudo-primary output PPO4, with respect to the circuit of FIG. 11.
Figure 16A:
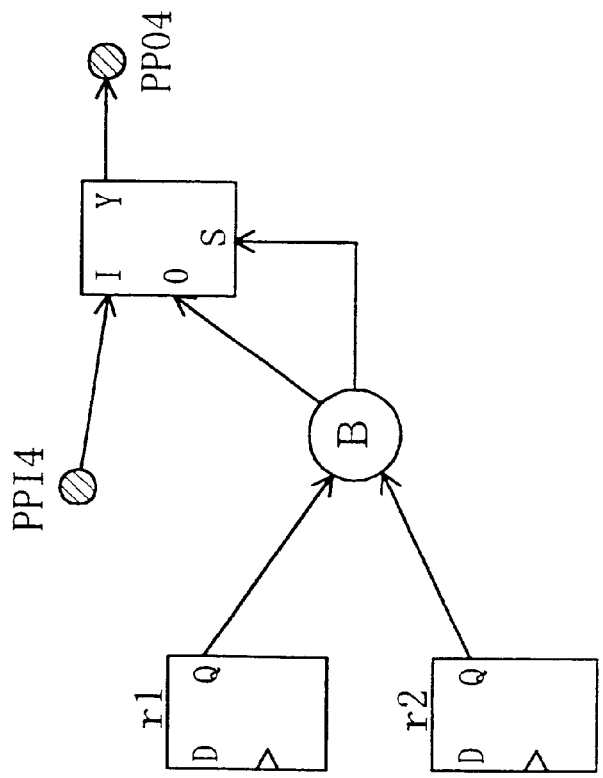

FIG. 16 shows the processing at step SB4 for the pseudo-primary output PPO4. As shown in FIG. 16(a), search from the pseudo-primary output PPO4 is performed, which results in getting to FF r1 and FF r2 (step SB4c). The number of FFs in this timeframe 1 is two (step SB4e). There exist no L/H FFs in the timeframe 1 (step SB4f) and the next timeframe is therefore searched. As shown in FIG. 16(b), since the previous searching of the input side of each FF r1 and FF r2 got to no FFs but to the primary inputs PI2 and PI3, the processing at step SB4 with respect to the pseudo-primary output PPO4 is finished (step SB4d).

Next, at step SB3, the pseudo-primary output PPO7 (i.e., the data input of a DFF forming L/H FF r7 selected as a FF to replace with a scan FF at step SB4 for the primary output PO2) is selected, and the processing at step SB4 is executed.

FIG. 17 shows the processing at step SB4 for the pseudo-primary output PPO7. As shown in FIG. 17(a), search from the pseudo-primary output PPO7 is performed, which results in getting to FF r6 (step SB4c). The number of FFs in this timeframe 1 is one (step SB4e). Since the timeframe number i is 1 and therefore is different from the designation timeframe number t and there exists L/H FF r6 in the current timeframe (step SB4f), L/H FF r6 is state justified (step SB4g). Suppose here that logical "0" state justification is carried out with success and it is determined that L/H FF r6 is set to load mode. As a search direction in the next timeframe, the input side of load mode is set for L/H FF r6.

As shown in FIG. 17(b), the load mode input side of L/H FF r6 is searched to get to FF r1, r2 (step SB4c). The number of FFs in this timeframe 2 is two (step SB4e). Since there exist no L/H FFs in the timeframe 2, a search for the next timeframe is made.

As shown in FIG. 17(c), search from the inside of each FF r1, r2 got to no FFs but to the primary inputs PI2 and PI3. The processing at step SB4 for the pseudo-primary output PPO7 is therefore finished.

Since the processing at step SB4 is finished for all the primary outputs and all the pseudo-primary outputs (step SB2), the present design for testability is completed. As a result, FF r5 is selected as a FF to replace with scan FF at step SB1 and L/H FF r3, FF r4, and FF r7 are selected as FFs to replace with scan FFs at step SB4.

As described above, the present embodiment includes selecting FFs to replace with scan FFs in order that a integrated circuit has an n-fold line-up structure with recognizing L/H FF as FF not having a self-loop structure, and selecting, based on the L/H FF state justification, FFs to replace with scan FFS in order that test sequences may become generative in a predetermined number of timeframes. Such arrangement guarantees high fault efficiency for a sequential circuit including many L/H FFs in selecting FFs to replace with scan FFs at relatively low scannization rate.

Here, the purpose of assigning "0" at a plurality of L/H FFs in state justification is to determine whether each L/H FF is state justified in a load mode or in a hold mode. Thus, the other logic value, instead of "0", may be assigned in state justification.

Embodiment 3

Figure 18:
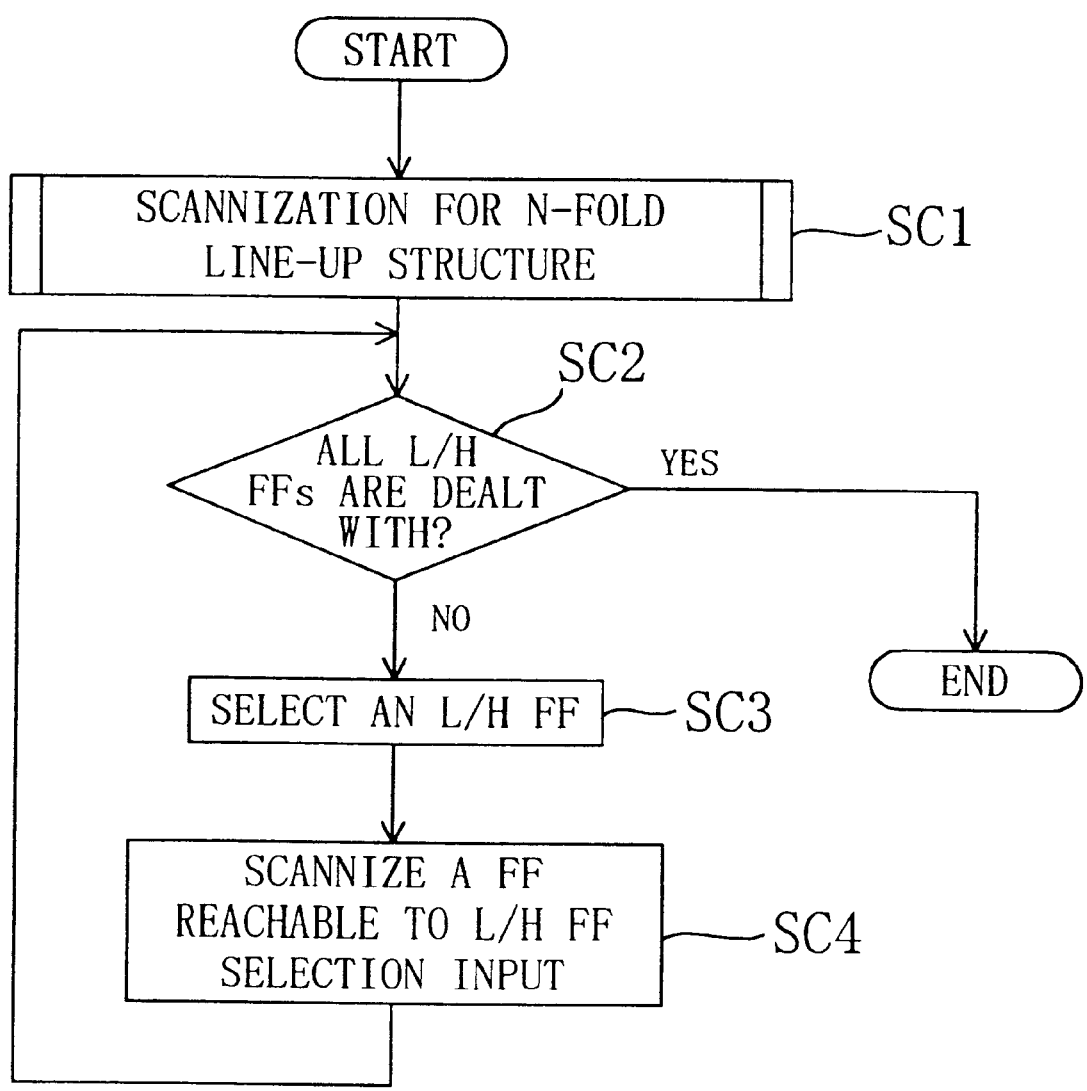
FIG. 18 is a flowchart showing procedures in a method of design for testability according to a third embodiment of the present invention.

FIG. 18 is a flowchart showing procedures in a method of design for testability according to a third embodiment of the present invention. As shown in FIG. 18, SC1 is the step of selecting FFs to replace with scan FFs in order that a target integrated circuit has an n-fold line-up structure, and is similar to the step SB1 of the second embodiment. In other words, with recognizing L/H FF as FF not having a self-loop structure, FFs to replace with scan FFs are selected such that a target circuit has an n-fold line-up structure. L/H FFs, not selected as FFs to replace with scan FFs at step SC1, are called here "pure L/H FFs".

SC2 is the step of determining whether each step SC3 and SC4 is-performed for all pure L/H FFs. When steps SC3 and SC4 are finished for all the pure L/H FFs, processing is finished. SC3 is the step of selecting one of untreated pure L/H FFs. SC4 is the step of selecting, as a FF to replace with a scan FF, a FF reachable from the load/hold selection input of the pure L/H FF selected at step SC3 by passing merely through combinational circuits.

The method of design for testability of this embodiment shown in FIG. 18 will be described with reference to FIG. 19.

Figure 19A:
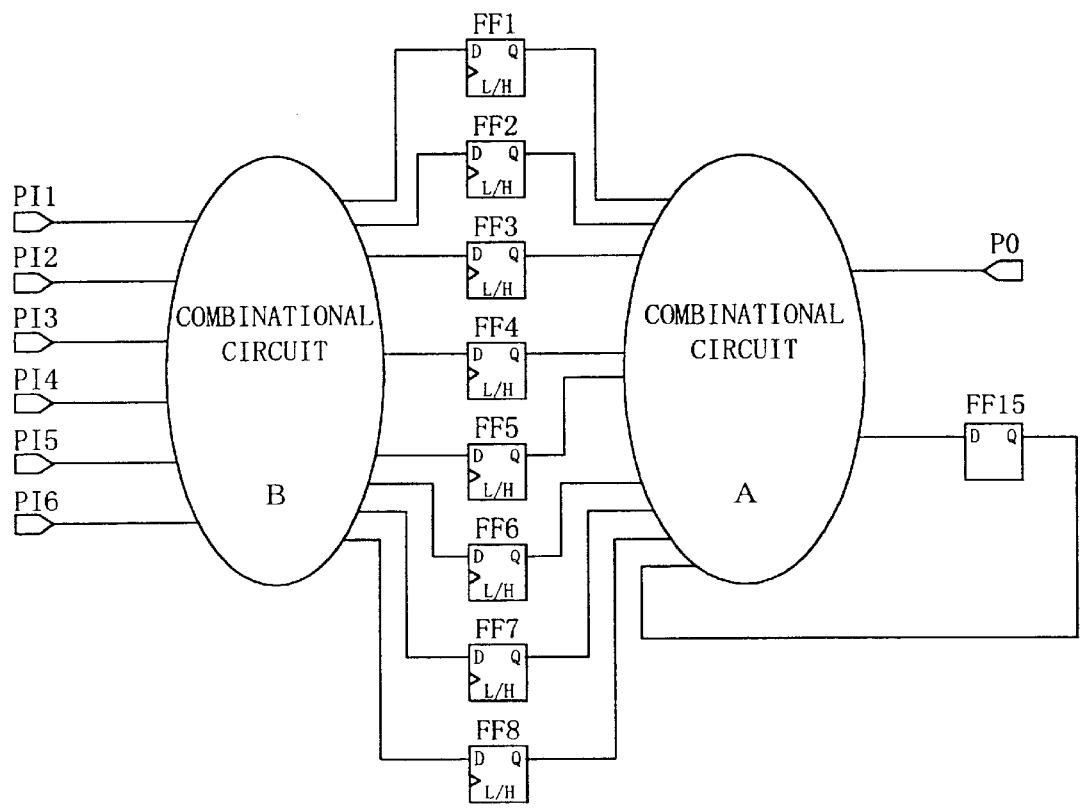
FIGS. 19(a) and (b) are illustrations of sequential circuits which become an object of the method of design for testability of the third embodiment.
Figure 19B:
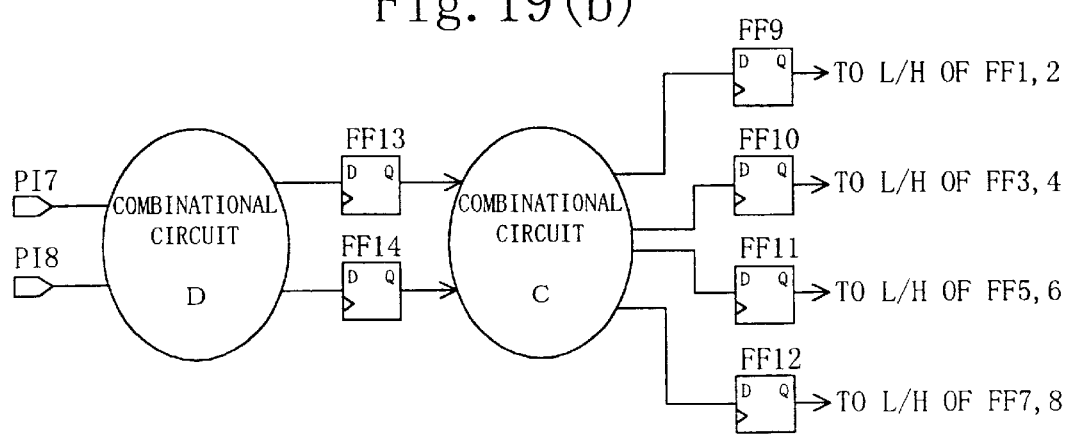

FIG. 19 is a diagram showing a sequential circuit as an object of the present method of design for testability. FF1–FF8 are L/H FFs. FF9–FF15 are normal FFs (non-L/H FFS). A–D are combinational circuits. PI1–PI8 are primary inputs. PO is a primary output. The combinational circuit C is a 1-hot decoder of which only one output provides a different value from the other outputs.

First, at step SC1, FFs to replace with scan FFs are selected in order that the circuit of FIG. 19 has an n-fold line-up structure. Here, n is equal to 1, that is, FFs to replace with scan FFs are selected such that the circuit of FIG. 19 has a 1-fold line-up structure circuit. At this time, L/H FFs 1–8 are recognized as not having a self-loop structure, which results in selecting only FF15 as a FF to replace with a scan FF.

Next, at steps SC2–SC4, FF9–FF12 are selected as FFs to replace with scan FFs because these FF9–FF12 are reachable from the load/hold selection inputs of L/H FF1–FF8 by passing merely through combinational circuits.

As a result, arbitrary setting of load/hold signals is possible through scan paths, for L/H FF1–FF8. Therefore, most of faults can be detected with load mode, which facilitates test sequence generation. Additionally, in some circuit structures, it is possible to reduce the scan rate less than selecting all L/H FFs as FFs to replace with scan FFs by regarding them as having self-loop structure FFs.

Embodiment 4

A fourth embodiment of the invention is the method of obtaining a load mode ratio and examining the validity of the method of design for testability of the third embodiment by the load mode ratio. The load mode ratio expresses the ratio of L/H FFs which have been state justified with load mode to all the L/H FFs.

Figure 20:
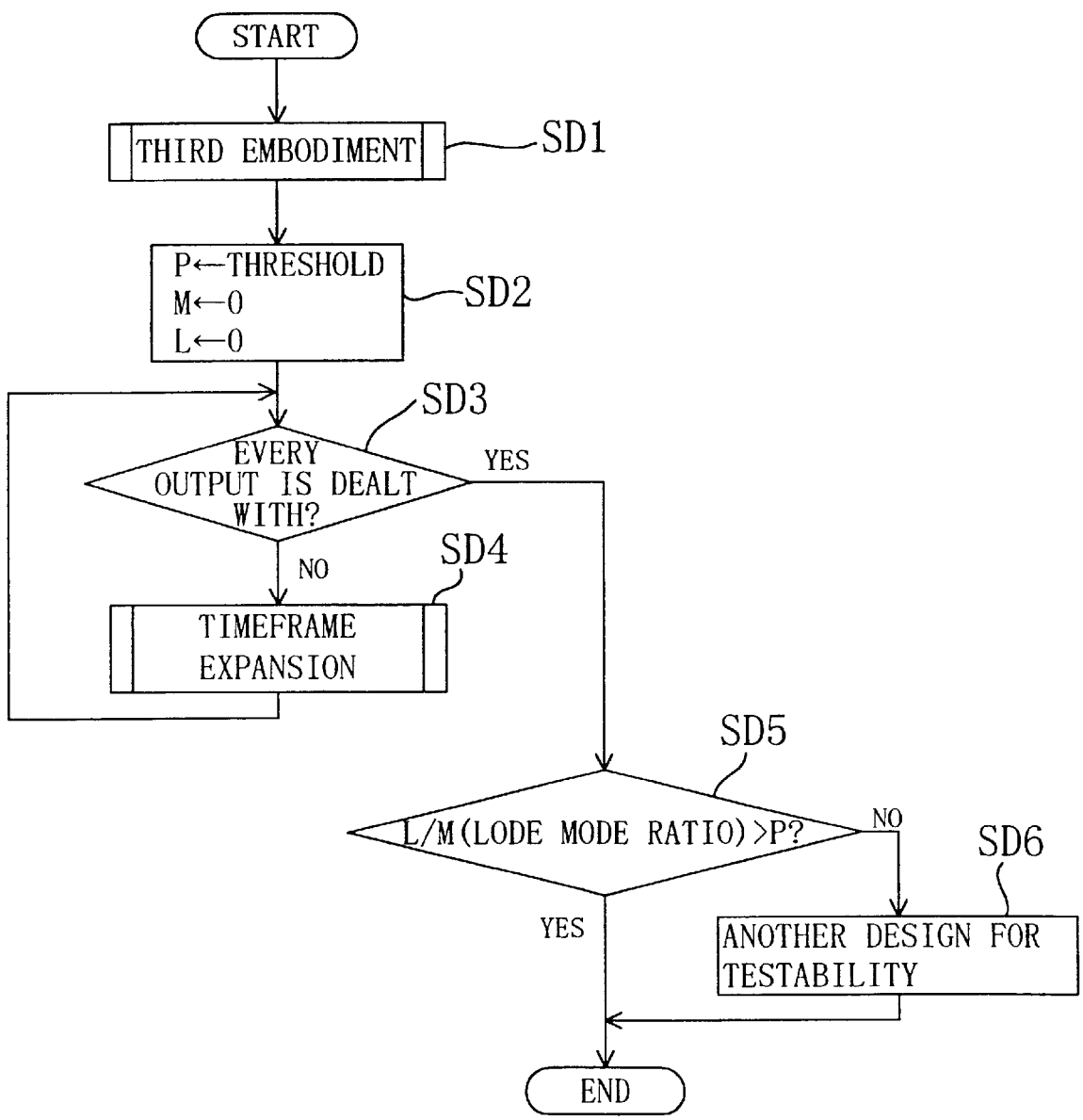
FIG. 20 is a flowchart showing procedures in a method of design for testability according to a fourth embodiment of the present invention.

FIG. 20 is a flowchart showing procedures in a method of design for testability according to the fourth embodiment.

SD1 is the step of selecting FFs to replace with scan FFs using the method of design for testability of the third embodiment. SD2 is the step of setting a load mode ratio threshold P and initializing values M and L used for obtaining load mode ratio. At steps SD3 and SD4, timeframe expansion is performed based on the state justification of L/H FFs, with respect to each primary output and each pseudo-primary output and the values M and L are computed, wherein the value M is the total number of L/H FFs in the expanded timeframe and the value L is the total number of L/H FFs that are state justified with load mode. Step SD5 is the step of determining whether the load mode rate (i.e., L/M) is greater than the threshold P. If L/M is greater than P, the design for testability of step SD 1 is determined to be valid, and the result thereof is used, while if not, the design for testability of step SD 1 is determined to be invalid, and at step SD6 another design for testability, e.g., according to the second embodiment based on the L/H FF state justification is performed.

Figure 21:
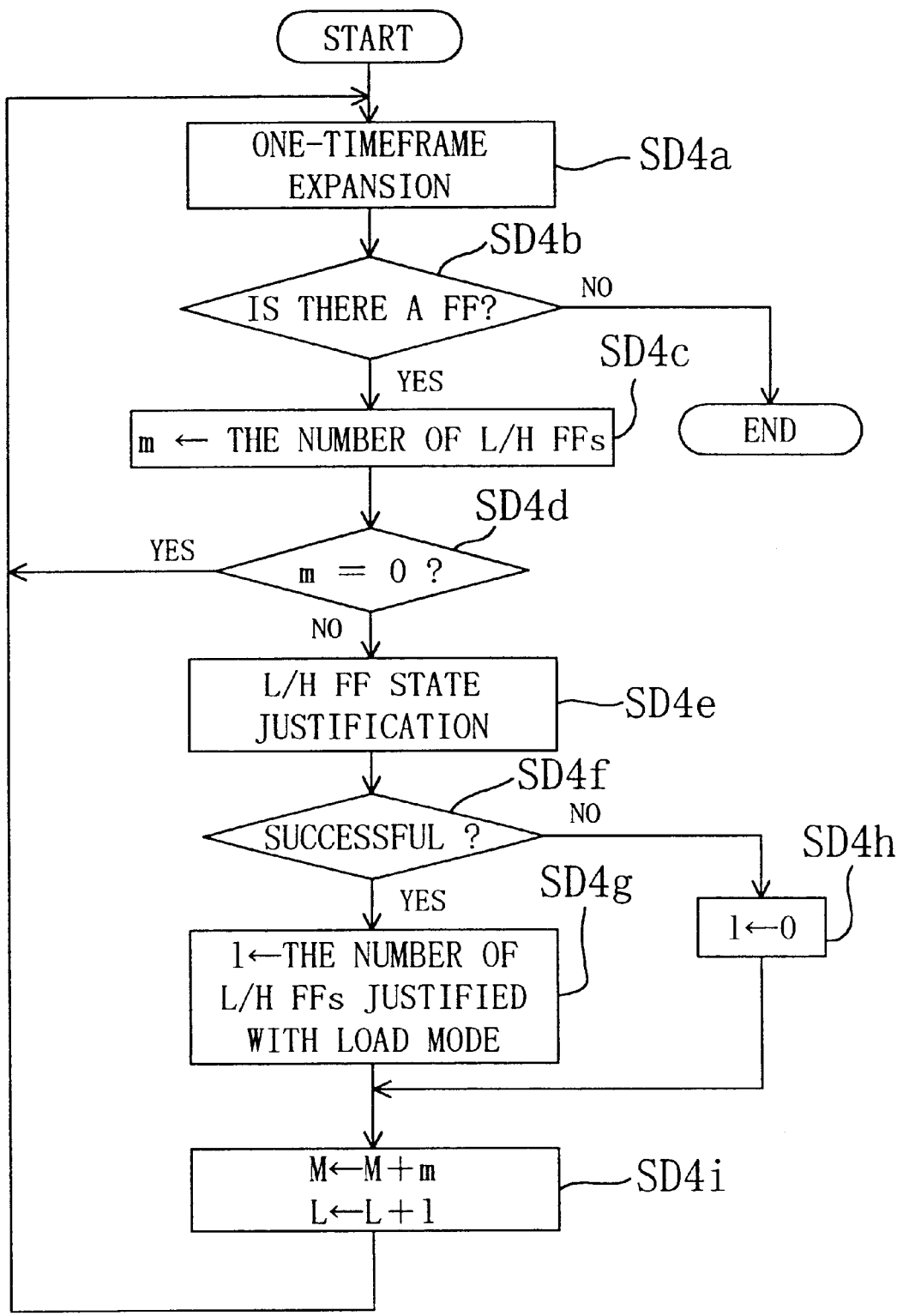
FIG. 21 is a flowchart showing the details of step SD4 of FIG. 20.

FIG. 21 is a flowchart showing the details of step SD4 of the method of design for testability shown in FIG. 20. SD4$a$ is the step of performing a one-timeframe expansion, with respect to the primary output selected at step SD3 or the input of a FF of the previous timeframe. For L/H FF, when it is state justified with load mode, expansion is performed with respect to the load mode input and select input of it, while state justified with hold mode, expansion is performed with respect to the hold mode input and select input of it. If step SD4$b$ shows that there exist FFs in the current timeframe, then the procedure moves to step SD4$c$, while if not, step SD4 is finished.

At step SD4$c$ the number of L/H FFs in the current timeframe is set as m, then the procedure returns to SD4$a$ when m is equal to zero (step SD4$d$). At step SD4$e$, all the L/H FFs in the current timeframe are state justified. When such state justification is successful, the number of L/H FFs state justified with load mode, is set as 1 at step SD4$g$, while when unsuccessful, 0 is set as 1 at step SD4$h$. At step SD4$i$, m is added to M and 1 is added to L.

Figure 22A:
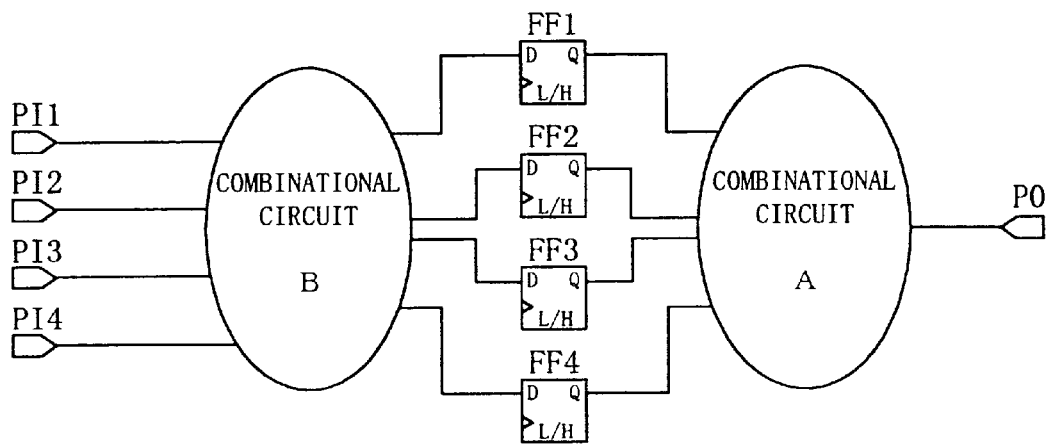
FIGS. 22(a) and (b) are illustrations of sequential circuits which become an object of the method of design for testability of the fourth embodiment.
Figure 22B:
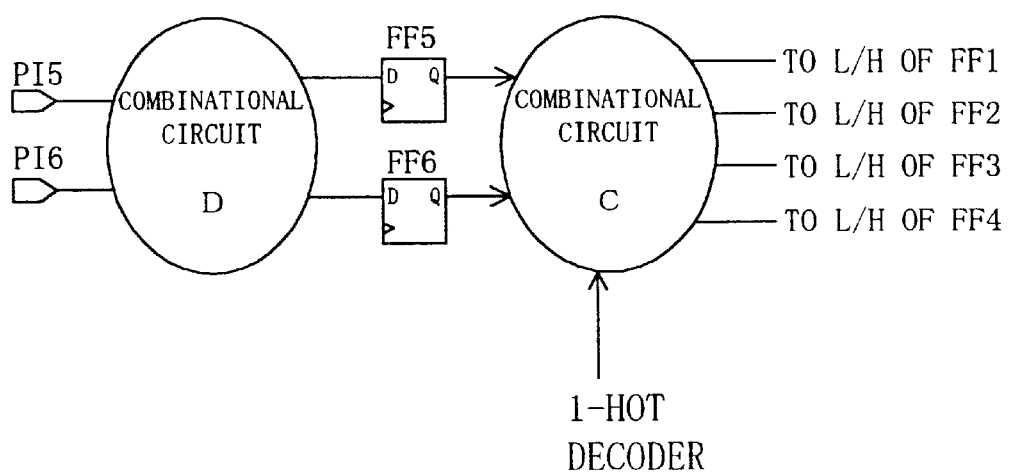

Load mode rate computation is now described based on the circuits shown in FIGS. 19 and 22. Note that the load mode rate threshold P is 80%.

For the circuit of FIG. 19, step SD1 selects FF9–FF12 and FF15 as FFs to replace with scan FFs, similarly to the third embodiment. All the L/H FFs that appear in the timeframe with respect to the primary output PO, i.e., FF1–FF8, can be state justified with load mode because FF9–FF12 are FFs to replace with scan FFs. Furthermore, all the L/H FFs that appear in the timeframe with respect to the pseudo-primary output PPO15 (the input of FF15 selected as a FF to replace with a scan FF), i.e., FF1–FF8 can be state justified with load mode because FF9–FF12 are FFs to replace with scan FFs. Accordingly, the load mode ratio in this case is 100% from L/M=16/16. In other words, since the load mode ratio is greater than the threshold P, the result of the step SD1 is adopted.

In FIG. 22, FF1–FF4 are L/H FFs. FF5 and FF6 are normal FFs (non-L/H FFs). A-D are combinational circuits. PI1–PI6 are primary inputs. PO is a primary output. Note that the combinational circuit C represents a 1-hot decoder.

For the circuit of FIG. 22, step SD1 selects FF5 and FF6, which are reachable from the load/hold selection inputs of FF1–FF4 which are L/H FFs by passing merely through combinational circuits as FFs to replace with scan FFs. Timeframe expansion is performed with respect to the primary output PO, and state justification is performed for L/H FFs in the expanded timeframe, i.e., FF1–FF4. Since the combinational circuit C is a 1-hot decoder, for example, FF1 is state justified with load mode while the other FFs (FF2–FF4) are state justified with hold mode. In this case, the load mode rate is 25% from L/M=1/4. In other words, since the load mode rate is less than the threshold P, the result of step SD1 is not adopted, Instead, another design for testability, for example, a design for testability based on the L/H FF state justification of the second embodiment, is performed at step SD6.

Embodiment 5

In accordance with a fifth embodiment of the invention, a pre-step is performed on a target circuit before the method of design for testability of the second or third embodiment. Specifically, a pre-step is performed to recognize a FF having a self-loop structure other than L/H FF and capable of being state justified without assignment of values to its own output, as an extended pure L/H FF. Then, the method of design for testability of the second or third embodiment is performed in assuming such an extended pure L/H FF as L/H FF. As a result of such arrangement, it becomes possible to reduce the scan rate for the circuit including great numbers of FFs having a self-loop structure other than the L/H FFs.

A method of recognizing extended pure L/H FF will be described.

Figure 23A:
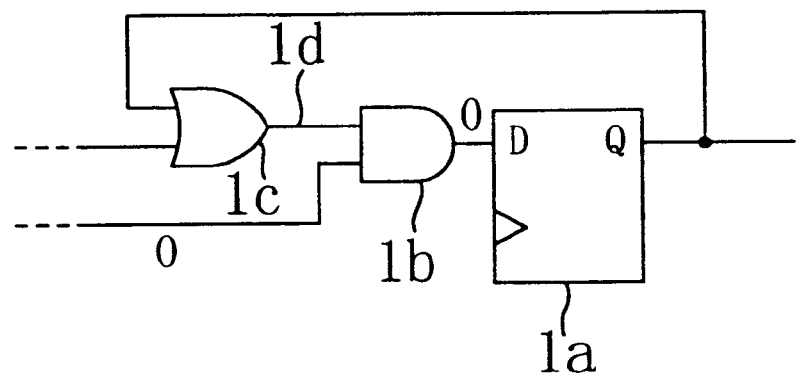
FIGS. 23(a) and (b) show FFs having a self-loop structure and is a diagram showing a method of how expanded pure L/H FFs are identified.
Figure 23B:
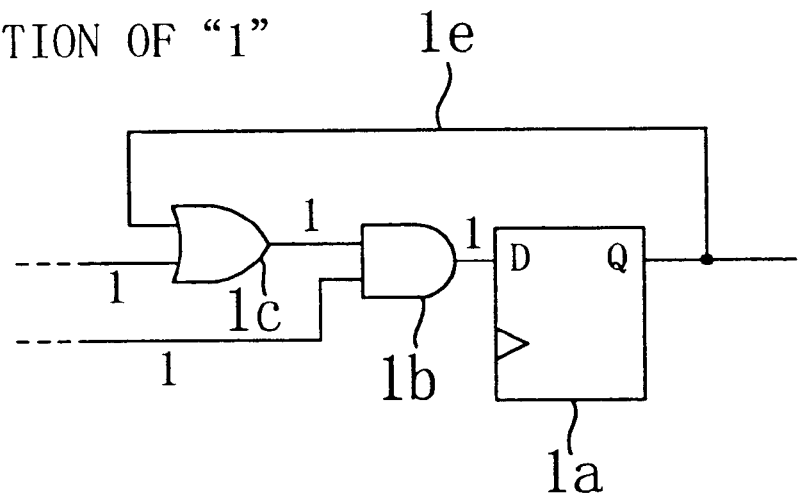
Figure 24A:
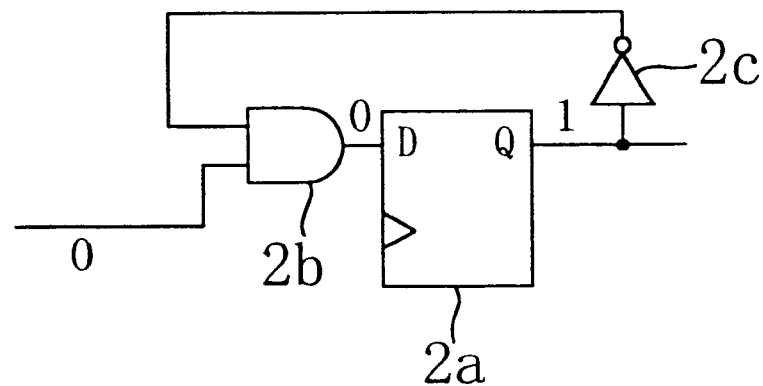
FIGS. 24(a) and (b) show FFs having a self-loop structure and is a diagram showing a method of how expanded pure L/H FFs are identified.
Figure 24B:
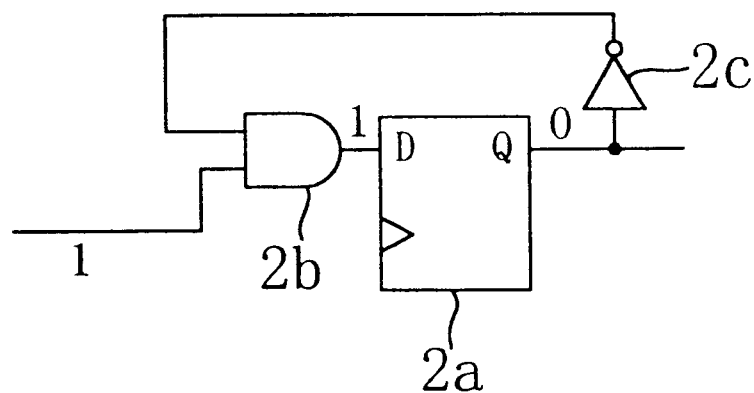

FIGS. 23 and 24 show FFs having a self-loop structure, and are used for explaining how extended pure L/H FFs are recognized.

In FIG. 23($a$), the setting of "0" at an input not forming a loop, of AND gate 1$b$ is sufficient to justify logical value "0" at D input of FF1$a$. Also, referring to FIG. 23($b$), the setting of "1" at inputs not forming a loop, of AND gate 1$b$ and OR gate 1$c$ is sufficient to justify logical value "1" at D input of FF1$a$. In other words, FF1$a$ can be state justified, with its Q output not assigned a value. In such a case, FF1$a$ is recognized as an extended pure L/H FF.

In FIG. 24($a$), the setting of "0" at an input not forming a loop, of AND gate 2$b$ is sufficient to justify logical value "0" at D input of FF2$a$. While referring to FIG. 24($b$), to justify logical value "1" at D input of FF2$a$, not only an input not forming a loop of AND gate 2$b$ but also an output of NOT gate 2$c$ are required to be set at "1", hence, it becomes necessary to assign "0" to Q output of FF2$a$. In such a case, FF2$a$ is not recognized as an extended pure L/H FF.

A hold signal line is defined for FF recognized as an extended pure L/H FF. After logical value "0" state justification, the first signal line at which the logical value is not set in search from D input via loop is defined as a 0 hold signal line. Also, after logical value "1" state justification, the first signal line at which the logical value is not ste in search from D input via loop is defined as a 1 hold signal line. Thereafter, the 0 hold signal line or the 1 hold signal line, whichever is farther away from D input, is defined as a hold signal line for the extended pure L/H FF. For instance, in the case of FIG. 23, the 0 hold signal line is a signal line 1$d$ connecting output of OR gate 1$c$ and input of AND gate 1$b$ and the 1 hold signal line is a signal line 1$e$ connecting Q output of FF1$a$ and input of OR gate 1$c$. The 0 hold signal line 1$d$ or the 1 hold signal line 1$e$, whichever is farther away from D input, i.e., the 1 hold signal line 1$e$, is defined as a hold signal line for the extended pure L/H FF1$a$.

Figure 25A:
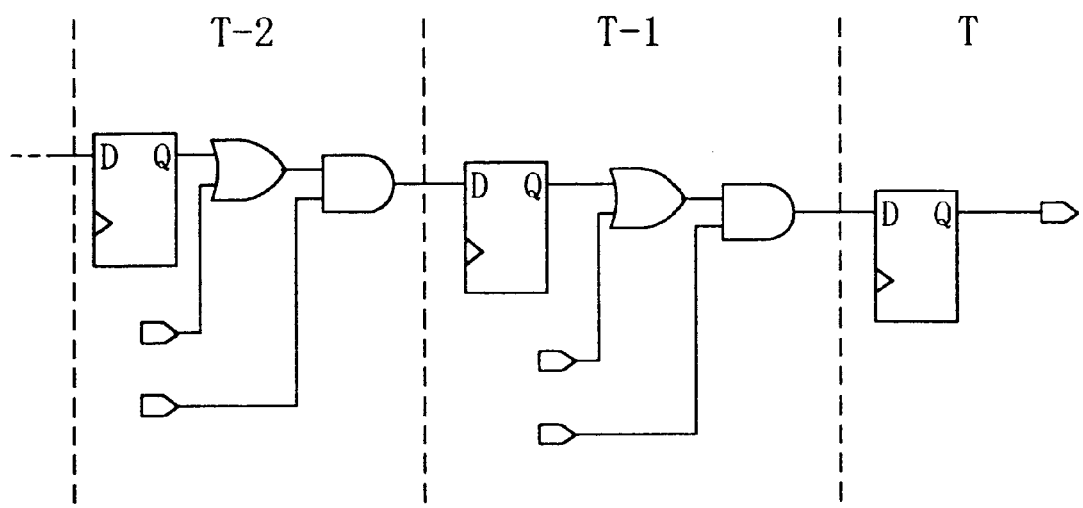
Figure 25B:
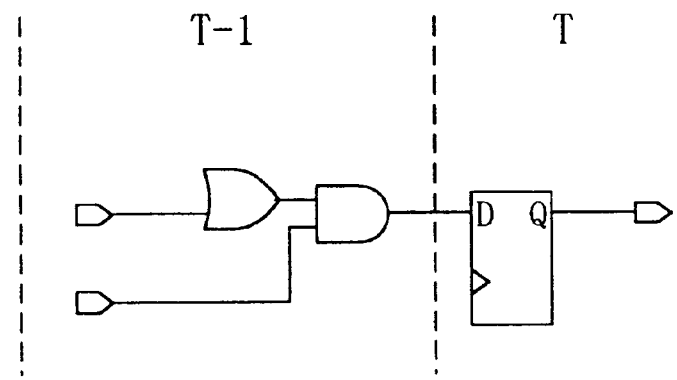
FIG. 25(b) is an illustration of a timeframe expansion making utilization of a hold signal line.

The object of defining a hold signal line is to have timeframe expansion result in a finite number of timeframes. FIG. 25 shows a timeframe expansion of the circuit shown in FIG. 23. Whereas FIG. 25($a$) shows a normal timeframe expansion, FIG. 25($b$) shows a timeframe expansion using a hold signal line. In the normal timeframes expansion shown in FIG. 25(a), timeframes are infinitely expanded for the circuit having a loop. Accordingly, in order to achieve a finite number of timeframes, FFs having self-loop structures are required to be selected as FF to replace with scan FF. On the other hand, in the timeframe expansion using a hold signal line shown in FIG. 25(b), when an extended pure L/H FF is state justified with load mode, such a FF per se disappeared in a subsequent timeframe by performing no hold signal line expansion. This achieves a definite number of timeframes, which makes it possible to select FFs to replace with scan FFs.

Figure 26:
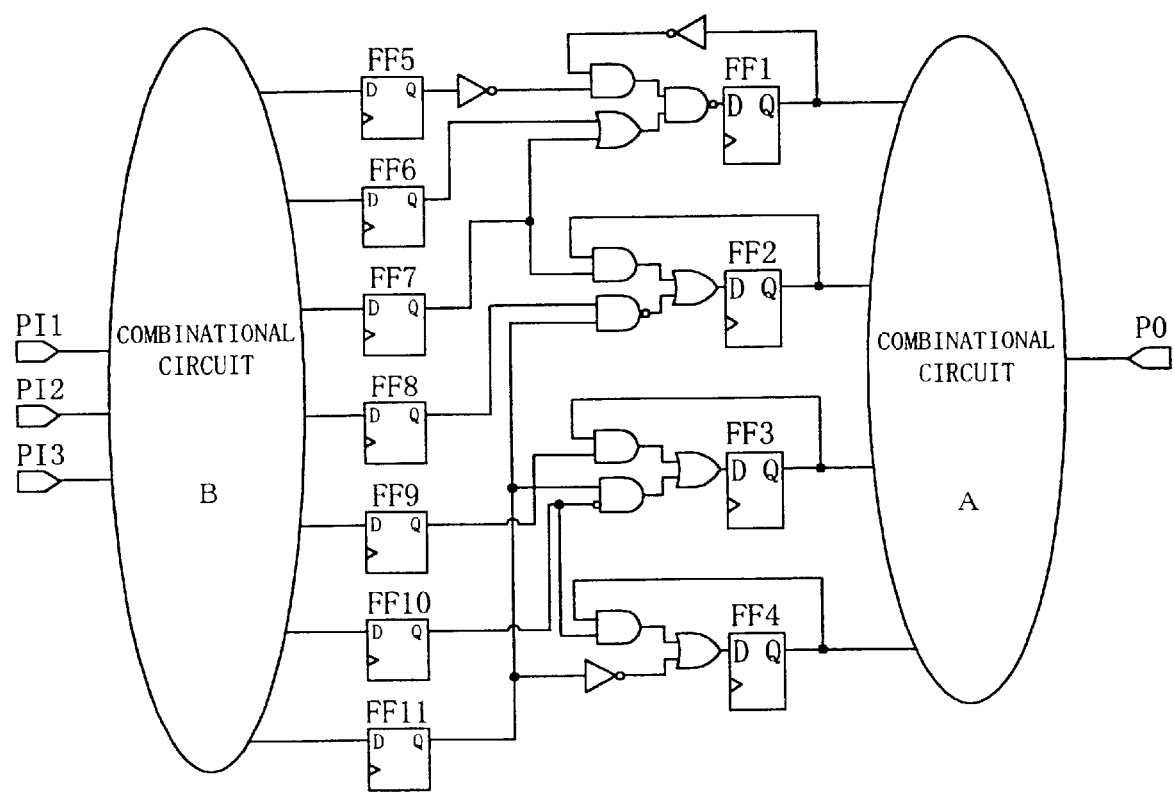
FIG. 26 is an illustration of a sequential circuit which becomes an object of the method of design for testability of the fourth embodiment.

FIG. 26 is a diagram showing a sequential circuit which is an object of the present method of design for testability. FF1–FF4 are FFs having self-loop structures. FF5–FF11 are FFs not having self-loop structures. PI1–PI3 are primary inputs. PO is a primary output. A and B are combinational circuits.

In the first place, for the FIG. 26 sequential circuit, the pre-step is performed to determine whether each FF1–FF4 having a self-loop structure is an extended pure L/H FF or not.

Figure 27A:
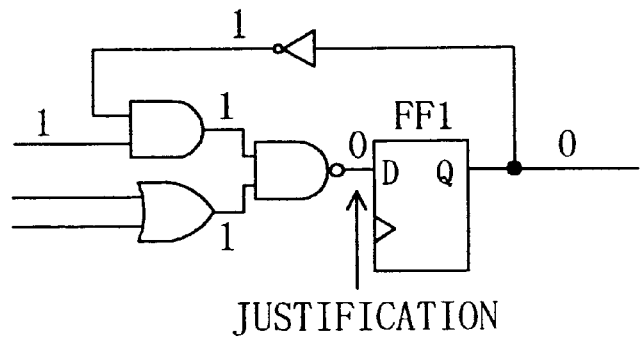
FIGS. 27(a)–(c) are diagrams each giving an indication of whether each FF1 and FF2 is an expanded pure L/H FF with reference to the circuit of FIG. 26.
Figure 27B:
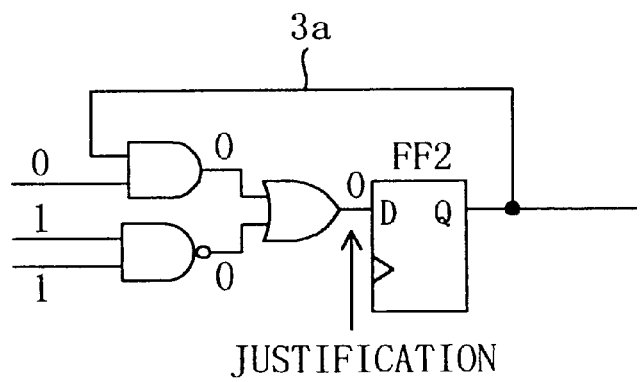
Figure 27C:
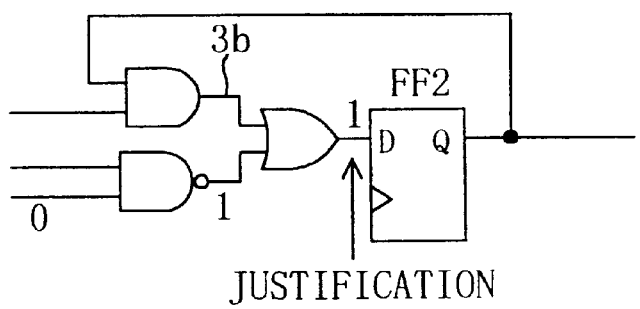

As shown in FIG. 27(a), FF1 is not recognized as an extended pure L/H FF, because "0" must be assigned to the Q input in "0" state justification at the D input. Also, as shown in FIGS. 27(b) and (c), FF2 is recognized as an extended pure L/H FF, because any value need not be assigned to the Q output, in not only "0" state justification but also "1" state justification at the D input. A 0 hold signal line 3a that is farther away from the D input, is defined as a hold signal line for FF2.

Figure 28A:
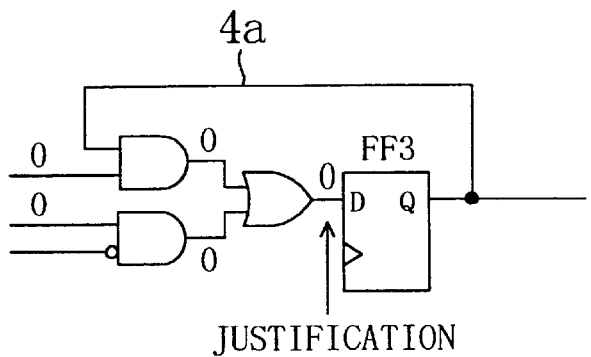
FIGS. 28(a)–(d) are diagrams each giving an indication of whether each FF3 and FF4 is an expanded pure L/H FF with reference to the circuit of FIG. 26.
Figure 28B:
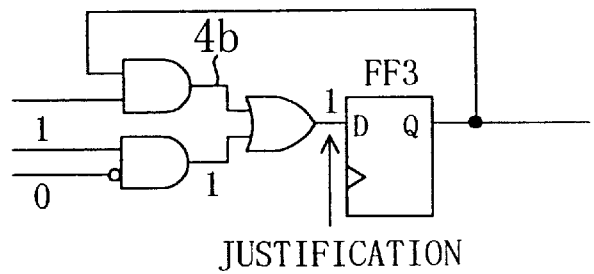
Figure 28C:
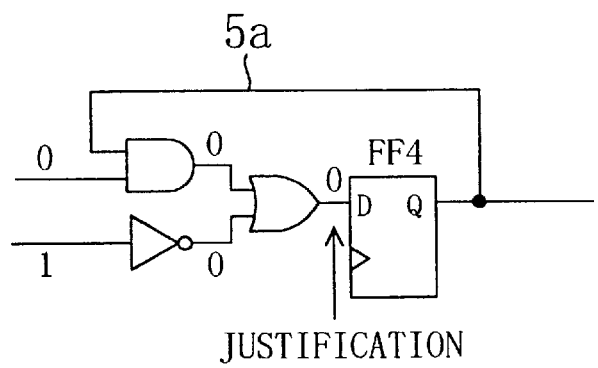
Figure 28D:
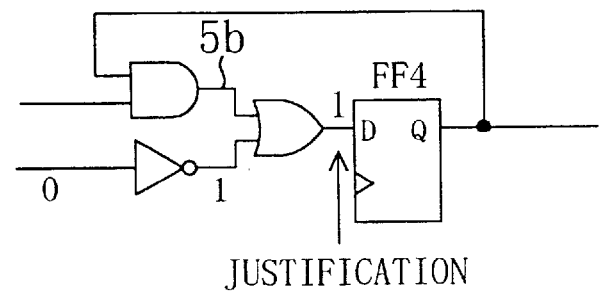

As shown in FIGS. 28(a) and (b), FF3 is recognized as an extended pure L/H FF, because any value need not be assigned to the Q output, in not only "0" state justification but also "1" state justification at the D input. A 0 hold signal line 4a that is farther away from the D input, is defined as a hold signal line for FF3. As shown in FIGS. 28(c) and (d), FF4 is recognized as an extended pure L/H FF, because any value need not be assigned to the Q output, in not only "0" state justification but also "1" state justification at the D input. A 0 hold signal line 5a that is farther away from the D input, is defined as a hold signal line for FF4.

Next, the method of design for testability of the second embodiment shown in FIG. 8 is performed for the circuit of FIG. 26. Here, at step SB1 is performed in assuming FF2–FF4 recognized as extended pure L/H FFs in the pre-step as FFs not having self-loop structures.

First of all, at step SB1, FFs to replace with scan FFs are selected in order that the circuit of FIG. 26 has a 1-fold line-up structure. Here, FF1 having a self-loop structure and not recognized as an extended pure L/H FF in the pre-step is selected as a FF to replace with a scan FF.

Second, step SB4 is performed with respect to the primary output PO. Here, designation timeframe number t is three.

Figure 29A:
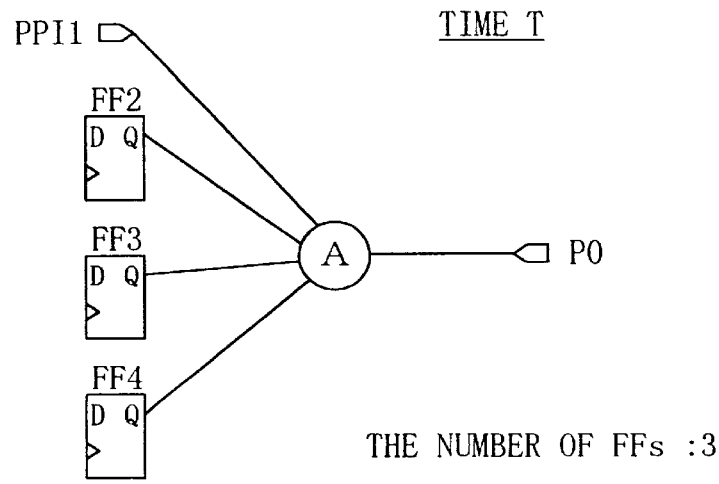
FIGS. 29(a) and (b) are diagrams showing results obtained by performing one-timeframe expansion on the primary output PO1, with respect to the circuit of FIG. 26.
Figure 29B:
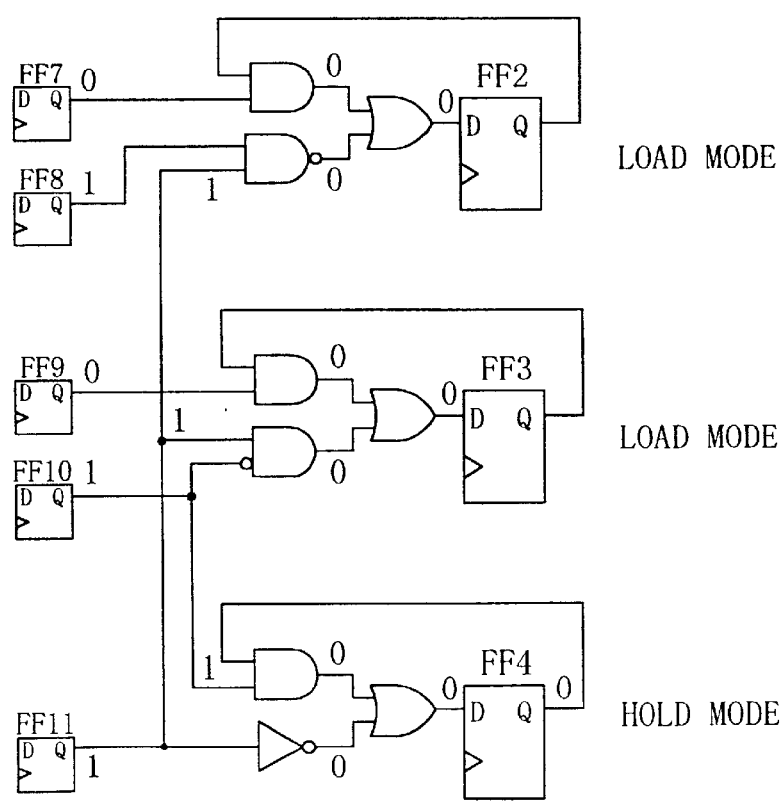

FIG. 29 shows a one-timeframe expansion (time T) with respect to the primary output PO. As shown in FIG. 29(a), the number of FFs in this timeframe is three since FF2–FF4 exist. As shown in FIG. 29(b), the "0" state justifications is performed at the D inputs of FF2–FF4 recognized as extended pure L/H FFs. It is judged that FF2 and FF3 were state justified with load mode because it is unnecessary to assign any value to their own outputs. And, it is judged that FF4 was state justified with hold mode because it is necessary to assign "0" to its own output.

Figure 30A:
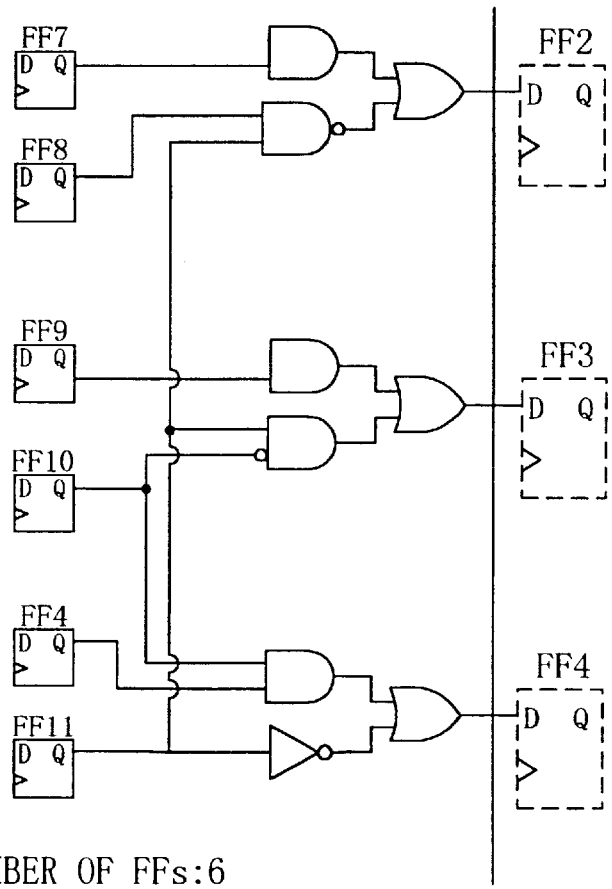
FIGS. 30(a) and (b) are diagrams showing results obtained by performing, based on the results of FIG. 29, a next one-timeframe expansion.
Figure 30B:
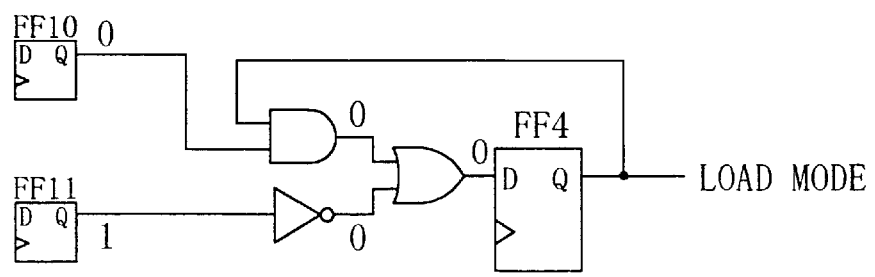

FIG. 30 shows a next one-timeframe expansion (time T–1) with respect to the primary output PO. As shown in FIG. 30(a), the number of FFs in this timeframe is six since FF4 and FF7–FF11 exist. As shown in FIG. 30(b), the "0" state justification is performed at the D input of FF4 recognized as an extended pure L/H FF. It is judged that FF4 was state justified with load mode because it is unnecessary to assign any value to its own Q output.

Figure 31:
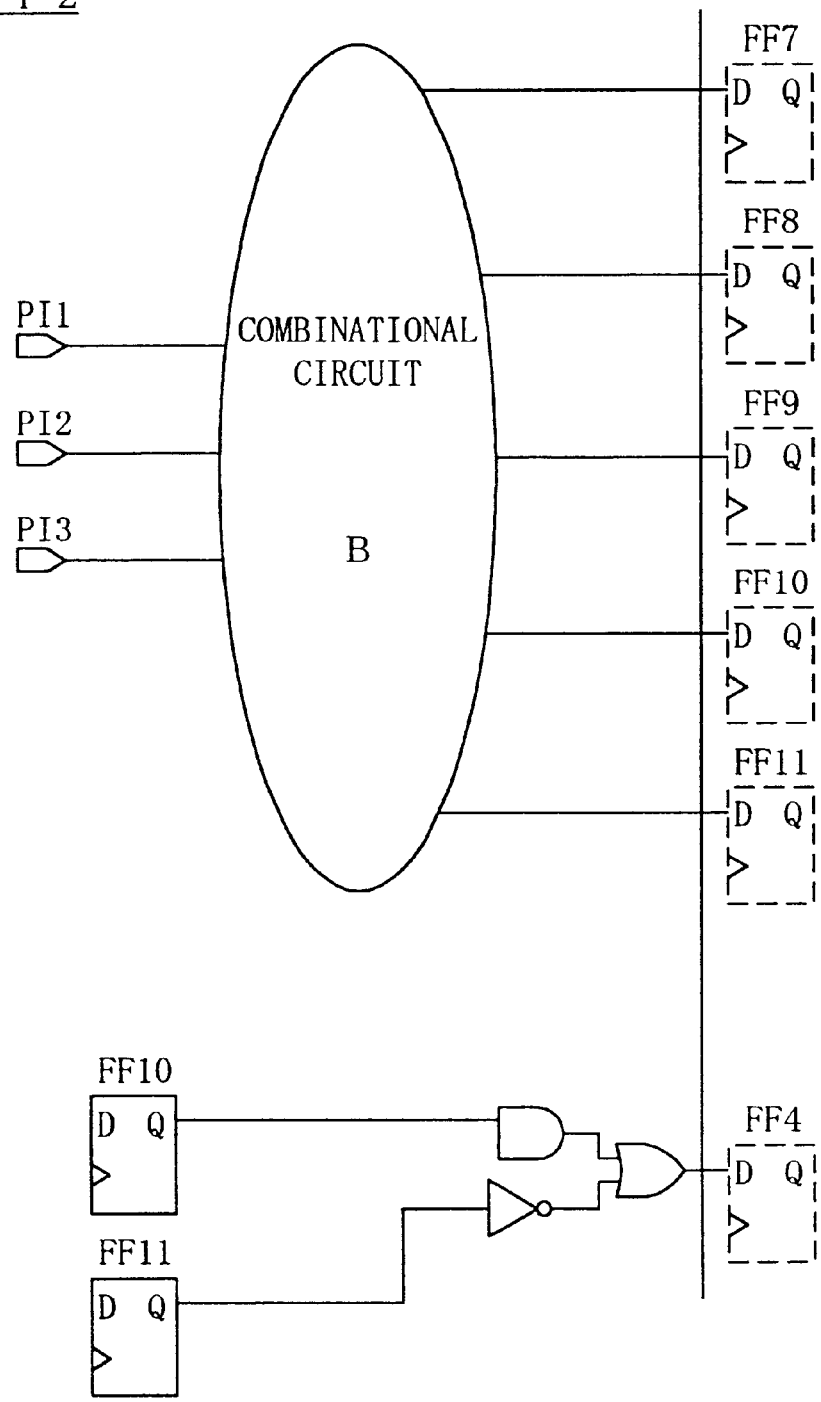
FIG. 31 is a diagram showing a result obtained by performing, based on the results of FIG. 30, another next one-timeframe expansion.

FIG. 31 shows a further next one-timeframe expansion (time T–2) with respect to the primary output PO. As shown in FIG. 31, the number of FFs in this timeframe is two since FF10 and FF11 having no self-loop structures exist. Three timeframes are expanded with respect to the primary output PO, and FF10 and FF11 existing in the timeframe of time T–2 with the minimum number of FFs are selected as FFs to replace with scan FFs.

Conventionally, all self-loop structure FFs are selected as FFs to replace with scan FFs for guaranteeing high fault efficiency. On the other hand, in accordance with the present embodiment, the method of design for testability of the second embodiment is performed, in assuming a FF having a self-loop structure but recognized as an extended pure L/H FF, as an L/H FF. This reduces the scan rate, maintaining high fault efficiency for circuits including many FFs having self-loop structures other than L/H FF. Method of design for testability for circuits in which extended pure L/H FFs are recognized is not limited to that of the second embodiment. For example, the method of design for testability of the third embodiment may be used instead of that of the second embodiment.

Embodiment 6

In a sixth embodiment of the invention, a FF relation graph is prepared as a pre-step of the method of design for testability of the first embodiment. The FF relation graph shows the interconnection relation, reachable by passing merely through combinational circuits, among FFs, primary inputs, and primary outputs in a target integrated circuit. Timeframe expansion is performed to select FFs to replace with scan FFs, based on the FF relation graph. This reduces the amount of computation for timeframe expansion very much.

Also, as a pre-step of the method of design for testability of the first embodiment, a reachable primary output and a reachable pseudo-primary output for a FF are found. And a reachable FFs that belong to paths from the FF to the reachable primary output or the reachable pseudo-primary output are found. Here, data about reachable primary outputs, reachable pseudo-primary outputs and reachable FFs for respective FFs are called as "reachable data". In examining whether or not the integrated circuit has an n-fold line-up structure in assuming a temporary scan FF as a FF to replace with a non-scan FF, timeframe expansion is performed, by referring to the reachable data, only with respect to the reachable primary output and the reachable pseudo-primary output for the temporary scan FF and a data input of temporary scan FF among reachable flip-flops for the temporary scan FF. This reduces the amount of computation for timeframe expansion very much.

Figure 32A:
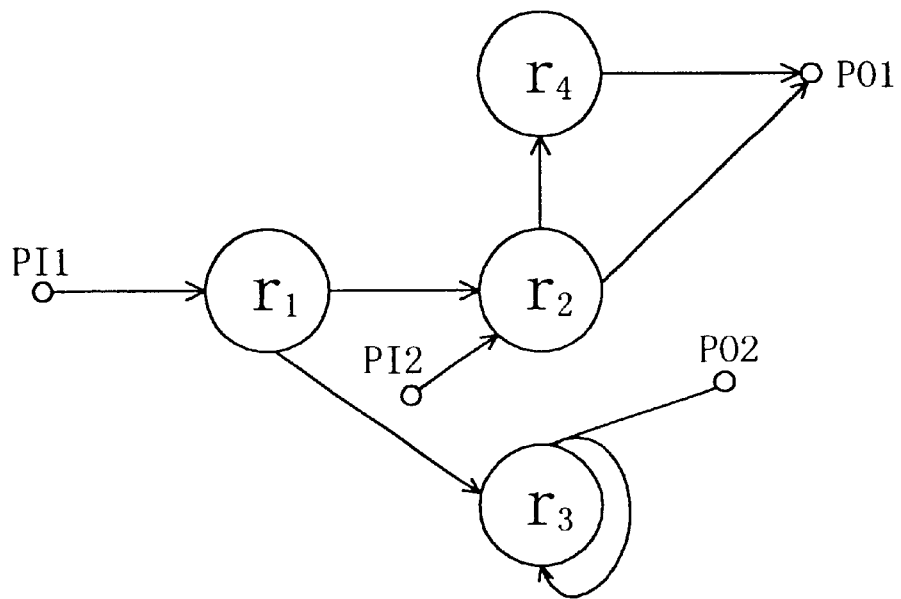
FIGS. 32(a) and (b) graphically show FF relations prepared as to the circuit of FIG. 2.

FIGS. 32(a) and (b) are FF relation graphs prepared for sequential circuit of FIG. 2. r1–r4 are FFs. PI1 and PI2 are primary inputs. PO1 and PO2 are primary outputs. The FF relation graph of FIG. 32(a) represents the sequential circuit of FIG. 2 as is. Having a self-loop structure, FF r3 is selected as a FF to replace with a scan FF. Then, as shown in FIG. 32(b), FF r3 may be deleted from the FF relation graph, and a pseudo-primary output PPO3 replaces the input of FF r3, and a pseudo-primary input PPI3 replaces the output of FF r3.

Figure 32B:
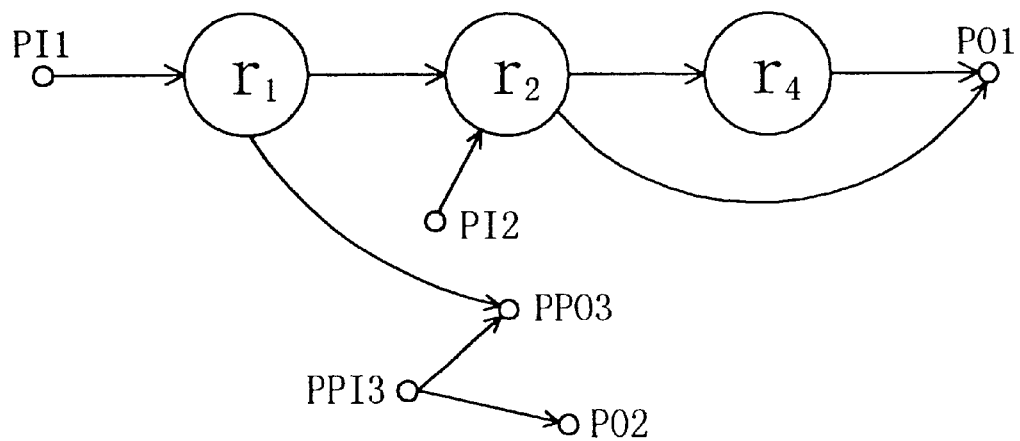
Figure 33:
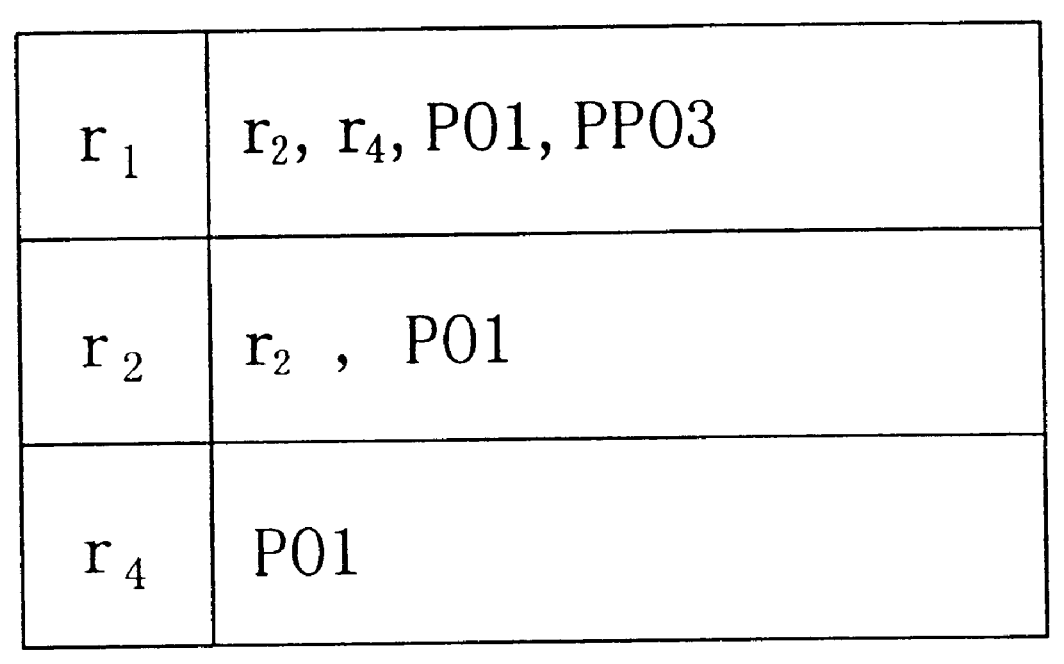
Figure 34A:
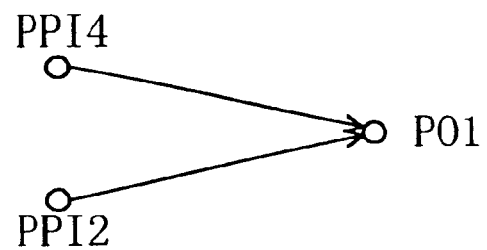
FIGS. 34(a)–(d) show timeframe expansions when FF r1 is selected as a FF to replace with a non-scan FF, with reference to the FF of FIG. 32(b).
Figure 34B:
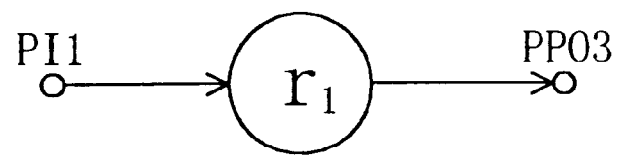
Figure 34C:
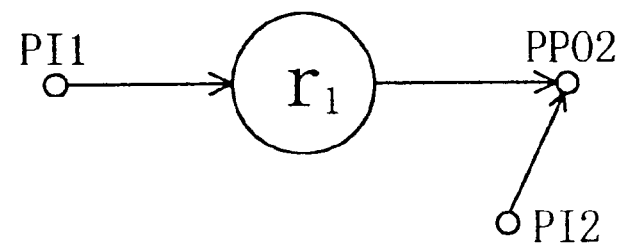
Figure 34D:
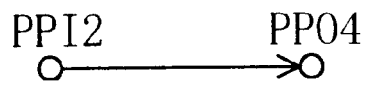

FIG. 33 shows reachable data prepared based on the FF relation graph of FIG. 32(b). The reachable data of FIG. 33 shows that for FF r1, PO1 is a reachable primary output, PPO3 a reachable pseudo-primary output, and FF r2, r4 reachable FFs.

Based on the FF relation graph of FIG. 32(b) and the reachable data of FIG. 33, the method of design for testability of the first embodiment shown in FIG. 1 is performed. Here, step SA7 examines whether the circuit has a 1-fold line-up structure.

At step SA1, all the FFs in the FF relation graph of FIG. 32(b), i.e., FF r1, r2, and r4, are temporarily selected as FFs to replace with scan FFs. FFs ri selected as FFs to replace with scan FFs are assumed as a pseudo-primary output PPOi and a pseudo-primary input PPIi.

FIG. 34 shows a timeframe expansion in selecting FF r1 as a FF to replace with a non-scan FF. The reachable data of FIG. 33 shows that PO1 is the only reachable primary output and PPO3 is the only reachable pseudo-primary output for FF r1. As shown in FIGS. 34(a), (b), timeframe expansion is performed with respect to PO1 and PPO3, respectively. Additionally, the reachable data of FIG. 33 shows that FF r2, r4 are reachable FFs for FF r1, and FF r1, r2 are temporary scan FFs. As shown in FIG. 34(c), (d), timeframe expansion is performed with respect to the data inputs of FF r2, r4, i.e., the pseudo-primary outputs PPO2 and PPO4, respectively. No timeframe expansion is performed with respect to primary outputs or pseudo-primary outputs other than PO1, PPO2, PPO3, and PPO4. Two or more identical FFs does not appear in each expanded timeframe, which means that this circuit has a 1-fold line-up structure. Accordingly, FF r1 is temporarily selected as a FF to replace with a non-scan FF.

Figure 35A:
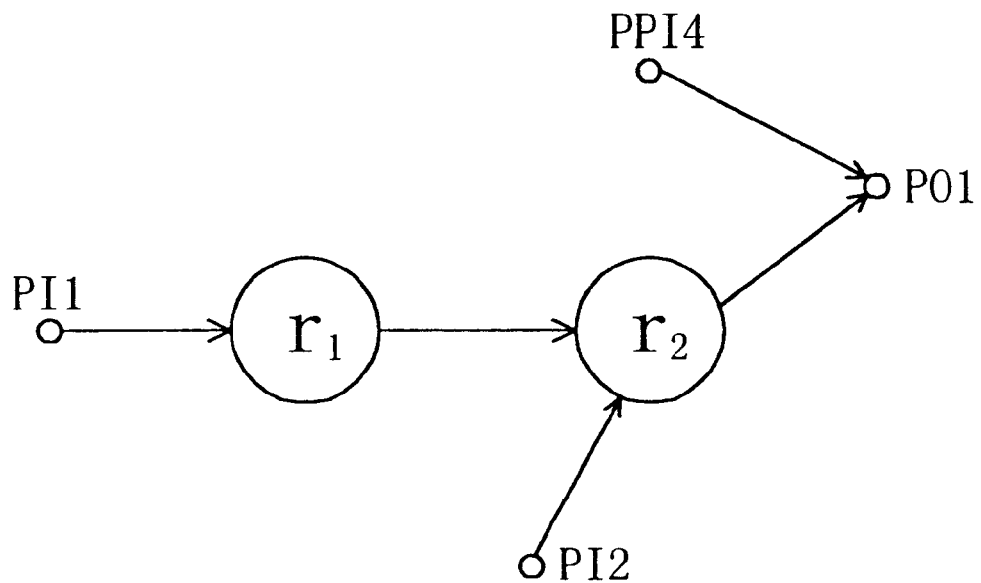
FIGS. 35(a) and (b) show timeframe expansions when FF r2 is selected as a FF to replace with a non-scan FF, with reference to the FF of FIG. 32(b).
Figure 35B:
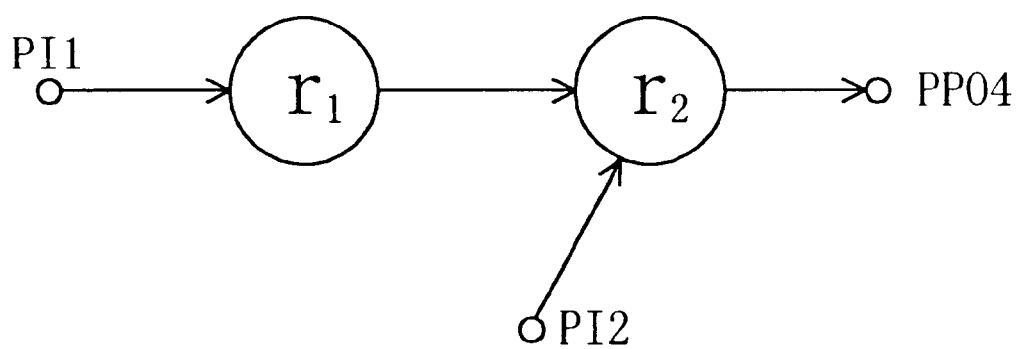

FIG. 35 shows a timeframe expansion in selecting FF r2 as a FF to replace with a no-scan FF. The reachable reachable data of FIG. 33 shows that PO1 is the only reachable primary output for FF r2. As shown in FIG. 35(a), timeframe expansion is performed with respect to PO1. Additionally, the reachable data of FIG. 33 shows that FF r4 is a reachable FF for FF r2, and FF r4 is temporary scan FF. As shown in FIG. 35(b), timeframe expansion is performed with respect to the data input of FF r4, i.e., the pseudo-primary output PPO4. No timeframe expansion is performed with respect to primary outputs or pseudo-primary outputs other than PO1 and PPO4. Two or more identical FFs does not appear in each expanded timeframe, which means that this circuit has a 1-fold line-up structure. Accordingly, a temporary determination is made that FF r2 is a FF to replace with a non-scan FF.

Figure 36:
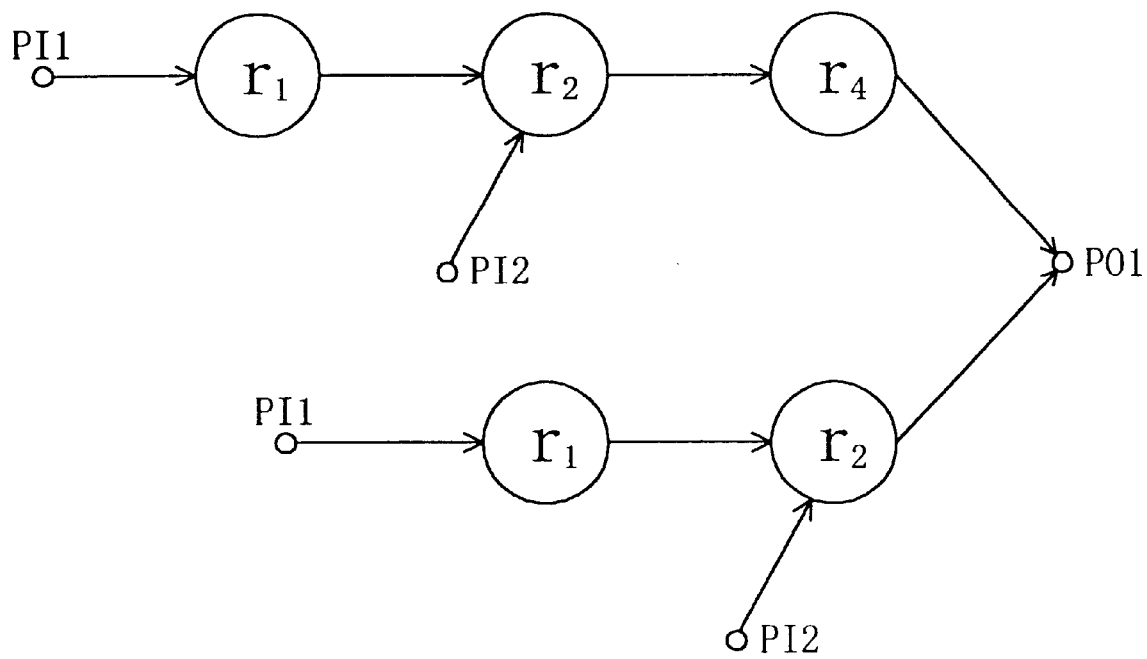
FIGS. 36 shows a timeframe expansion when FF r4 selected as a FF to replace with a non-scan FF, with reference to the FF of FIG. 32(b).

FIG. 36 shows a timeframe expansion in selecting FF r4 as a FF to replace with a non-scan FF. The reachable data of FIG. 33 shows that PO1 is the only reachable primary output for FF r4. Accordingly, timeframe expansion is performed with respect to PO1. Two FF r1s and two FF r2s appear in the expanded timeframe, which means that the circuit does not have a 1-fold line-up structure. Accordingly, FF r4 is selected as a temporary scan FF.

As a result of the above-described processing, FF r3, r4 are selected as temporary scan FFs. These FFS r3, r4 are finally selected as flip-flop to replace with scan flip flops.

In accordance with the present embodiment, timeframe expansion is performed for a FF relation graph composed of three gates, instead of a sequential circuit of nine gates. Additionally, the use of the reachable data reduces the number of timeframe expansion from ten down to seven. This reduces the amount of computation for timeframe expansion very much.

Also, for the other designs for testability, the use of the FF relation graph reduces the amount of computation very much.

Embodiment 7

A seventh embodiment of the invention is directed to a method of design for testability for a logic circuit that is an integrated circuit designed at gate level. This method is of selecting FFs to replace with scan FFs in order that in assuming data inputs and data outputs of FFs to replace with scan FFs respectively as pseudo-primary outputs and as pseudo-primary inputs, the numbers of gates may be less than or equal to n in respective paths from a primary input or pseudo-primary input to a primary output or pseudo-primary output, wherein n is zero or a natural number.

Figure 37:
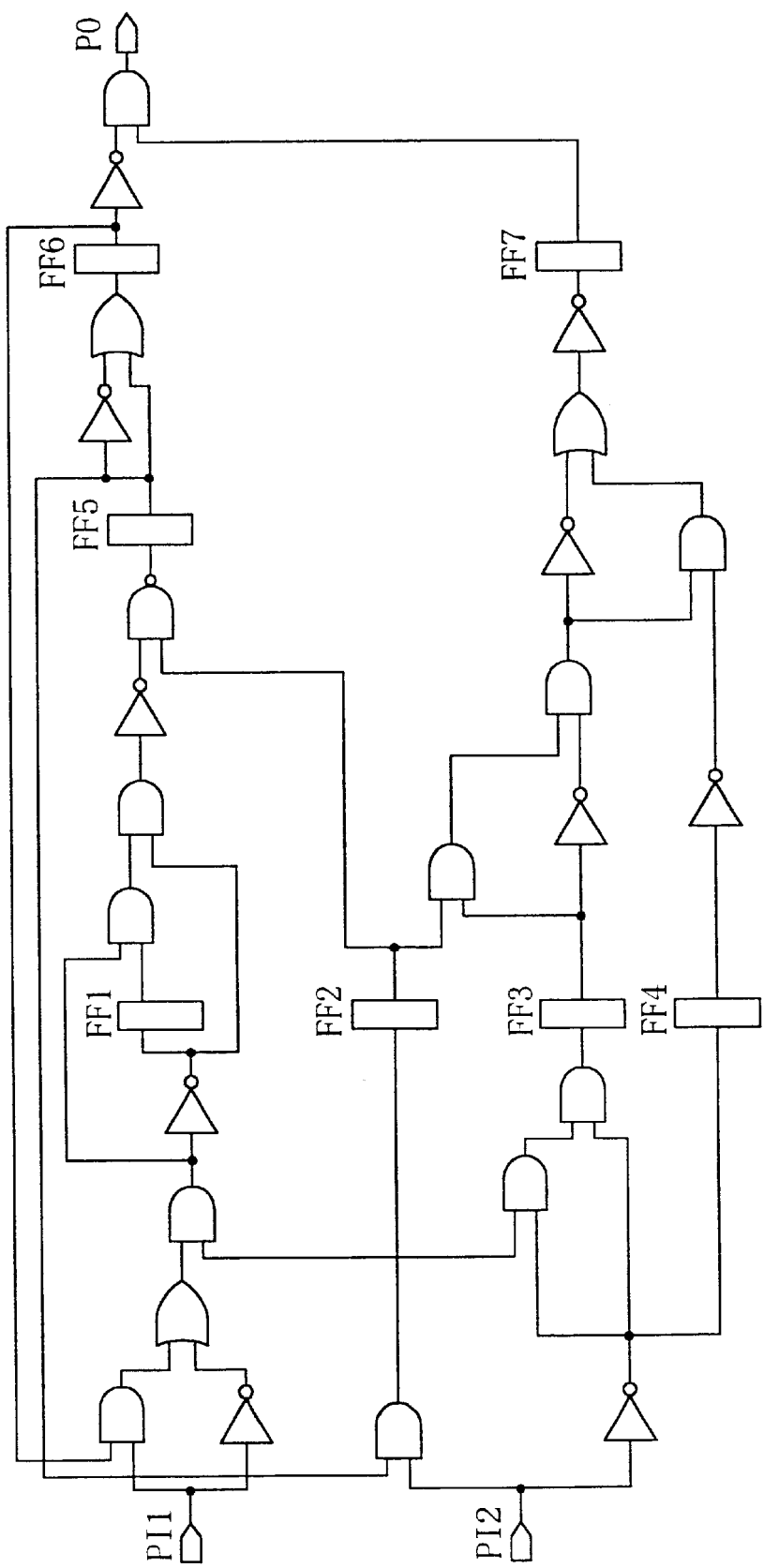
FIG. 37 is an illustration of a logic circuit which becomes an object of a method of design for testability as a seventh embodiment of the present invention.

The method of design for testability of this embodiment will be described with reference to FIG. 37. FIG. 37 shows a target logic circuit for the method of design for testability of this embodiment. FF1–FF7 are flip-flops. PI1 and PI2 are primary inputs. PO is a primary output. Here, for the circuit of FIG. 37, FFs to replace with scan FFs are selected in order that the number of gates may be less than or equal to six in respective paths from the primary input or pseudo-primary input to the primary output or pseudo-primary output.

The circuit of FIG. 37 includes two loops, namely a loop 1 of FF1→FF5→FF6→FF1 wherein the number of gates is ten and a loop 2 of FF2→FF5→FF2 wherein the number of gates is two. Here, to break the loop 1 with more gates than the loop 2, FFs to replace with scan FFs are selected.

Suppose that FF1 is selected as a FF to replace with a scan FF among the FFs forming the loop 1. The maximum number of gates (MNG) are: ten in a path from FF1 to FF1, infinite in a path from FF1 to PO, four in a path from PI1 to FF1, eight in a path from PI2 to FF1, infinite in a path from PI1 to PO, and infinite in a path from PI2 to PO. Likewise, suppose that FF5 is selected as a FF to replace with a scan FF. The MNGs are: ten in a path from FF5 to FF5, eight in a path from PI1 to FF5, four in a path from FF5 to PO, two in a path from PI2 to FF5, and nine in a path from PI2 to PO. Next, suppose that FF6 is selected as a FF to replace with a scan FF. The MNGs are: ten in a path from FF6 to FF6; ten in a path from PI1 to FF6, two in a path from FF6 to PO, infinite in a path from PI2 to FF6, infinite in a path from PI1 to PO, and infinite in a path from PI2 to PO.

Selecting FF1 or FF6 as a FF to replace with a scan FF results in leaving a path whose MNG is infinite, while selecting FF5 as a FF to replace with a scan FF results in leaving no paths whose MNGs are infinite. Accordingly, FF5 is first selected as a FF to replace with a scan FF.

When FF5 is a scan FF, the circuit of FIG. 37 has four paths whose MNGs exceed six, that is, a path of FF5→FF6→FF1→FF5 (MNG=10), a path of PI1→FF1→FF5 (MNG=8), a path of PI2→FF3→FF7→PO (MNG=9), and a path of PI2→FF2→FF7→PO (MNG=7). Here, in selecting each of FFs in these four paths as a FF to replace with a scan FF, the MNGs of these paths are found, Selecting FF6 as a FF to replace with a scan FF provides four paths whose MNGs exceed six: a path of FF6→FF1→FF5 (MNG=8), a path of PI1→FF1→FF5 (MNG=8), a path of PI2→FF3→FF7→PO (MNG=9), and a path of PI2→FF2→FF7→PO (MNG=7). Selecting FF1 as a FF to replace with a scan FF provides two paths whose MNGs exceed six: a path of PI2→FF3→FF7→PO (MNG=9) and a path of PI2→FF2→FF7→PO (MNG=7). Selecting FF3 as a FF to replace with a scan FF provides three paths whose MNGs exceed six: a path of FF5→FF6→FF1→FF5 (MNG=10), a path of PI1→FF1→FF5 (MNG=8), and a path of PI2→FF2→FF7→PO (MNG=7). Selecting FF2 as a FF to replace with a scan FF provides three paths whose MNGs exceed six: a path of FF5→FF6→FF1→FF5 (MNG=10), a path of PI1→FF1→FF5 (MNG=8), and a path of PI2→FF3→FF7→PO (MNG=9). Selecting FF7 as a FF to replace with a scan FF provides three paths whose MNGs exceed six: a path of FF5→FF6→FF1→FF5 (MNG=10), a path of PI1→FF1→FF5 (MNG=8), and a path of PI2→FF3→FF7→PO (MNG=9).

Selecting FF1 as a FF to replace with scan FF achieves the minimum number of paths whose MNGs exceed six. Accordingly, FF1 is finally selected as FF to replace with scan FF.

Additionally, selecting FF2 or FF3 as a temporary scan FF results in leaving no paths whose MNGs exceed of six. Accordingly, for example, FF2 is finally selected as FF to replace with scan FF.

Figure 38:
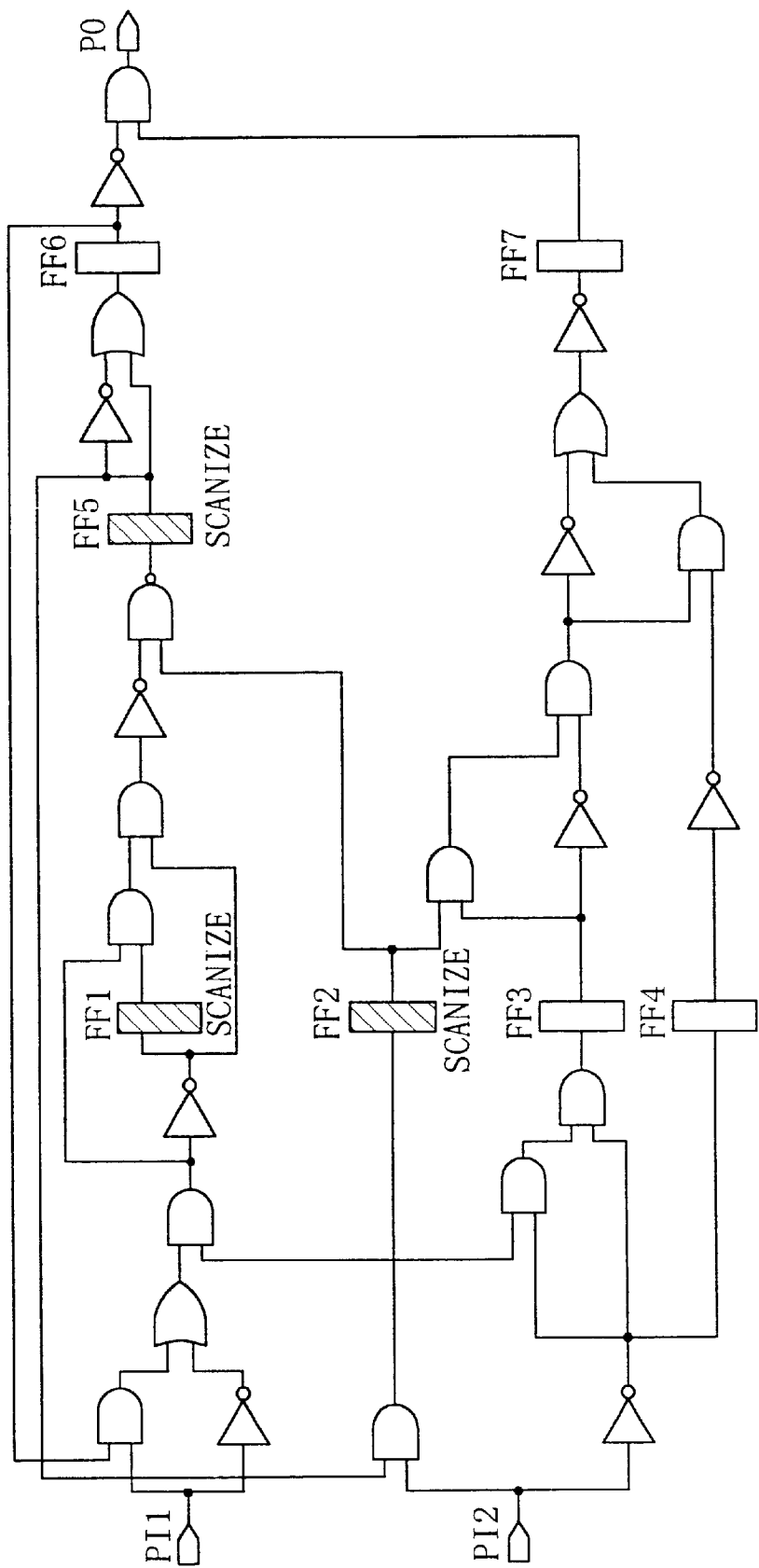
FIG. 38 is an illustration of a result of the method of design for testability of the seventh embodiment when applied to the circuit of FIG. 37.

FIG. 38 shows the result of the method of design for testability of this embodiment to the circuit of FIG. 37. As shown in FIG. 38, FF1, FF2, and FF5 are selected as FFs to replace with scan FFs. As a result, the circuit has a no-closed circuit structure and the numbers of gates are less than or equal to six in respective paths from the primary input or pseudo-primary input to the primary output or pseudo-primary output. This facilitates test input generation in the circuit after insert as scan path.

Embodiment 8

Figure 39:
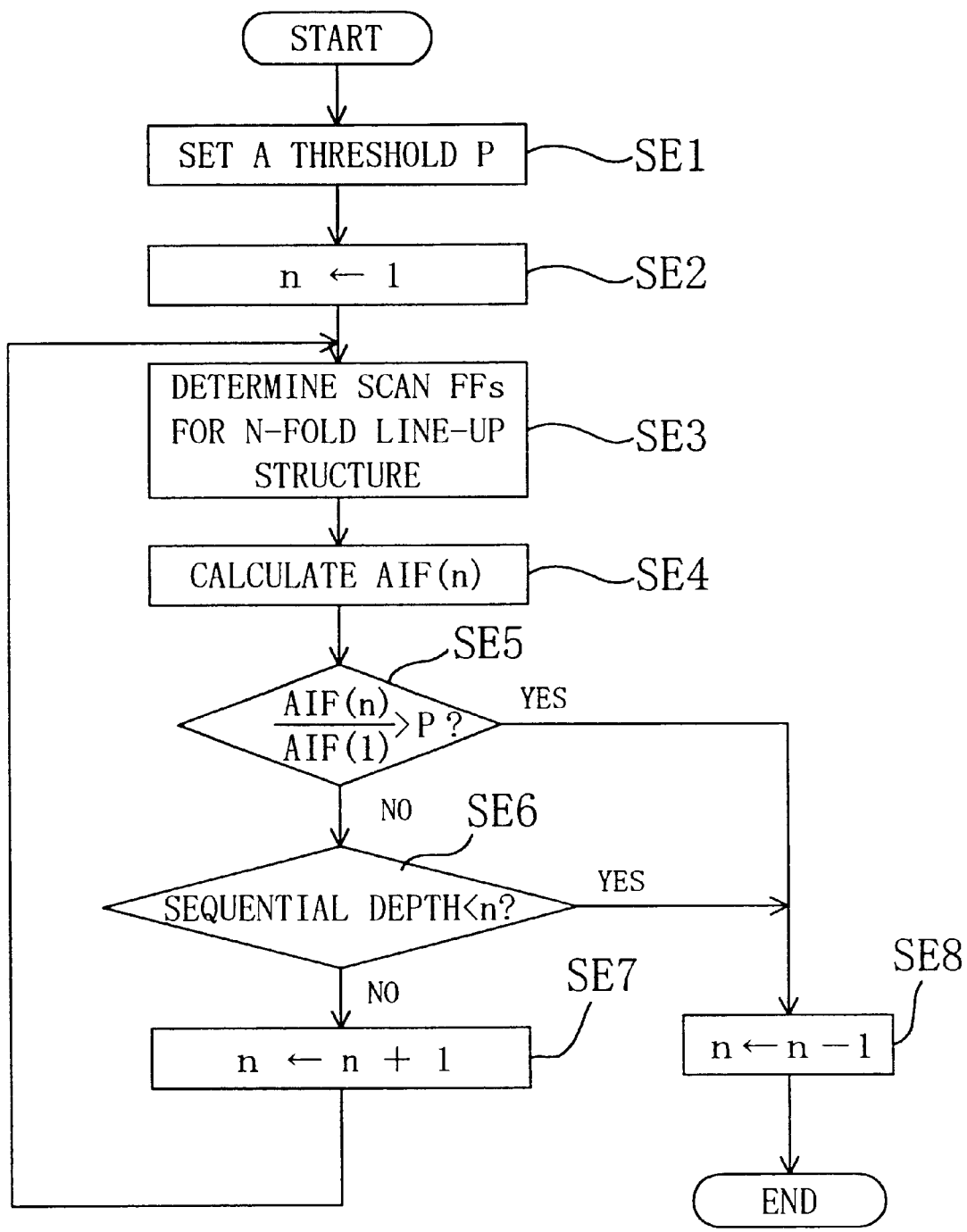
FIG. 39 is a flowchart showing procedures in a method of design for testability according to an eighth embodiment of the present invention.

FIG. 39 is a flowchart showing procedures in a method of design for testability according to an eighth embodiment of the present invention. The present method of design for testability is of selecting FFs to replace with scan FFs in order that a target circuit has a n-fold line-up structure, and of determining the value of n in order to reduce the test sequence generation time and achieve a sufficiently high fault efficiency while keeping the scan rate low.

Generally, for the circuit of an n-fold line-up structure, the scan rate increases, while the test sequence generation time gets shorter and the fault efficiency gets higher as the value of n decreases. On the other hand, as the value of n increases, the scan rate decreases, while the test sequence generation time gets longer the fault efficiency gets higher. Accordingly, it is required to determine an optimum value of n by balancing the scan rate with the test sequence generation time and the fault efficiency.

The results of experiments by the inventor of the present invention show that, when the value of n increases, the test sequence generation time tends to abruptly increase from a specific value. In addition, such a specific value varies by the circuit structures. For this reason, it is difficult to select an optimum value for n.

Further examination by the inventor shows as follows. When timeframe expansion is performed for a circuit after design for testability with respect to each primary output and each pseudo-primary output in assuming data inputs and data outputs of scan FFs, respectively, as pseudo-primary outputs and as pseudo-primary inputs, there is a high correlation between the number of FFs or gates in the expanded timeframe and the test sequence generation time and the fault efficiency. Here, the number of FFs in the expanded timeframe is called as the number of test sequence generation influence FFs, and the number of gates in the expanded timeframe is called as the number of test sequence generation influence gates. In other words, experiment by the inventor confirms that when the test sequence generation time abruptly increases, the number of test sequence generation influence FFs or the number of test sequence generation influence gates likewise abruptly increases.

The invention of the present embodiment makes use of the number of test sequence generation influence FFs or the number of test sequence generation influence gates, as an index for determining the value of n.

The present method of design for testability of FIG. 39 will be described by reference to FIGS. 40–43.

Figure 40:
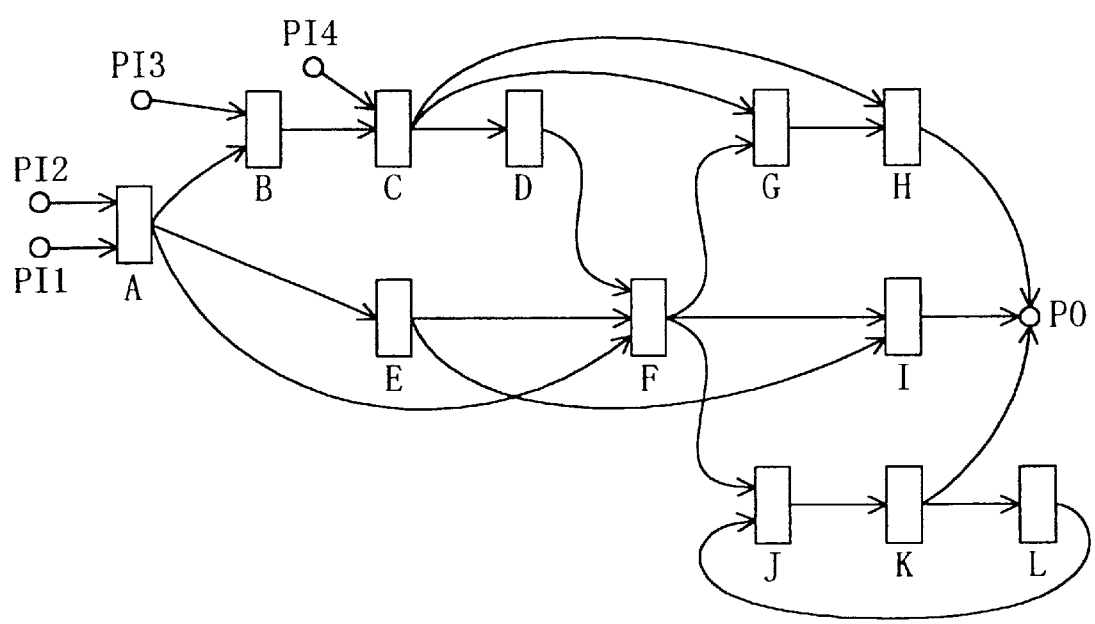
FIG. 40 is a FF relation graph representing a circuit which becomes an object of the method of design for testability of the eighth embodiment.

FIG. 40 is a FF relation graph representing a target circuit of the present method of design for testability. A–L are FFs. PI1–PI4 are primary inputs. PO is a primary output.

At step SE1, 1.6 is set as a threshold P. At step SE2, n is initialized to 1. At step SE3, FFs to replace with scan FFs are selected in order that the circuit of FIG. 40 has a 1-fold line-up structure.

Figure 41A:
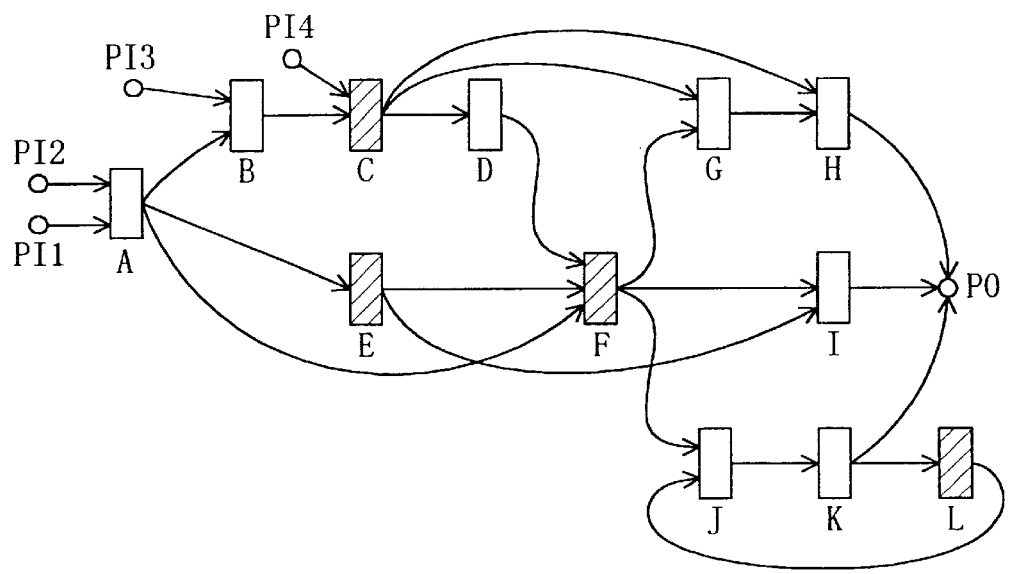
FIG. 41(a) is a diagram obtained by determining FFs to replace with scan FFs in such a way as to implement a 1-fold line-up structure with reference to the FF of FIG. 40
Figure 41B:
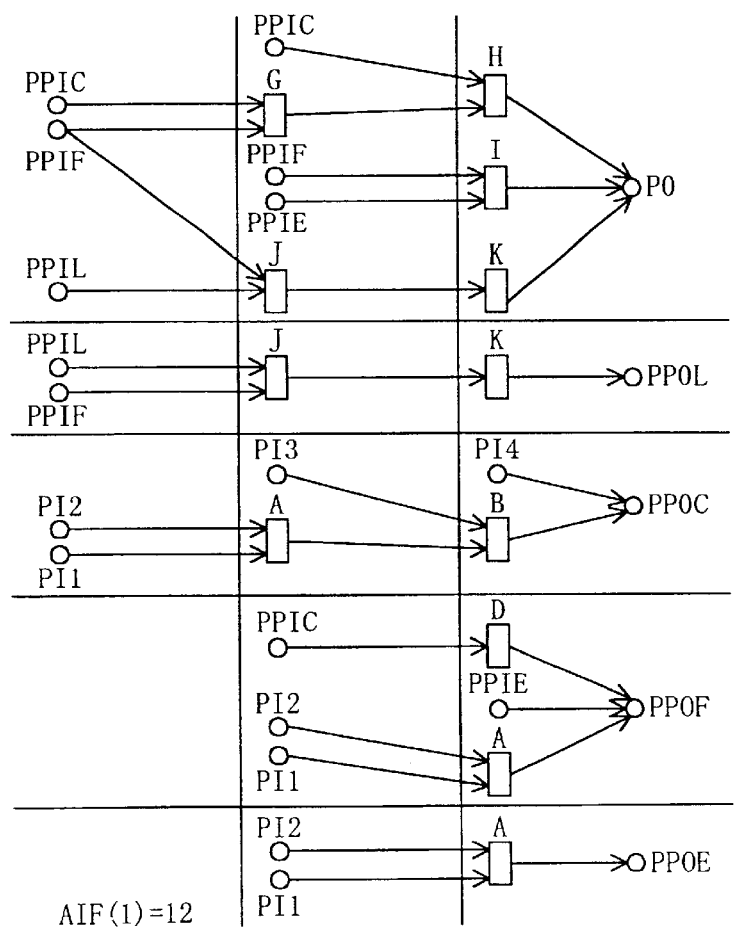
FIG. 41(b) shows a timeframe expansion for the result of FIG. 41(a).

FIG. 41(a) shows a result of selecting FFs to replace with scan FFs in order that the circuit of FIG. 40 has a 1-fold line-up structure. As shown in FIG. 41(a), FF C, E, F, and L with hatched are selected as FFs to replace with scan FFs. At step SE4, as shown in FIG. 41(b), timeframe expansion is performed in assuming the data inputs of FF C, E, F and L as pseudo-primary outputs PPOC, PPOE, PPOF and PPOL, respectively, and the data outputs thereof as pseudo-primary inputs PPIC, PPIE, PPIF and PPIL, respectively, with respect to each PO, PPOC, PPOE, PPOF, PPOL to find the number of test sequence generation influence FFs, AIF (1). Here, AIF(1) is 12. Since the sequential depth of the circuit=2, the procedure advances to step SE7. The value of n becomes 2 by addition of 1 thereto.

Figure 42A:
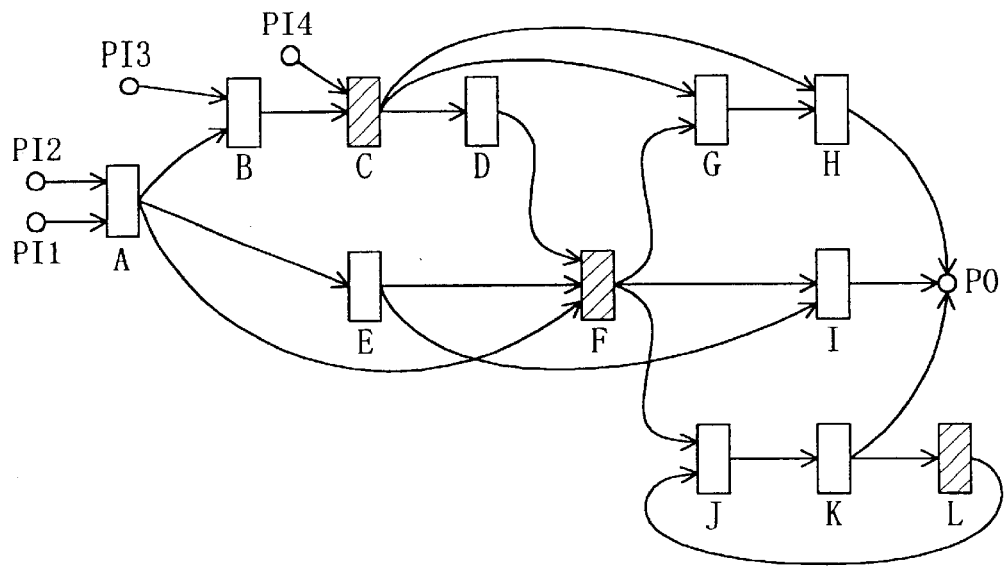
FIG. 42(a) is a diagram obtained by determining FFs to replace with scan FFs in such a way as to implement a 2-fold line-up structure with reference to the FF of FIG. 40
Figure 42B:
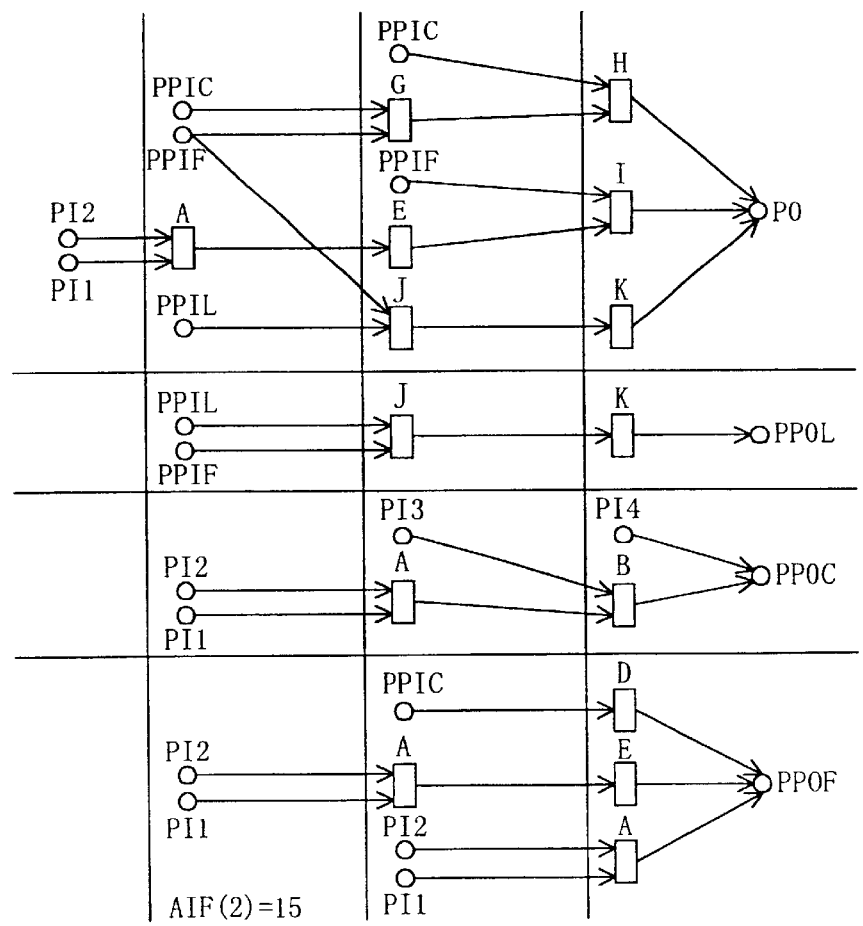
FIG. 42(b) shows a timeframe expansion for the result of FIG. 42(a).

The procedure returns to step SE3. Since n=2, FFs to replace with scan FFs are selected in order that the circuit of FIG. 40, has a 2-fold line-up structure. FIG. 42(a) shows a result of selecting FFs to replace with scan FFs in order that the circuit of FIG. 40 has a 2-fold line-up structure. As shown in FIG. 42(a), FF C, F, and L are selected as FFs to replace with scan FFs. At step SE4, as shown in FIG. 42(b), timeframe expansion is performed, in assuming the data inputs of FF C, F and L as PPOC, PPOF and PPOL, respectively, and the data outputs thereof as PPIC, PPIF and PPIL, respectively, with respect to each PO, PPOC, PPOF, PPOL to find the number of test sequence generation influence FFs, AIF(2). Here, AIF(2) is 15. Since AIF(2)/AIF(1)=15/12=1.2<P=1.6 at step SE5, the procedure advances to step SE6. Since the sequential depth is 3, the procedure moves to step SE7. The value of n becomes 3 by addition of 1 thereto.

Figure 43A:
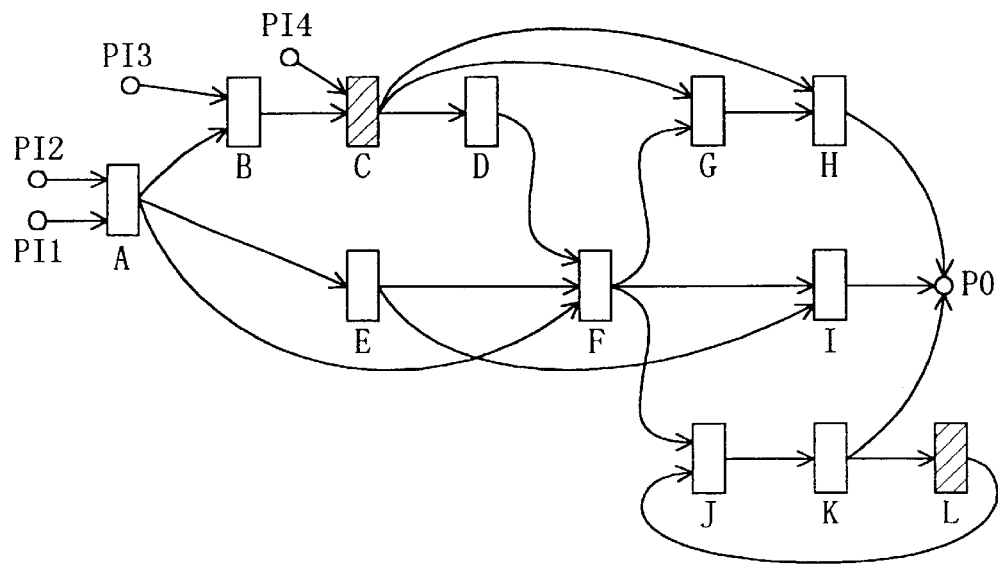
FIG. 43(a) is a diagram obtained by determining FFs to replace with scan FFs in such a way as to implement a 3-fold line-up structure with reference to the FF of FIG. 40
Figure 43B:
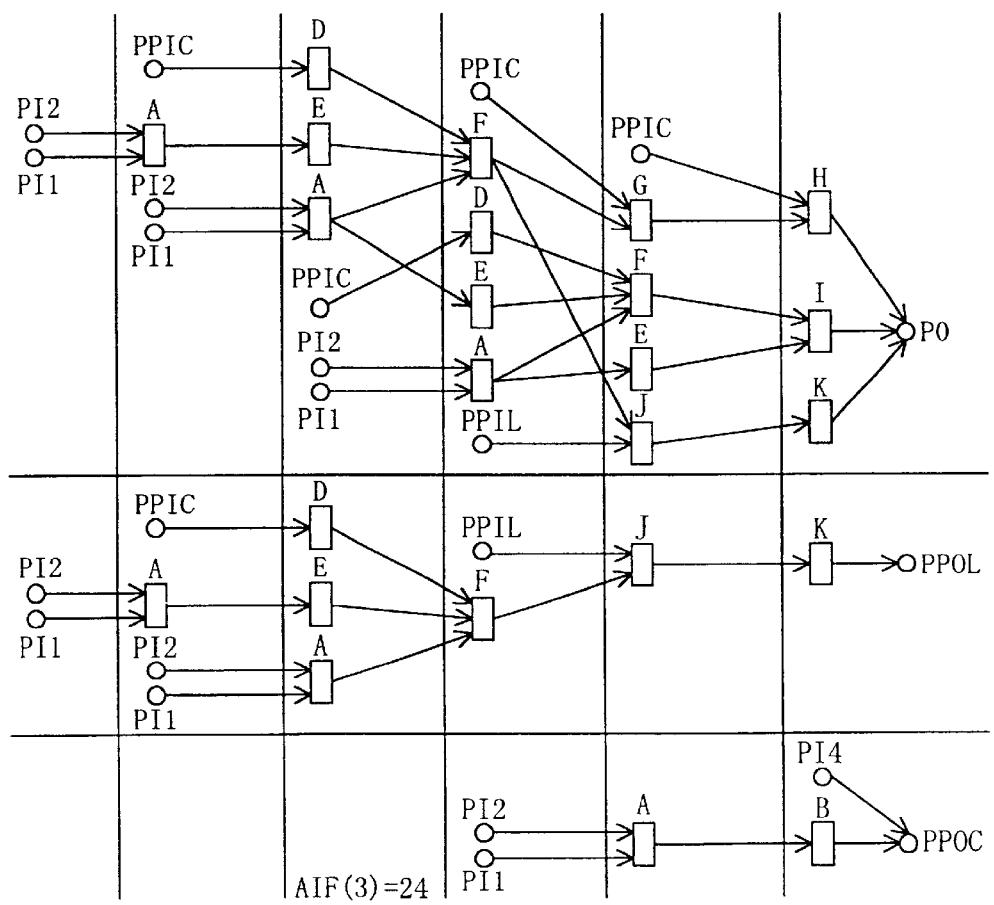
FIG. 43(b) shows a timeframe expansion for the result of FIG. 43(a).

The procedure returns to step SE3. Since n=3, FFs to replace with scan FFs are selected in order that the circuit, of FIG. 40 has a 3-fold line-up structure. FIG. 43(a) shows a result of selecting FFs to replace with scan FFs in order that the circuit of FIG. 40 has a 3-fold line-up structure. As shown in FIG. 43(a), FF C and L are selected as FFs to replace with scan FFs. At step SE4, as shown in FIG. 43(b), timeframe expansion is performed in assuming the data inputs of FF C and L as PPOC and PPOL, respectively, and the data outputs thereof as PPIC and PPIL, respectively, with respect to each PO, PPOC and PPOL to find the number of test sequence generation influence FFs, AIF(3). Here AIF(3) is 24. Since AIF(3)/AIF(1)=24/12=2.0>P=1.6 at step SE5, the procedure advances to step SE8. The value of n becomes 2 by subtraction of 1 therefrom, and the procedure is finished. In other words, the 2-fold line-up structure is selected as optimal.

Embodiment 9

Figure 44:
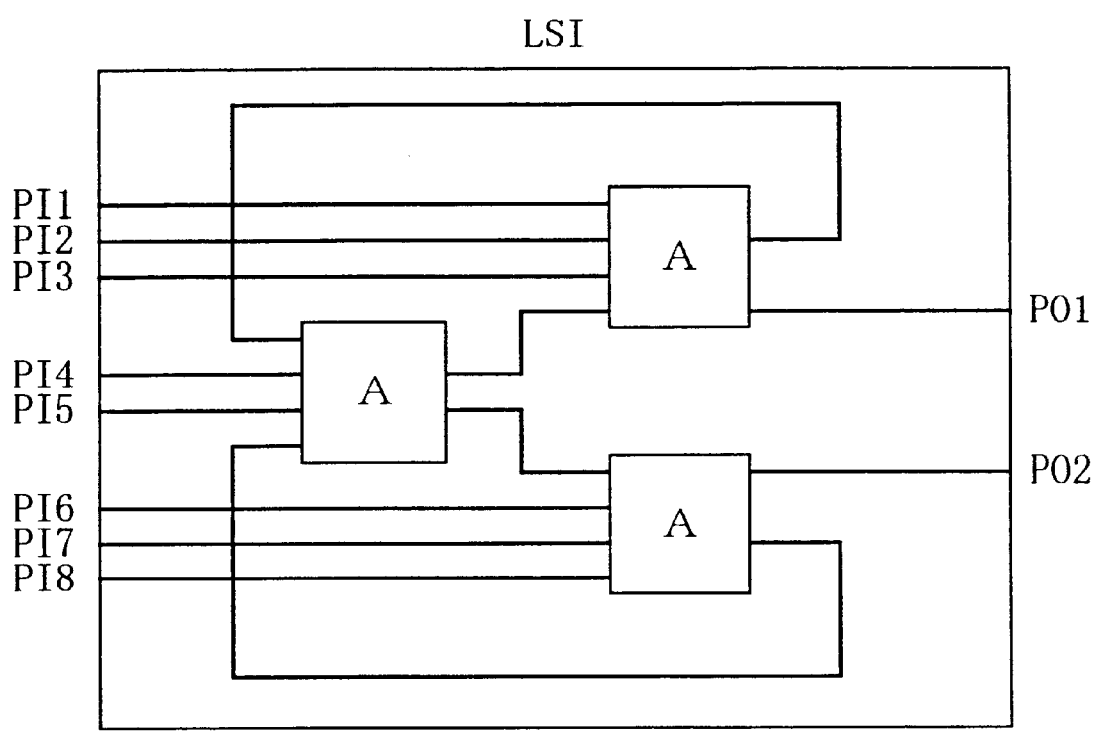
FIG. 44 is a diagram schematically showing an integrated circuit composed of three identical blocks A.

FIG. 44 is a model diagram showing an integrated circuit of three identical blocks A. In design for testability for an integrated circuit composed of a plurality of blocks, selecting FFs to replace with scan FFs to attain testability in each block will not always lead to attain testability for the integrated circuit. For instance, when the blocks have a loop structure as shown in FIG. 44, each block having n-fold line-up structure will not always lead to allow the integrated circuit to have n-fold line-up structure.

Then, in the ninth embodiment of the present invention, before selecting FFs to replace with scan FFs in each block, a FF reachable from block output by passing merely through combinational circuits is selected as FF to replace with scan FF in each block. In the present embodiment, a FF reachable from a block output by passing merely through combinational circuits is called output part FF.

Figure 45A:
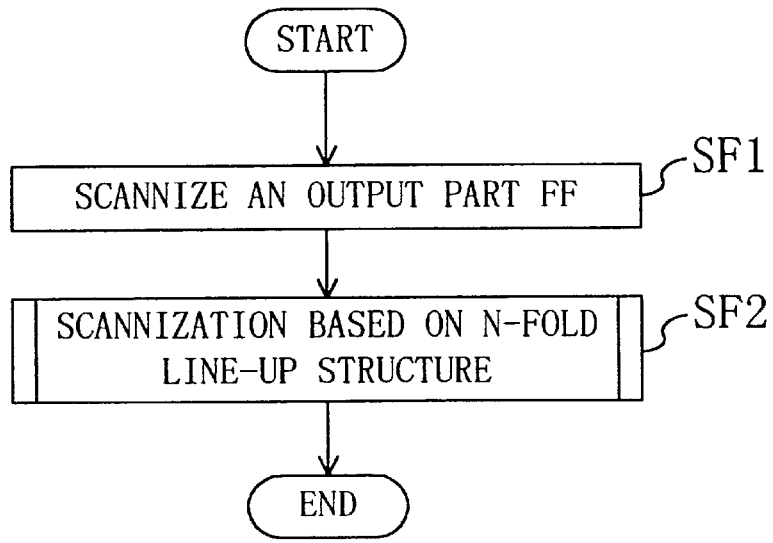
FIGS. 45(a) and (b) are flowcharts respectively showing procedures in a method of design for testability according to a ninth embodiment of the invention.
Figure 45B:
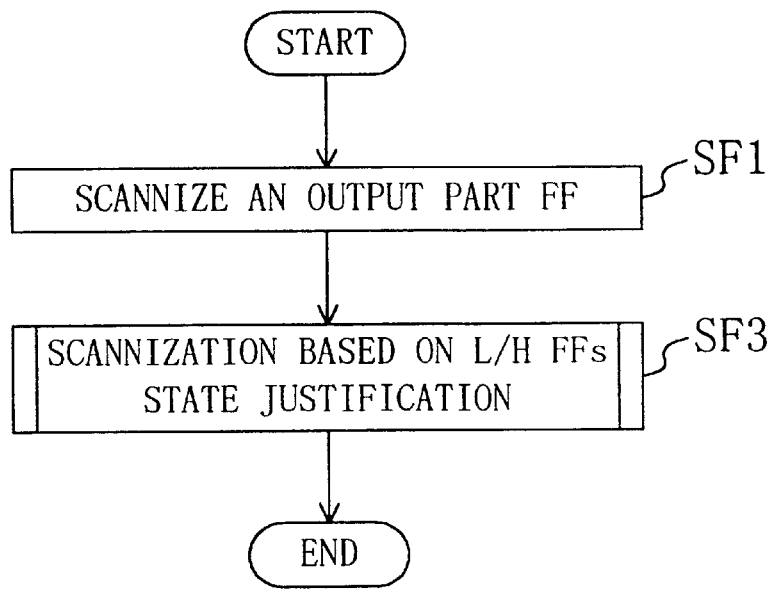

FIG. 45 is a flowchart showing procedures in a method of design for testability of the present embodiment. As shown in FIG. 45, step SF1 is a pre-step of selecting the output part FF as FF to replace with scan FF in each block. Thereafter, scan FF selection for the n-fold line-up structure as described in the first embodiment is performed in each block (step SF2), as shown in FIG. 45(a), or scan FF selection based on the state justification of L/H FFs as described in the second embodiment is performed in each block (step SF3), as shown in FIG. 45(b).

Figure 46:
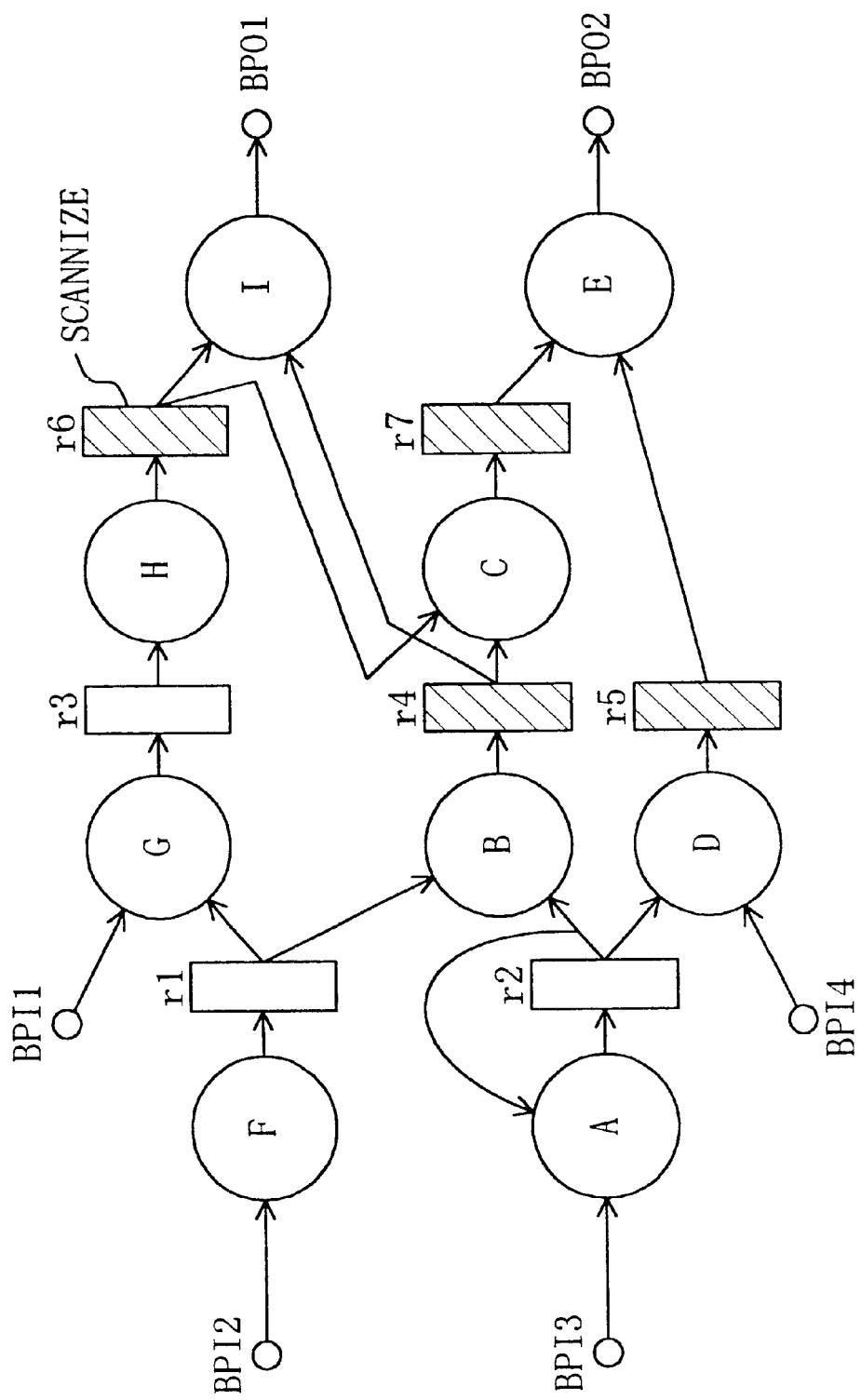
FIG. 46 shows a result obtained by performing step SF1 of FIG. 45 on a certain circuit block.

FIG. 46 shows an example result of step SF1 on a specific circuit block. A–I are combinational circuits. r1–r7 are FFs. BPI1–BPI4 are block inputs. BPO1 and BPO2 are block outputs. FFs reachable from the block output BPO1 by passing merely through combinational circuits are FF r4 and r6. And, FFs reachable from the block output BPO2 by passing merely through combinational circuits are FF r5 and r7. Accordingly, FF r4, r5, r6, and r7 are recognized as output part FFs, as shown in FIG. 46 and these FFs are then selected as FFs to replace with scan FFs. Thereafter, step SF2 is performed, as in the first embodiment.

Figure 47:
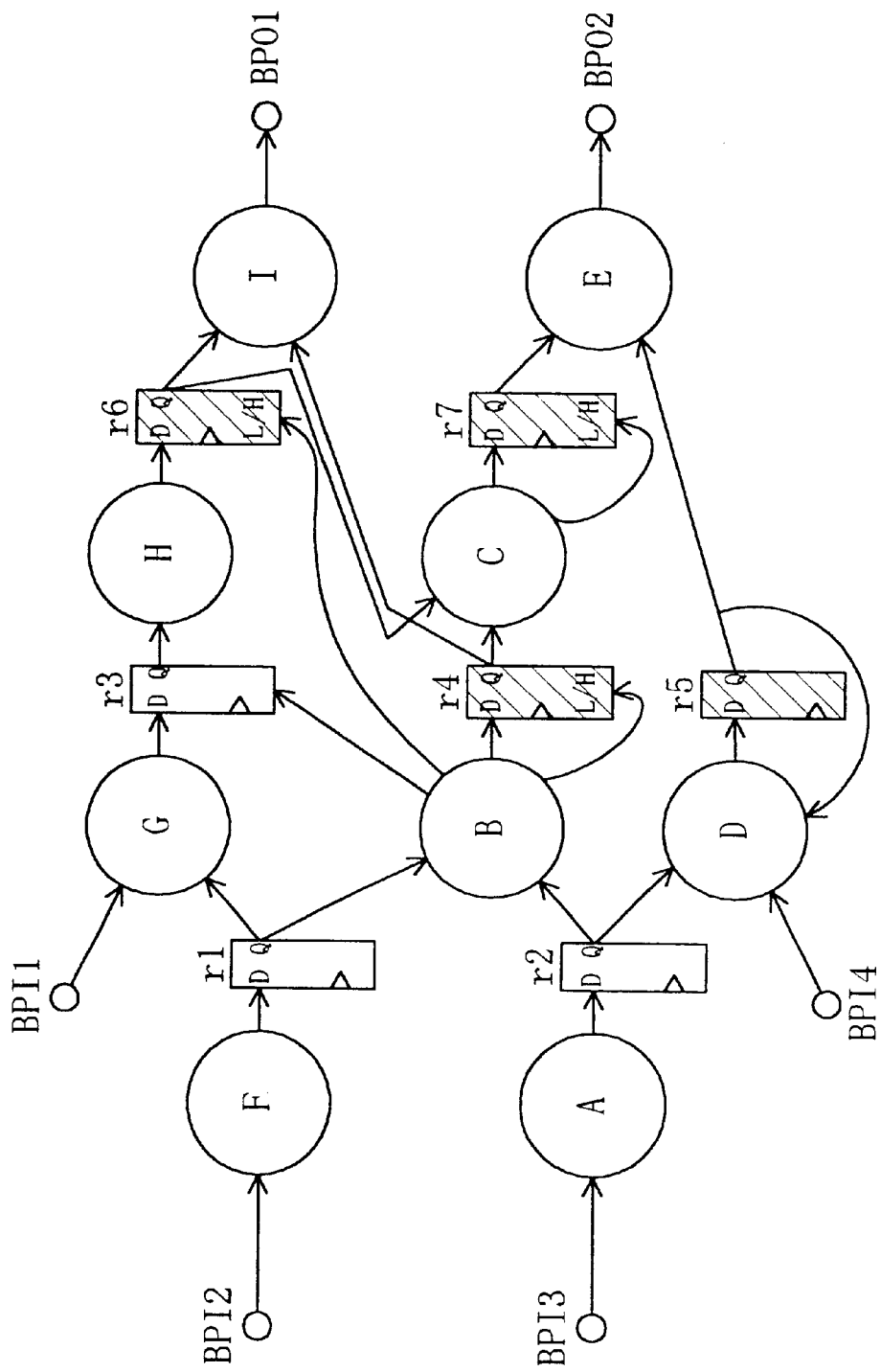
FIG. 47 shows a result obtained by performing step SF1 of FIG. 45 on a certain circuit block.

FIG. 47 shows another example result of step SF1 on a specific circuit block. A–I are combinational circuits. r1, r2 and r5 are FFs. r3, r4, r6, and r7 are L/H FFs. BPI1–BPI4 are block inputs. BPO1 and BPO2 are block outputs. FFs reachable from the block output BPO1 by passing merely through combinational circuits are FF r4 and r6. And, FFs reachable from the block output BPO2 by passing merely through combinational circuits are FF r5 and r7. Accordingly, FF r4, r5, r6, and r7 are recognized as output part FFs, as shown in FIG. 47 and these FFs are then selected as FFs to replace with scan FFs. Thereafter, step SF3 is performed, as in the second embodiment.

In accordance with the present embodiment, output part FF that is reachable from the block output by passing merely through combinational circuits is first selected as FF to replace with scan FF, in each block and then FFs to replace with scan FFs are selected in each block by methods of design for testability of the first or second embodiment. This guarantees high fault efficiency at selecting FFs to replace with scan FFs. And, test input pattern generation complexity can be easier from circuit scale level down to block scale level.

Also, instead of output part FF, input part FF that is reachable from the block input by passing merely through combinational circuits may be selected as FFs to replace with scan FFs. However, since in general the number of input part FFs is greater than the number of output part FFs, it is preferred that output part FFs are selected as FFs to replace with scan FFs.

Embodiment 10

Figure 48:
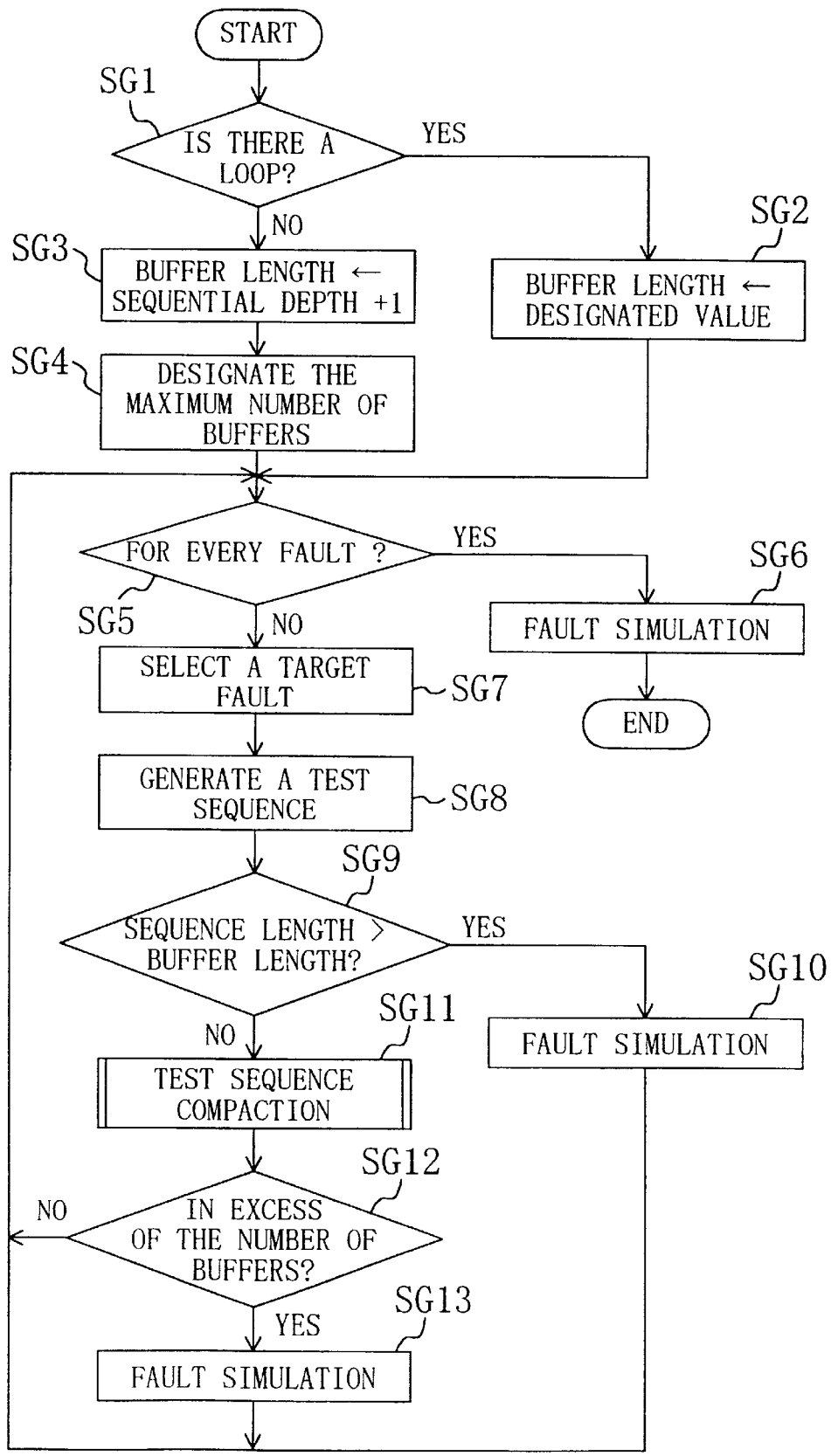
FIG. 48 is a flowchart showing procedures in a method of test sequence generation according to a tenth embodiment of the invention.

FIG. 48 is a flowchart showing procedures in a method of test sequence generation according to a tenth embodiment of the present invention. In accordance with the present method of test sequence generation, test sequence is generated for a given circuit while sequentially compaction storing test sequences generated for respective faults in buffers.

In FIG. 48, SG1 is the step of examining the given circuit for a loop. In the presence of a loop, the procedure moves to step SG2, while in the absence of a loop, the procedure moves to step SG3. SG2 is the step of setting a predetermined value as buffer length, providing a single buffer having such a buffer length, and initializing all data thereof to "don't care". SG3 is a step of setting a value obtained by addition of 1 to the sequential depth of the circuit as buffer length, providing a single buffer having such a buffer length, and initializing all data thereof to "don't care".

After setting of the buffer lengths at steps SG2 or SG3, the maximum number of buffers is designated at step SG4.

SG5 is the step of determining whether test sequence has been generated (ATPG) for every fault. If YES, the procedure advances to step SG6, while if NO, the procedure advances to step SG7. At step SG6, a fault simulation is performed using all the test sequences stored in a group of buffers.

SG7 is the step of selecting a single fault as a target fault for which no test sequences have been generated. SG8 is the step of generating a test sequence for the target fault selected at step SG7.

SG9 is the step of determining whether the test sequence generated at step SG8 has a greater length than buffer length set at step SG2 or SG3. If YES, the procedure moves to step SG10, while if NO, the procedure moves to step SG11. Note that in the absence of a loop in the circuit the test sequence length does not exceed the buffer length, which is set to the sequential depth plus 1 at step SG3. At step SG10, a fault simulation is performed using the generated test sequence. At step SG11, the generated test sequence is compaction stored in the buffer. The details of step SG11 are described later.

SG12 is the step of determining whether the number of buffers is greater than the maximum number of buffers designated at step SG4 at compaction storage at step SG11. If YES, the procedure moves to step SG13, while if NO, the procedure returns to step SG5. At step SG13, a fault simulation is preformed using a test sequence held in a buffer with the minimum number of "don't care"s and this buffer is deleted.

Figure 49:
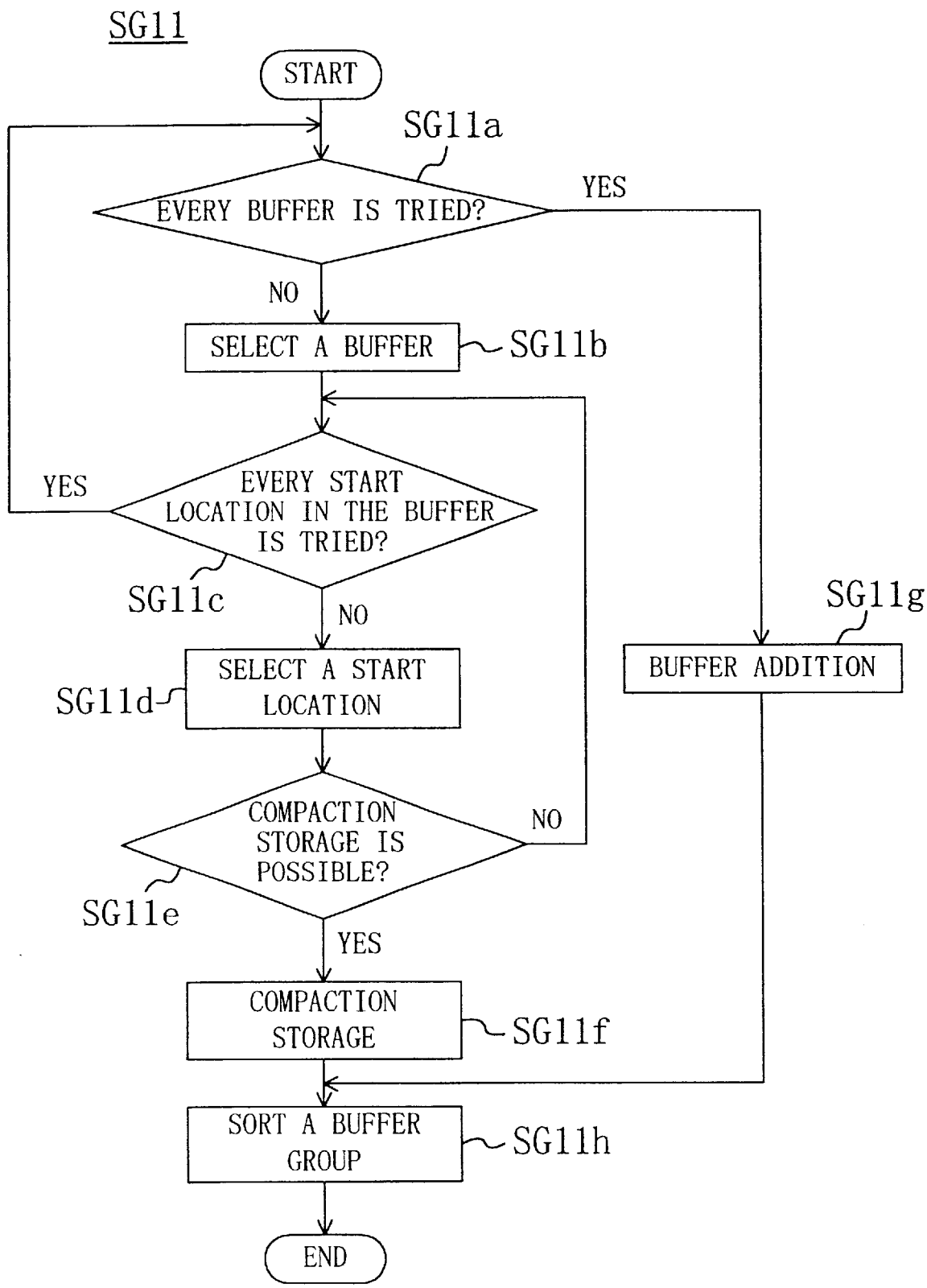
FIG. 49 is a flowchart showing the details of step SG11 of FIG. 48.

FIG. 49 is a flowchart showing the details of step SG11 of FIG. 48. SG11a is the step of determining whether compaction storage of the test sequence generated at step SG8 has been tried to every buffer. If compaction storage has been tried to every buffer, the procedure advances to step SG11, while if not, the procedure moves to step SG11b.

SG11b is the step of selecting one buffer to which compaction storage has not been tried. SG11c is the step of determining whether compaction storage has been tried on every start position, for the buffer selected at step SG11b. If YES, the procedure returns to step SG11a, while if not, the procedure advances to step SG11d. SG11d is the step of selecting a start position to which compaction storage is tried. It is possible to select (BL−TPL+1) start positions per buffer, where BL is the buffer length and TPL the test sequence length.

SG11e is the step of determining whether compaction storage in the buffer selected at step SG11b is successful from the start position selected at step SG11d. Step SG11e determines whether the test sequence can be compaction stored based on the compaction rule, where the test sequence's "0" is compactible with "0" or "don't care" but incompactible with "1" in-buffer, and the test sequence's "1" is compatible with "1" or "don't care" but incompactible with logical "0" in-buffer.

When step SG11e determines that the test sequence can be compaction stored, the test sequence is compaction stored in the buffer based on the foregoing compaction rules at step SG11f.

When the test sequence cannot be compaction stored in any buffer, at step SG11g a new buffer in which to store the test sequence is additionally provided. SG11h is the step of sorting the buffers in order of the number of "don't care"s.

The method of test sequence generation of FIG. 48 and FIG. 49 will be described by reference to FIGS. 50–53.

Here, suppose that a target circuit has no loops and has a sequential depth of 3, and has four faults, i.e., FAULT-a, FAULT-b, FAULT-c, and FAULT-d, as undetected faults. In FIGS. 50–53, X1–X3 are primary inputs. A and B are buffers. In buffers, 0 represents logic value "0". 1 represents logic value "1". X represents "don't care".

Since the target circuit has no loop, at step SG3, a value of 3 obtained by addition of 1 to the sequential depth is set as buffer length. As shown in FIG. 50(a), buffer A whose buffer length is 3 is generated and all data of buffer A are initialized to "don't care". At step SG4, a value of 2 is designated as the maximum number of buffers.

Next, at step SG8, a test sequence is generated for FAULT-a selected at step SG7. At step SG11, the test sequence generated for FAULT-a is compaction stored in the buffer A. Such compaction storage is successful based on the foregoing compaction rules. Because 0 is the only possible start position since the buffer length is equal to the length of test sequence for FAULT-a and, in addition, all the data of the buffer A have been initialized to "don't care". As a result, as shown in FIG. 50(b), the test sequence for FAULT-a is compaction stored in the buffer A.

Subsequently, at step SG8, a test sequence is generated for FAULT-b selected at step SG7. The buffer length is equal to the length of the test sequence for FAULT-b and 0 is therefore the only possible start position. As shown in FIG. 51(a), compaction storage based on the foregoing compaction rules is unsuccessful. A new buffer B in which to store the test sequence is additionally provided, as shown in FIG. 51(b). The number of "don't care"s in the buffer A is four and the number of "don't care"s in the buffer B is five. Accordingly, the buffers A, B are sorted in the order of B, A.

Figure 52A:
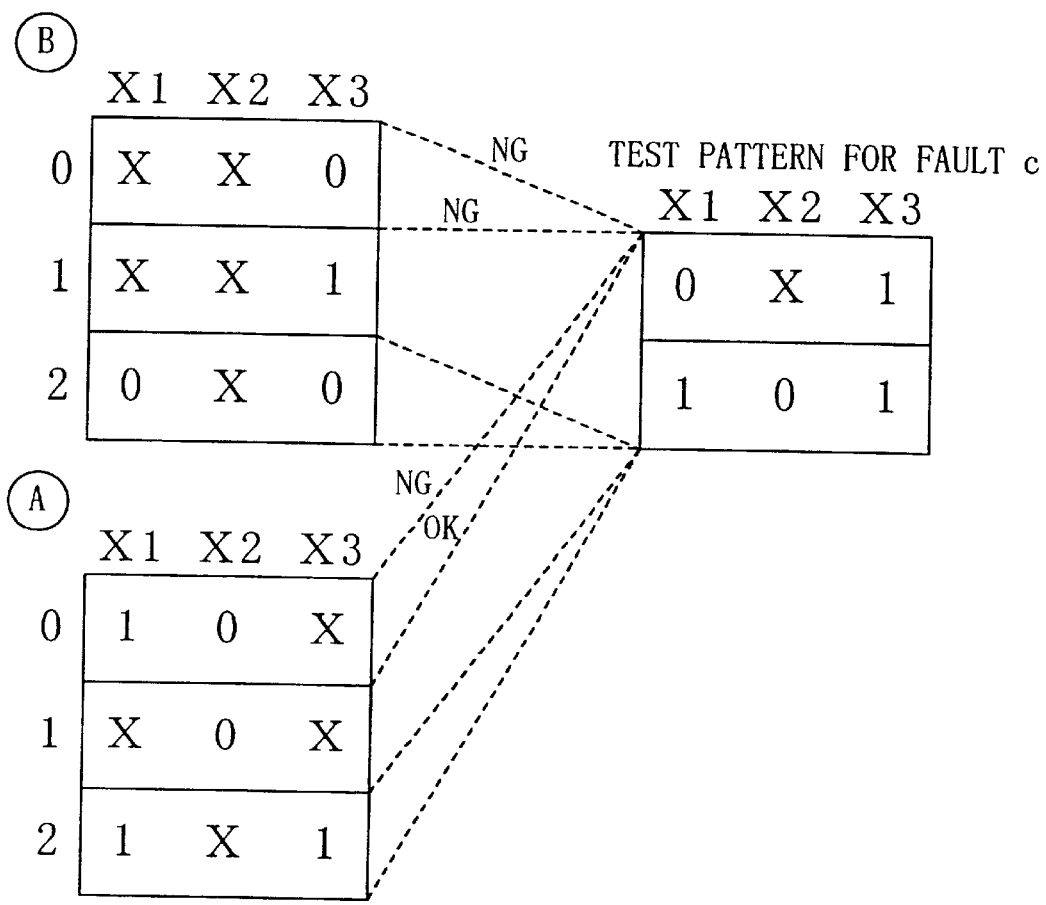
FIGS. 52(*a*) and (*b*) are diagrams useful in understanding the method of test sequence generation of the tenth embodiment.
Figure 52B:
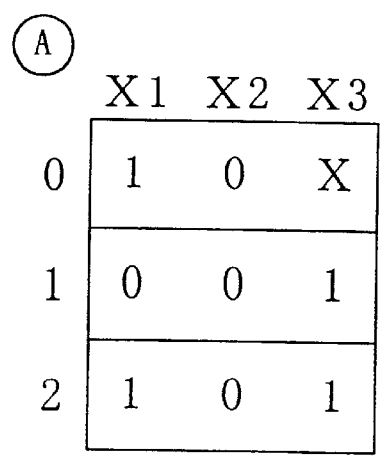
Figure 53:
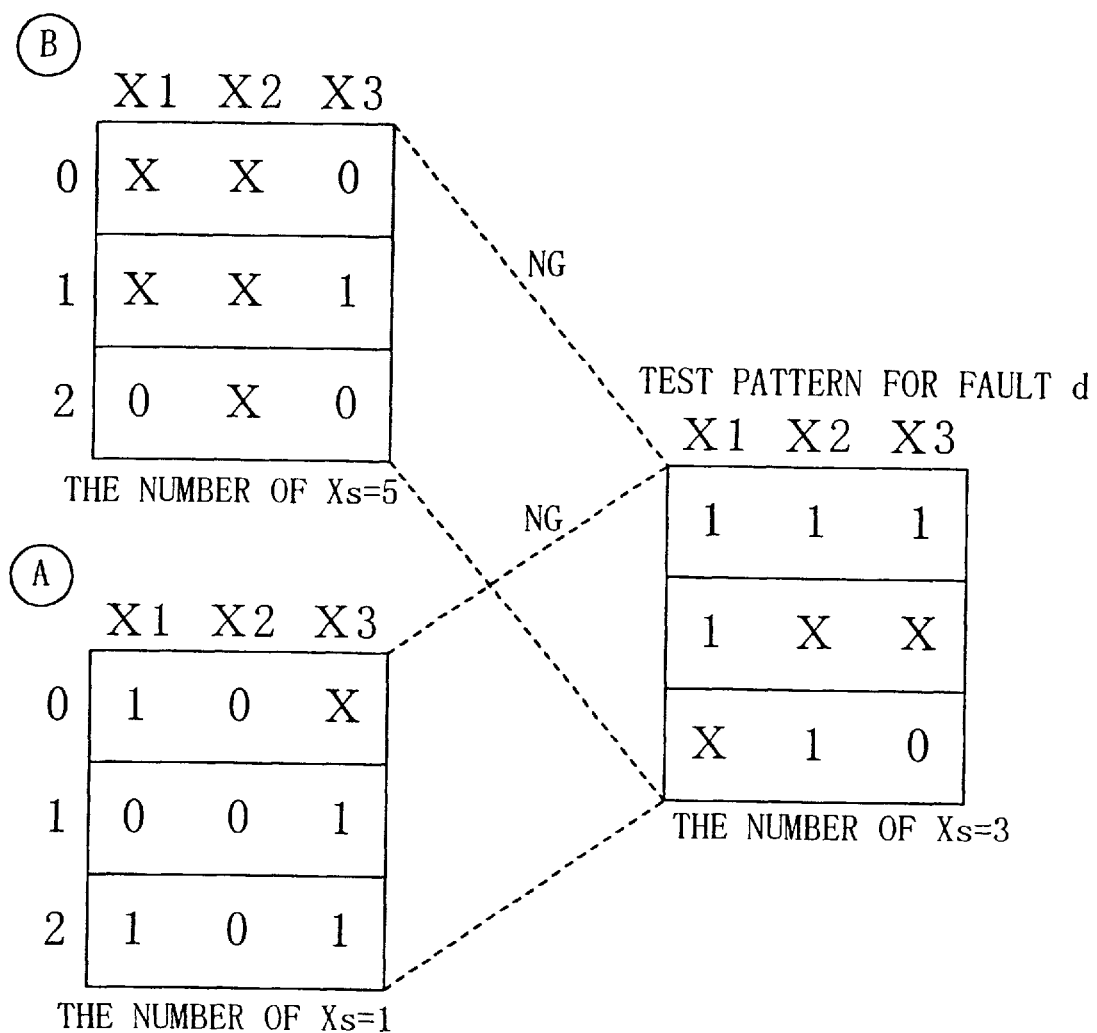
FIG. 53 is a diagram useful in understanding the method of test sequence generation of the tenth embodiment.

Subsequently, at step SG8, a test sequence is generated for FAULT-c selected at step SG7. The test sequence generated for FAULT-c has a length of 2, and 0 and 1 are therefore the only possible start positions. As shown in FIG. 52(a), based on the foregoing compaction rules, compaction storage of the test sequence is tried to both the buffers A and B. In the buffer B, compaction storage is unsuccessful, not only when the start position is 0 but also when the start position is 1. In the buffer A, compaction storage is unsuccessful when the start position is 0 but successful when the start position is 1. As a result, the test sequence generated for FAULT-c is compact stored in the buffer A with the start position at 1 (see FIG. 52(b)). The number of "don't care"s in the buffer A is one and the number of "don't care"s in the buffer B is five. Accordingly, the buffer B, A are sorted in the order of B, A.

Subsequently, at step SG8, a test sequence is generated for FAULT-d selected at step SG7. The length of the test sequence generated for FAULT-d is equal to the buffer length and 0 is therefore the only possible start position. Based on the foregoing compaction rules, compaction storage of the test sequence is tried to both the buffers A and B. Compaction storage is unsuccessful in both the buffers A and B. A new buffer C in which to store the test sequence is additionally provided. The number of "don't care"s in buffer A is one, and the number of "don't care"s in buffer B is five, and the number of "don't care"s in buffer C is three. Accordingly, the buffers A, B, C are sorted in the order of B, C, A.

Since the number of buffers exceeds 2 that is the maximum number of buffers (step SG12), each "don't care" is randomly replaced with either "0" or "1" in a buffer with the minimum number of "don't care" s of the buffers A, B, and C, i.e., the buffer A, to execute a fault simulation. The buffer A is then deleted and the buffer C, in which the test sequence for FAULT-d is stored, serves now as a new buffer A (step SG13).

Since test sequences are generated for all undetected faults (step SG5), each "don't care" is randomly replaced with either "0" or "1" in the buffers A and B, to execute a fault simulation (step SG6).

In accordance with the present embodiment, compaction is performed dynamically with buffers in test sequence generation. This achieves generation of shorter test sequences.

Embodiment 11

Figure 54:
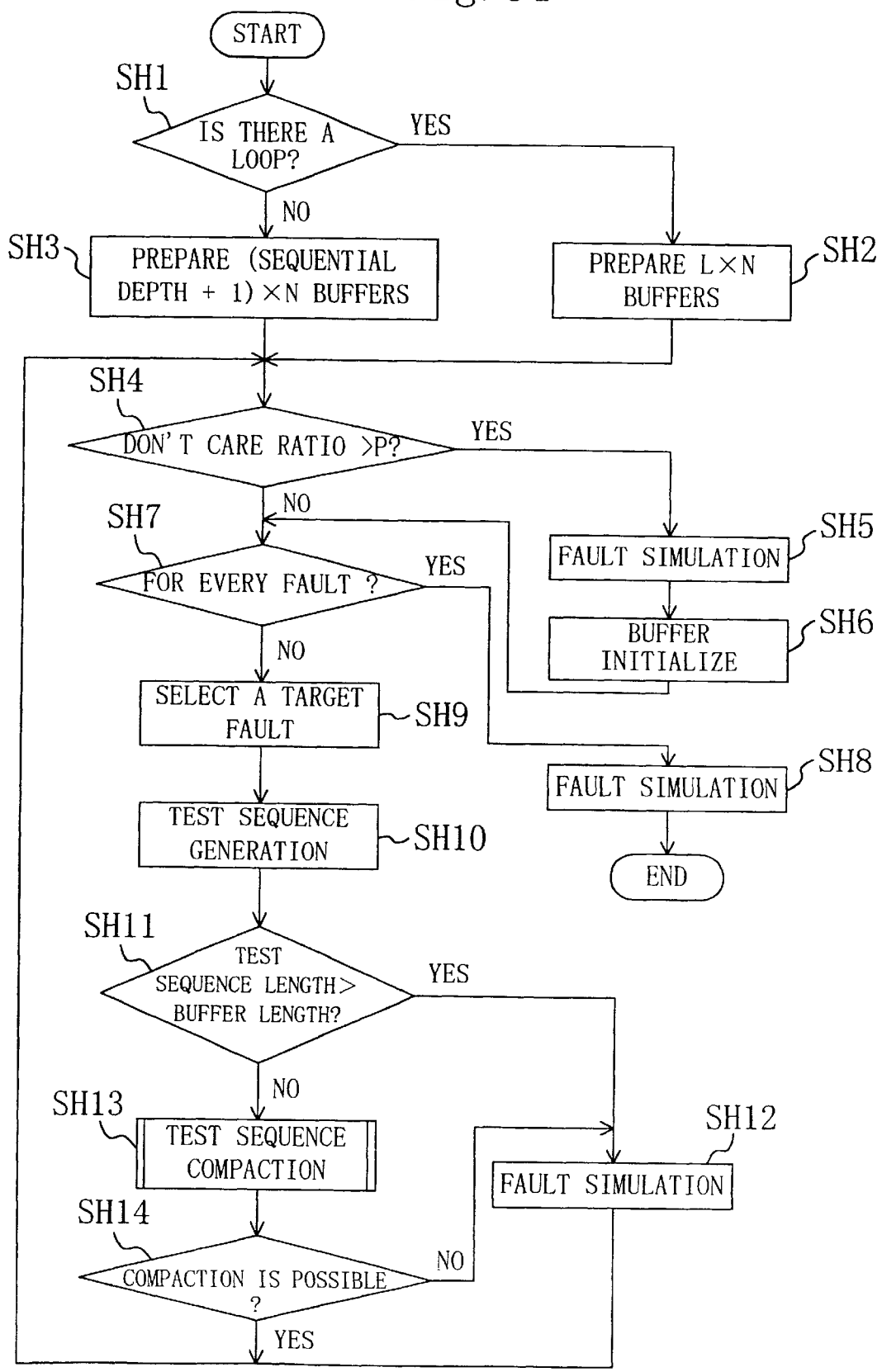
FIG. 54 is a flowchart showing procedures in a method of test sequence generation according to an eleventh embodiment of the invention.

FIG. 54 is a flowchart showing procedures in a method of test sequence generation according to an eleventh embodiment of the present invention. In accordance with the present method of test sequence generation, test sequence is generated for a given circuit while sequentially compaction storing test sequences generated for respective faults in buffers. The present embodiment is different in algorithm for compaction storage of test sequences in buffer from the tenth embodiment.

In FIG. 54, SH1 is the step of examining the given circuit for a loop. In the presence of a loop, the procedure moves to step SH2, while in the absence of a loop, the procedure moves to step SH3. SH2 is the step of setting a predetermined value L as buffer length, and providing N buffers having such a buffer length L, wherein the number N is a positive integer, and initializing all data thereof to "don't care". SH3 is the step of setting a value obtained by addition of 1 to the sequential depth of the circuit as buffer length, and providing N buffers having such a buffer length, and initializing all data thereof to "don't care".

SH4 is the step of determining whether the "don't care" ratio in the N buffers exceeds a predetermined upper limit P. If the "don't care" ratio exceeds the upper limit P, at step SH5, each "don't care" is replaced with either "0" or "1" in the N bummers to execute a fault simulation. At step SH6, all the data of the buffers are initialized to "don't care". While, if the "don't care" ratio does not exceed the upper limit P, the procedure moves to step SH7.

SH7 is the step of determining whether test sequences have been generated for all the faults. If YES, at step SH8, each "don't care" is replaced with either "0" or "1" to execute a fault simulation.

SH9 is the step of selecting a single fault as a target fault for which no test sequences have been generated. SH10 is the step of generating a test sequence for the target fault selected at step SH9.

SH11 is the step of determining whether the test sequence generated at step SH10 has a greater length than the buffer length set at step SH2 or SH3. If YES, the procedure moves to step SH12, while if NO, the procedure moves to step SH13. Note that in the absence of a loop in the circuit the test sequence length does not exceed the buffer length, which is set to the sequential depth plus 1 at step SH3. At step SH12, a fault simulation is performed with the generated test sequence. In step SH13, the generated test sequence is compaction stored in the N buffers. The details of step SH13 are described later. Step SH14 determines whether such compaction storage is performed successfully. If YES, the procedure returns to step SH4, while if NO, a fault simulation is executed using this the test sequence at step SH12 before returning to step SH4.

Figure 55:
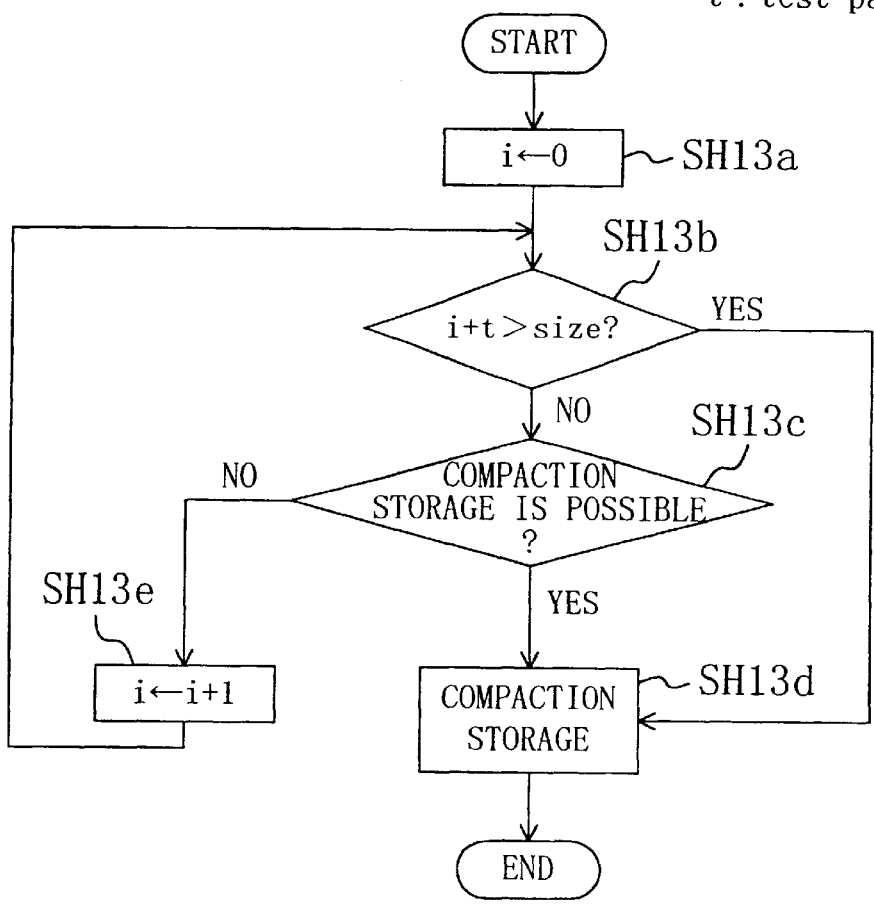
FIG. 55 is a flowchart showing the details of step SH13 of FIG. 54.

FIG. 55 is a flowchart showing the details of step SH13 of FIG. 54. In FIG. 55, SH13a is the step of initializing a start position, i, to 0. SH13b–SH13e are the steps of determining whether the test sequence can be compaction stored in the N buffers, while incrementing the start position i. If YES, the test sequence is compaction stored in the N buffers, while if NO, processing is finished.

The method of test sequence generation of FIG. 54 and FIG. 55 will be described by reference to FIGS. 56–59. Here, suppose that a target circuit has no loops and has a sequential depth of 2. The number of buffers N is two. The upper limit P of the "don't care" ratio is 60%. The target circuit has four faults, i.e., FAULT-a, FAULT-b, FAULT-c, and FAULT-d, as undetected faults. In FIGS. 56–59, X1–X3 are primary inputs. In buffers, 0 represents logic value "0". 1 represents logic value "1". X represents "don't care". Also, a set of N buffers is regarded as a single buffer in this embodiment.

Since the target circuit has no loops at SH3, a value of 3 obtained by addition of 1 to the sequential depth is set as buffer length. As shown in FIG. 56(a), two buffers whose a buffer length is 3 are generated. These two buffers being regarded as a single buffer whose buffer length is 6, all data stored therein are initialized to "don't care".

At step SH4, whether the "don't care" ratio exceeds the upper limit P is determined. Here, the "don't care" ratio is 0% and the procedure advances to step SH7.

Next, a test sequence is generated at step SH10 for FAULT-a selected at step SH9. At step SH13, the test sequence thus generated is compaction stored in the buffer. As shown in FIG. 56(a), such compaction storage is successful when the start position is 0. Therefore, the generated test sequence is compaction stored as shown in FIG. 56(b). The "don't care" ratio is 5/18 which is smaller than the upper limit P (=60%).

Next, a test sequence is generated at step SH10 for FAULT-b selected at step SH9. At step SH13, the test sequence thus generated is compaction stored in the buffer. As shown in FIG. 57(a), such compaction storage is successful when the start position is 1. Therefore, the generated test sequence is compaction stored as shown in FIG. 57(b). The "don't care" ratio is 8/18 which is smaller than the upper limit P (=60%).

Next, a test sequence is generated at step SH10 for FAULT-c selected at step SH9. At step SH13, the test sequence thus generated is compaction stored in the buffer. As shown in FIG. 58(a), such compaction storage is successful when the start position is 4. Therefore, the generated test sequence is compaction stored as shown in FIG. 58(b). The "don't care" ratio is 12/18 which is greater than the upper limit P (=60%). A fault simulation is accordingly performed at step SH5, and all the buffer data are initialized to "don't care" at step SH6.

Subsequently to the above, a test sequence is generated at step SH10 for FAULT-d selected at step SH9. At step SH13, the test sequence thus generated is compaction stored in the buffer. As shown in FIG. 59(a), such compaction storage is successful when the start position is 0. Therefore, the generated test sequence is stored as shown in FIG. 59(b). The "don't care" ratio is 6/18 which is smaller than the upper limit P (=60%).

In accordance with the present embodiment, it is determined whether further compaction storage can be performed successfully according, to "don't care" ratio in buffer. This achieves dynamic test sequence compaction with high efficiency. In addition, it becomes possible to perform compaction storage over a plurality of buffers by regarding a plurality of buffers as a single buffer, therefore compaction rates increases.

What is claimed is:

1. A method of test sequence generation for an integrated circuit, comprising:

a buffer length set step of setting a buffer length for a buffer for storing a test sequence; and a test sequence compaction step of generating a test sequence for said integrated circuit, in performing sequentially compaction storage of test sequences for respective faults in buffers having said buffer length set in said buffer length set step.

2. The method of test sequence generation of claim 1, wherein said buffer length set step is the step of:

examining said integrated circuit for a loop, and setting a predetermined value as the buffer length in the presence of a loop and setting a value, obtained by addition of 1 to the sequential depth of said integrated circuit, as the buffer length in the absence of a loop.

3. The method of test sequence generation of claim 1, wherein:

said buffer length set step is the step of providing a single buffer having said buffer length, and said test sequence compaction step includes:

a first step of generating a test sequence for a fault;

a second step of performing compaction storage of the test sequence generated at said first step in said already provided buffer if such compaction storage is carried out successfully and, if not, providing a new buffer having said buffer length and storing said test sequence in said new buffer; and a third step of executing a fault simulation by using a test sequence stored in a buffer with the minimum number of "don't care's" when the number of buffers exceeds a given limit at said second step and deleting said buffer, wherein said first to third steps are iterated for respective faults.

4. The method of test sequence generation of claim 1, wherein:

said buffer length set step is the step of providing a given number of buffers having said buffer length, and said test sequence compaction step includes:

a first step of generating a test sequence for a fault;

a second step of performing compaction storage of the test sequence generated in said first step in said given number of buffers if such compaction storage is carried out successfully and, if not, executing a fault simulation using said test sequence; and a third step of executing a fault simulation by using the test sequence stored in said given number of buffers when the "don't care" ratio in said given number of buffers exceeds a given limit at said second step and initializing all data in said given number of buffers to "don't care", wherein said first to third steps are iterated for respective faults.

5. The method of test sequence generation according to claim 1, wherein said test sequence operates as input data to said integrated circuit.

* * * * *